(12) United States Patent
Majima et al.

(10) Patent No.: US 11,380,861 B2
(45) Date of Patent: Jul. 5, 2022

(54) MONOMOLECULAR TRANSISTOR

(71) Applicant: JAPAN SCIENCE AND TECHNOLOGY AGENCY, Kawaguchi (JP)

(72) Inventors: Yutaka Majima, Yokohama (JP); Eiichi Nakamura, Tokyo (JP); Hayato Tsuji, Yokohama (JP); Kyoko Nozaki, Tokyo (JP); Ryo Shintani, Suita (JP); Chun Ouyang, Yokohama (JP); Yuma Ito, Yokohama (JP); SeungJoo Lee, Yokohama (JP)

(73) Assignee: JAPAN SCIENCE AND TECHNOLOGY AGENCY, Kawaguchi (JP)

(*) Notice: Subject to any disclaimer, the term of this patent is extended or adjusted under 35 U.S.C. 154(b) by 76 days.

(21) Appl. No.: 17/004,622

(22) Filed: Aug. 27, 2020

(65) Prior Publication Data
US 2020/0395563 A1 Dec. 17, 2020

Related U.S. Application Data

(63) Continuation of application No. PCT/JP2019/007941, filed on Feb. 28, 2019.

(30) Foreign Application Priority Data

Mar. 2, 2018 (JP) .............................. JP2018-038093

(51) Int. Cl.
*H01L 51/00* (2006.01)
*H01L 51/05* (2006.01)
*H01L 51/10* (2006.01)

(52) U.S. Cl.
CPC ...... *H01L 51/0098* (2013.01); *H01L 51/0038* (2013.01); *H01L 51/0558* (2013.01); *H01L 51/105* (2013.01)

(58) Field of Classification Search
CPC ............. H01L 51/0098; H01L 51/0038; H01L 51/0558
See application file for complete search history.

(56) References Cited

U.S. PATENT DOCUMENTS

| | | |
|---|---|---|
| 2005/0106804 A1 | 5/2005 | Aviram |
| 2005/0148179 A1 | 7/2005 | Hirai |

(Continued)

FOREIGN PATENT DOCUMENTS

| | | |
|---|---|---|
| JP | 2005510060 A | 4/2005 |
| JP | 2010073916 A | 4/2010 |

(Continued)

OTHER PUBLICATIONS

Vivitasari. "Molecular Single-Electron Transistor Device using Sn-Porphyrin Protected Gold Nanoparticles." Proceedings of the 63rd JSAP Spring Meeting 21a-S323-9. 2016.

(Continued)

*Primary Examiner* — Anthony Ho
(74) *Attorney, Agent, or Firm* — Rossi, Kimms & McDowell LLP

(57) ABSTRACT

A monomolecular transistor including a first electrode including a first electrode layer and a first metal particle arranged at one end of the first electrode layer, a second electrode including a first electrode layer and a first metal particle arranged at one end of the first electrode layer, a third electrode insulated from the first electrode and the second electrode, a π-conjugated molecule having a π-conjugated skeleton. The first metal particle and the second metal particle face each other. The third electrode is arranged adjacent to the gap in which the first metal particle and the second metal particle face each other, and is spaced from the first metal particle and the second metal particle, (Continued)

the π-conjugated molecule is arranged in a gap between the first metal particle and the second metal particle.

20 Claims, 34 Drawing Sheets

(56) References Cited

U.S. PATENT DOCUMENTS

| | | | |
|---|---|---|---|
| 2011/0168991 | A1 | 7/2011 | Matsui |
| 2019/0041378 | A1 | 2/2019 | Choi |

FOREIGN PATENT DOCUMENTS

| | | | |
|---|---|---|---|
| JP | 2016076542 A | | 5/2016 |
| WO | 03043090 A1 | | 5/2003 |
| WO | 03089515 A1 | | 10/2003 |
| WO | 2017132567 A1 | | 8/2017 |

OTHER PUBLICATIONS

Ouyang. "Coulomb Staircase on Rigid Carbon-bridged Oligo(phenylenevinylene) between Electroless Au Plated Nanogap Electrodes." Proceedings of the 63rd JSAP Spring Meeting 21a-S323-11. 2016.

Choi. "Single-Electron Transistors made by Pt-based Narrow Line Width Nanogap Electrodes." Proceedings of the 77th JSAP Autumn Meeting 13a-C42-2. 2016.

Azuma. "Gate Capacitance Dependence on Nanogap Electrode Structure in Nanoparticle Single-Electron Transistors." Proceedings of the 77th JSAP Autumn Meeting 13a-C42-3. 2016. English machine translation provided.

Choi. "Study of Single-Electron Transistor based on Platinum Nanogap Electrodes." KJF International Conference on Organic Materials for Electronics and Photonics PS-004. 2016.

Choi. "Robust Pt-based Nanogap Electrodes for Single-Electron Transistors." Proceedings of the 64th JSAP Spring Meeting 14p-E206-7. 2017.

Ito. "Single-Molecular Wire Transistor Based on Carbon-Bridged Oligo-Phenylene Vinylene." Proceedings of the 64th JSAP Spring Meeting 2017, 14a-E206-2. 2017. English machine translation provided.

Urayama. "Electron Transport of Quinoidal Fused Oligosilole Single Molecular Devices." Proceedings of the 64th JSAP Spring Meeting 14a-E206-3. 2017. English machine translation provided.

Vivitasari. "Gate Oscillation of Chemically Assembled Single-Electron Transistor Using 2 nm Au Nanoparticle." Proceedings of the 78th JSAP Autumn Meeting 7a-PB1-4. 2017.

Irie. "Single-Molecular ResonantTunnelingTransistor Based on Carbon-Bridged Oligo-Phenylene Vinylene 6." Proceedings of the 66th JSAP Spring Meeting 2019, 12p-W934-2. 2019: 07-128. English machine translation provided.

Lee. "Single Molecular Resonant-Tunneling Transistor (SMRT2) based on Quinoidal Fused Oligosilole Derivative (Si-2*2) bridged between H-ELGP Pt-based Nanogap Electrodes." Proceedings of the 66th JSAP Spring Meeting 2019, 12p-W934-3. 2019: 07-129.

International Search Report issued in Intl. Appl. No. PCT/JP2019/007941 dated May 28, 2019. English translation provided.

Written Opinion issued in Intl. Appl. No. PCT/JP2019/007941 dated May 28, 2019. English translation provided.

Office Action issued in Japanese Appln. No. 2020-503630 dated Jun. 23, 2020. English machine translation provided.

Koshimura. "Initial Metal Thickness Dependence in Electroless Gold Plated Nanogap Electrodes." Proceedings of the 63rd JSAP Spring Meeting. 2016: 07-108. English machine translation provided.

Koshimura. "Au Electroplated Nano-Gap Electrode on Pt Surface." Proceedings of the 64th JSAP Spring Meeting. 2017: 08-101. English machine translation provided.

Hanna. "Variation of the Coulomb staircase in a two-junction system by fractional electron charge." Physical Review B. Sep. 15, 1991: 5919-5922. vol 44, No. 11.

Zhu. "Carbon-Bridged Oligo(phenylenevinylene)s: Stable π-Systems with High Responsiveness to Doping and Excitation." Journal of the American Chemical Society. 2012: 19254-19259. vol. 134.

Becke. "Density-functional exchange-energy approximation with correct asymptotic behavior." Physical Review A. Sep. 15, 1988: 3098-3100. vol. 38, No. 6.

Lee. "Development of the Colle-Salvetti correlation-energy formula into a functional of the electron density." Physical Review B. Jan. 15, 1988: 785-789. vol. 37. No. 2.

Hehre. "Self-Consistent Molecular Orbital Methods. XII. Further Extensions of Gaussian-Type Basis Sets for Use in Molecular Orbital Studies of Organic Molecules." Journal of Chemical Physics. 1972: 2257-2261. vol. 56.

Alonso. "The Evaluation of Surface Diffusion Coefficients of Gold and Platinum Atoms at Electrochemical Interfaces from Combined STM-SEM Imaging and Electrochemical Techniques." Journal of Electrochemical Society. 1990: 2161-2166. vol. 137, No. 7.

Office Action issued in Taiwanese Appln. No. 108106935 dated Apr. 14, 2022. English translation provided.

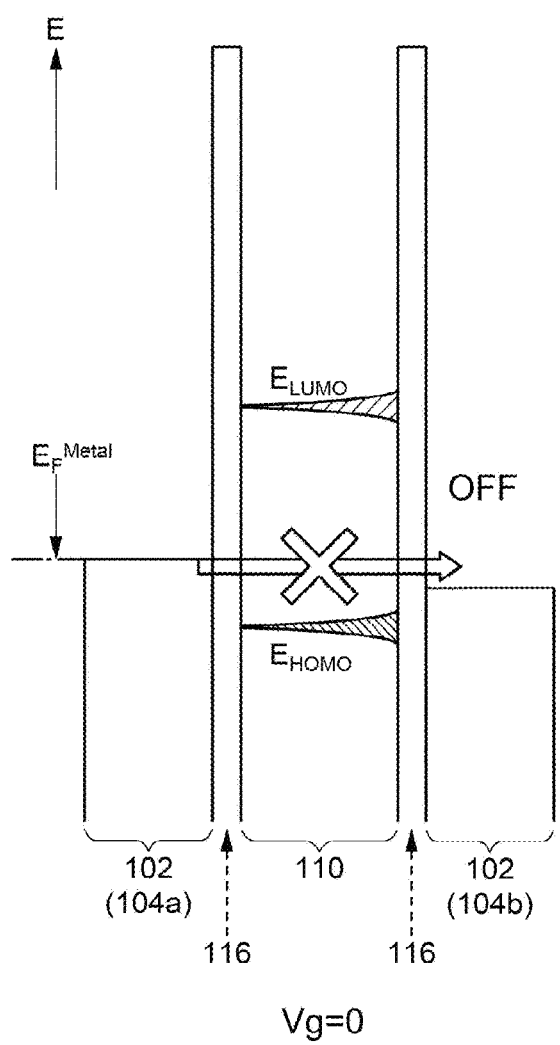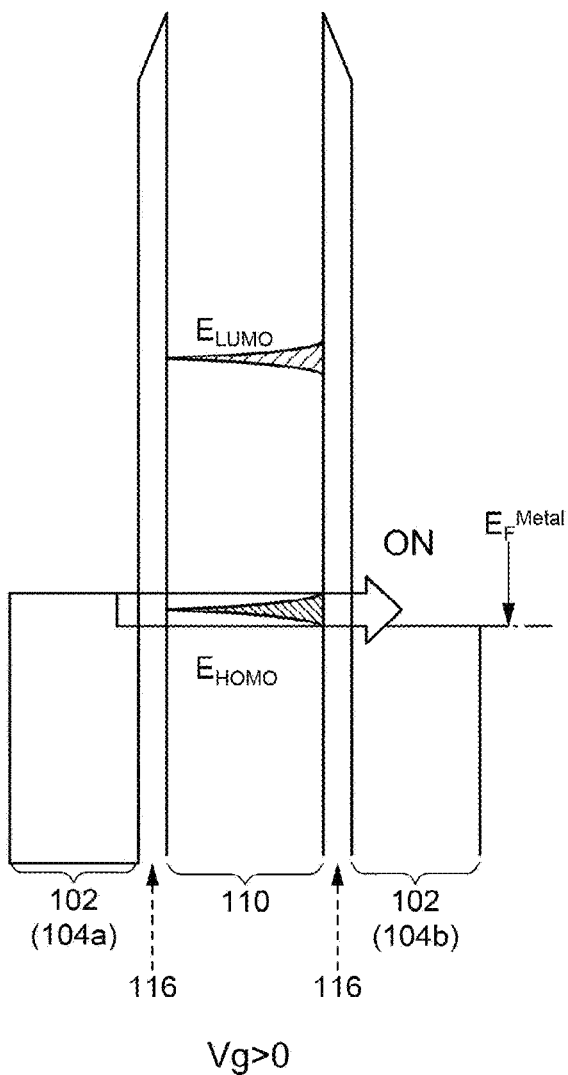

OPV3

COPV3

FIG. 15
9 K
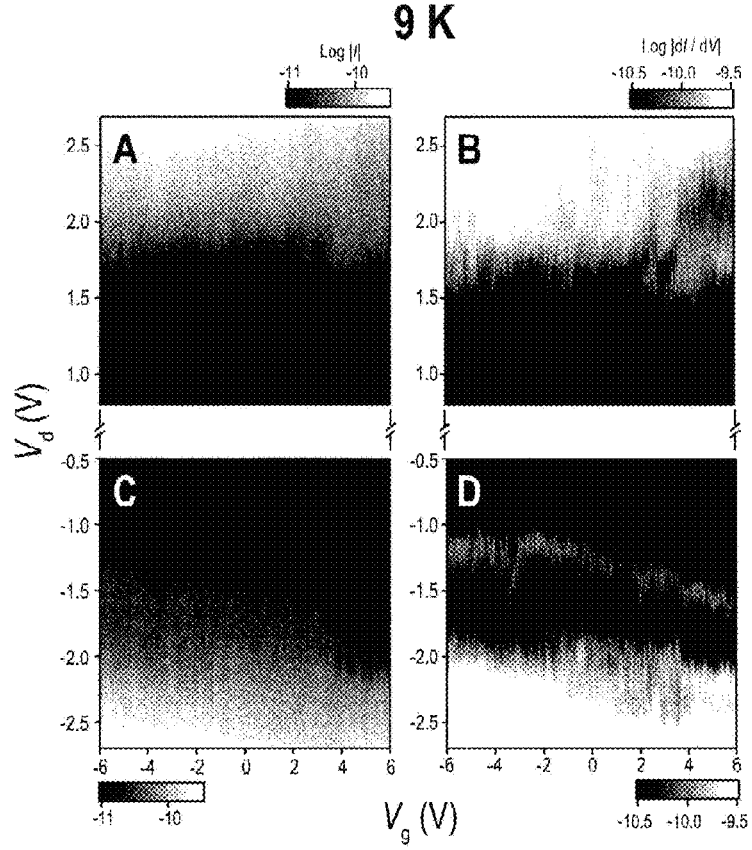
80 K
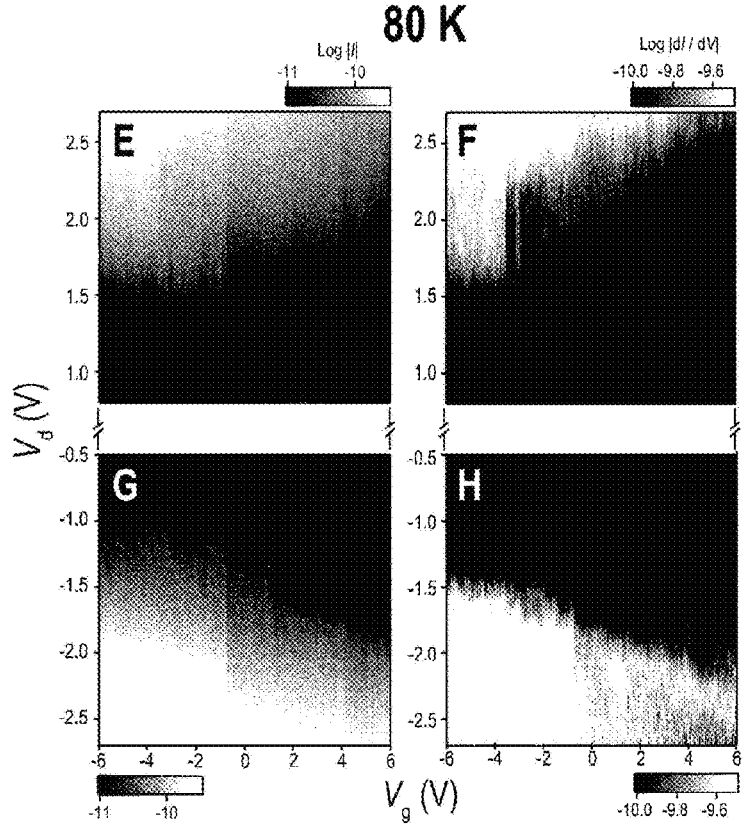

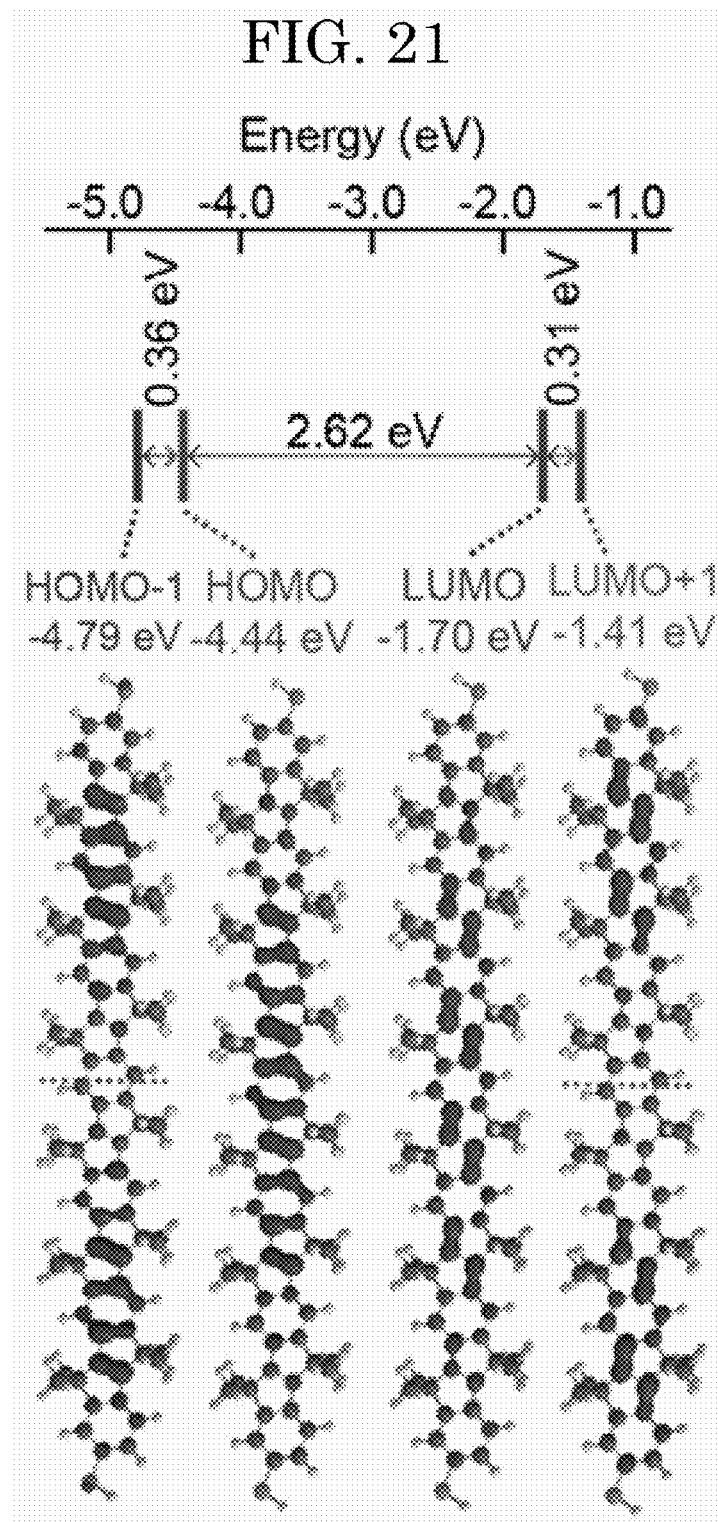

MONOMOLECULAR TRANSISTOR

CROSS REFERENCE TO RELATED APPLICATIONS

This application is based upon and claims the benefit of priority from the prior Japanese Patent Application No. 2018-038093, filed on Mar. 2, 2018, and PCT Application No. PCT/JP2019/007941 filed on Feb. 28, 2019, the entire contents of which are incorporated herein by reference.

FIELD

One embodiment of the present invention relates to a molecular device, and relates to a transistor in which a region corresponding to a channel is composed of molecules and electrons or holes flow by a quantum effect.

BACKGROUND

Semiconductor integrated circuit has made remarkable developments with advances in miniaturization technology. However, some problems are also manifested with the miniaturization. For example, various issues have been pointed out, such as an increase in off-leakage current due to the short-channel effect of the transistor, an increase in gate leakage due to thin film of gate insulating film, an increase in operation rate in CMOS, an increase in power dissipation, and an increase in parasitic capacitance due to the increase in wiring density.

Faced with the limitations of such technological advances, studies are being conducted to realize new electronic devices by bottom-up techniques, or by combining bottom-up techniques and top-down techniques, which are not top-down techniques for processing and miniaturizing materials, but bottom-up techniques for constructing devices from molecules whose atoms and structures, which are the smallest units of matter, are defined. For example, nano-gap electrodes having a gap length of several nanometers have been used to investigate nano-devices in which single nano-particles or single molecules are arranged between the gaps.

SUMMARY

A monomolecular transistor in an embodiment according to the present invention includes a first electrode including a first electrode layer and a first metal particle arranged at one end of the first electrode layer, a second electrode including a first electrode layer and a first metal particle arranged at one end of the first electrode layer, a third electrode insulated from the first electrode and the second electrode, a π-conjugated molecule having a π-conjugated skeleton. The first electrode and the second electrode are arranged so that the first metal particle and the second metal particle face each other and are separated from each other, a width of the first metal particle and the second metal particle from a first end to a second end is less than 10 nm, the third electrode is arranged adjacent to the gap in which the first metal particle and the second metal particle face each other, and is spaced from the first metal particle and the second metal particle, and the π-conjugated molecule is arranged in a gap between the first metal particle and the second metal particle.

A monomolecular transistor in an embodiment according to the present invention includes a nanogap electrode including a pair of metal particles, the pair of metal particles is arranged with a gap of 5 nm or less, a functional molecule disposed in the gap between the pair of metal particles, a gate electrode disposed adjacent to the gap between the pair of metal particles and applying an electric field to the functional molecule, and a resonant tunneling current flows between the nanogap electrodes.

BRIEF DESCRIPTION OF DRAWINGS

FIG. 2A is a diagram showing a band model illustrating resonant tunneling effect, showing a state of $V_g=0$;

FIG. 2B is a diagram showing a band model describing resonant tunneling effect, showing a state of $V_g>0$;

FIG. 15 shows a two-dimensional plot of the drain current (Vd) versus gate voltage (Vg) of a monomolecular transistor fabricated in the example;

FIG. 21 shows the molecular orbitals of COPV6(SH)$_2$ calculated using the functional density-function method;

DESCRIPTION OF EMBODIMENTS

Figure 1:
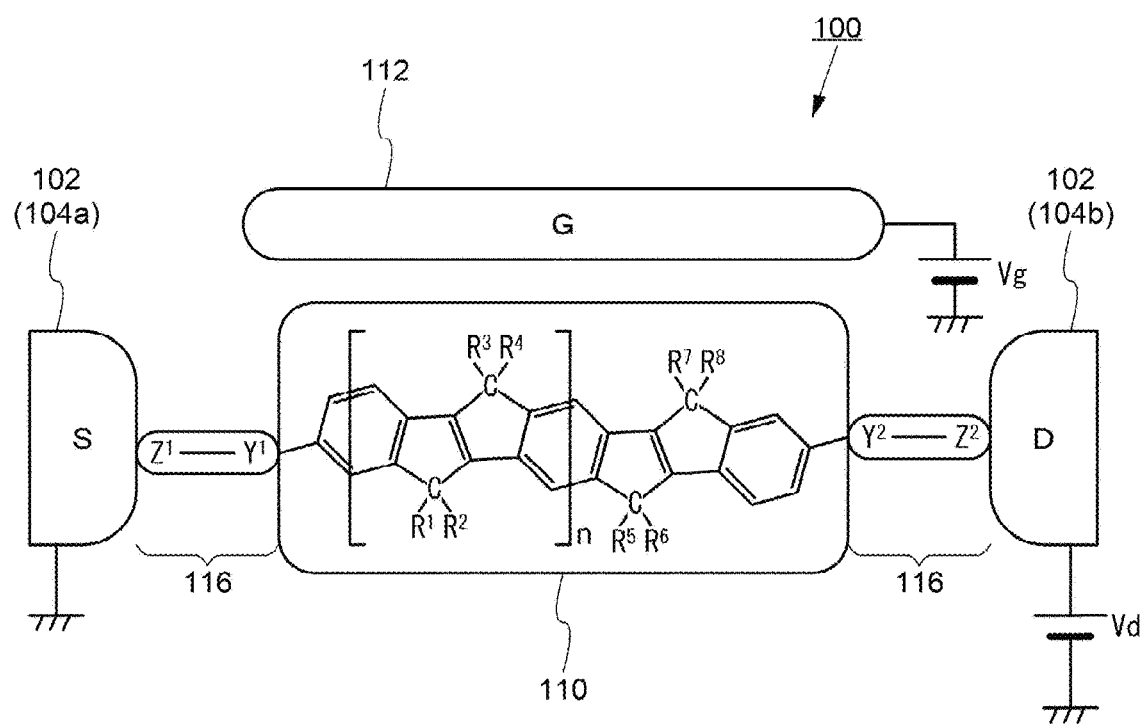
FIG. 1 shows the concept of a monomolecular transistor according to an embodiment of the present invention.

Embodiments of the present invention will be described below with reference to the drawings and the like. However, the present invention may be practiced in many ways and is not to be construed as being limited to the description of the embodiments illustrated below. In order to make the explanation clearer, the drawing may schematically show the width, thickness, shape, etc. of each part in comparison with the actual embodiment. However, it is an example and is not intended to limit the interpretation of the present invention. In this specification and each figure, elements similar to those described above with respect to the previously described figures are denoted by the same reference numerals (or a number followed by a, b, etc.) and detailed description thereof may be omitted as appropriate. In addition, the letters "First" and "Second" appended to each element are expedient signs used to distinguish between the elements and have no further meaning unless otherwise stated.

In the present specification, the nanogap electrode has a gap portion (gap) between a pair of electrodes, and the length of the gap portion (gap length) is 10 nm or less, for example, 1 nm to 10 nm, unless otherwise specified.

1 Principle of Monomolecular Transistors 1-1 Structural Model of a Monomolecular Transistor A monomolecular transistor according to an embodiment of the present invention will be described with reference to the drawings.

FIG. 1 shows a conceptual diagram of a monomolecular transistor according to an embodiment of the present invention. The monomolecular transistor 100 includes a nanogap electrode 102, a gate electrode 112 disposed adjacent to a gap of the nanogap electrode 102, and functional molecule 110 disposed in the gap. In the monomolecular transistor 100, a gate voltage is applied to the gate electrode 112, and a current modulated by the gate voltage flows through the nanogap electrode 102. The functional molecule 110 is isolated from the gate electrode 112 and placed in region where the electric field generated by the gate-bias acts.

The nanogap electrode 102 includes a first electrode 104a and a second electrode 104b. One end of each of the first electrode 104a and the second electrode 104b is disposed opposite to each other so as to have a gap in which a single molecule can be disposed. The gap between the first electrode 104a and the second electrode 104b is arranged in a length of, for example, 5 nm or less. In the nanogap electrode 102, the first electrode 104a is used as a source electrode, and the second electrode 104b is used as a drain electrode. A source voltage is applied to the first electrode 104a, a drain voltage is applied to the second electrode 104b, and a gate voltage is applied to the gate electrode 112.

The functional molecule 110 is a single molecule whose structure is uniquely defined and has a molecular orbital inherent in a single molecule. The functional molecule 110 preferably has a rigid, flat structure and has a strong shape to twist. As the functional molecule 110, for example, a π-conjugated molecule is preferably a carbon-crosslinked π-conjugated molecule. The functional molecule 110 are fixed to one or both electrodes of the nanogap electrode 102 (the first electrode 104a and the second electrode 104b) by chemical adsorption or bonding.

FIG. 1 shows a carbon-bridged phenylenevinylene compound as an example of a functional molecule 110. In the exemplified functional molecule 110, n represents an integer, e.g., from 0 to 9. $R^1$ to $R^8$ may be the same or different. Each $R^1$ to $R^8$ may be the same or a different, optionally substituted aryl group. The aryl group is preferably a hydrocarbon-based aryl group such as a phenyl group or a naphthyl group. Among them, a phenyl group is preferred. The aryl group may have 1 or more substituents. Examples of substituents include alkyl groups of $C_{1-20}$ (preferably $C_{1-15}$ or $C_{1-10}$), alkoxy groups of $C_{1-20}$ (preferably $C_{1-15}$ or $C_{1-10}$), and aryl groups such as phenyl groups. The aryl group as a substituent may also have 1 or more substituents such as the above alkyl group or alkoxy group. In addition, in examples in which $R^1$ to $R^8$ is a phenyl group having a substituent, the bonding position of the substituent is not particularly limited, but it is preferable that the phenyl group is bonded to a para-carbon atom.

Functional molecule 110 include anchoring groups ($Z^1$ and $Z^2$) that chemisorb with nanogap electrodes 102. The functional molecule 110 may also contain linker groups ($Y^1$ and $Y^2$) between anchor groups ($Z^1$ and $Z^2$) and the skeletal portion. The anchor groups ($Z^1$ and $Z^2$) contain atom(s) that chemical-attach to the nano-gap contacts 102. The linker groups ($Y^1$ and $Y^2$) are the groups that link the anchor groups ($Z^1$ and $Z^2$) with the backbone of the functional numerator and are formed, for example, by linear chains. The linker group ($Y^1$ and $Y^2$) is provided to control the distance between the skeleton of the functional molecule 110 and the nanogap electrode 102. For example, as the linker group ($Y^1$ and $Y^2$), a methylene group ($-(CH_2)_n-$) or a perfluoroalkyl group ($-(CF_2)_n-$) can be used. Changing the length of the linker groups ($Y^1$ and $Y^2$) can change the distance between the skeletal portion of the functional molecule 110 and the nanogap electrode 102. In functional molecule 110, the portion where anchor groups ($Z^1$ and $Z^2$) and linker groups ($Y^1$ and $Y^2$) are located substantially forms tunnel barriers 116.

The monomolecular transistor 100 according to the present embodiment has a rigid structure, and suppresses structural fluctuation and fluctuation of the state density width by the functional molecule 110 having a shape resistant to torsion and the thermally stable nanogap electrode 102. Since the monomolecular transistor 100 has such a rigid configuration, resonant tunneling effect is expressed, and a resonance tunneling current flows between the nanogap electrodes 102.

1-2 Operation Principles of Monomolecular Transistors

Resonant tunneling effect described in this embodiment is a quantum phenomenon in which a certain molecule is sandwiched between two potential barriers, and when the energy of an incident electron coincides with an energy level based on a molecular orbital, the electron passes through the barrier without attenuation of energy. The monomolecular transistor 100 controls the on and off states by modulating the energy level of the molecular orbital inherent in the functional molecule 110 with the gate voltage applied to the gate electrode 112 and matching it with the Fermi level of the nanogap electrode 102.

FIG. 2A and FIG. 2B show the band-model illustrating resonant tunneling effect. FIG. 2A shows a system in which functional molecule 110 having two discrete energy levels (highest occupied molecular orbital (HOMO) and lowest unoccupied molecular orbital (LUMO)) are sandwiched between two tunneling barriers 116. The vertical axis represents the energy and the horizontal axis represents the distance corresponding to the space. The length of the line from the right end at the position where the line extending from the right end of the functional molecule 110 to transverse direction intersects region surrounded by a diagonal line corresponding to $E_{HOMO}$, $E_{LUMO}$ corresponds to the energy level density of the Molecular Orbital at that energy. In FIG. 2A, it is assumed that the two tunneling barriers 116 are at the same height. When no voltage is applied (V=0), electron cannot survive the tunneling barrier 116 and no current flows. On the other hand, as shown in FIG. 2B, a voltage is applied to the nanogap electrode 102, when the Fermi level is equal to the energy level of the functional molecule 110, the tunneling probability is increased current flows. FIG. 2B shows that the resonance tunneling current flows when the Fermi level of the nanogap electrodes 102 is equal to HOMO level of the functional molecules.

In order to express resonant tunneling effect effectively, the density of states of the discretized energy level is large, its width is narrow, it is required that the fluctuation is small. Molecules have uniformity and discretized energy levels at the nanoscale, and their energy levels can be controlled by molecular design. The energy level of a molecule has a wide range of density of states, and if the molecular structure fluctuates, the range of density of states fluctuates. If the molecular structures fluctuate, the transistor cannot be turned operation at room temperature.

Therefore, in this embodiment, attention is paid to the fact that the structure of the π-conjugated molecule is rigid and electron transfer is expected through the π-orbital, and a π-conjugated molecule is used as the functional molecule 110. In particular, as the functional molecule 110, a π-conjugated molecule having a π-conjugated skeleton cross-linked with carbon (C) is considered to have a rigid skeletal structure, and therefore, it is considered preferable to express resonant tunneling effect.

2 π-Conjugated Molecule

An example of a π-conjugated molecule that can be used as the functional molecule 110 is shown. Here, carbon cross-linked oligophenylene vinylene having a rigid planar structure by π-conjugated bonds is exemplified.

2-1 Carbon Cross-Linked Oligophenylene Vinylene

Figure 3A:
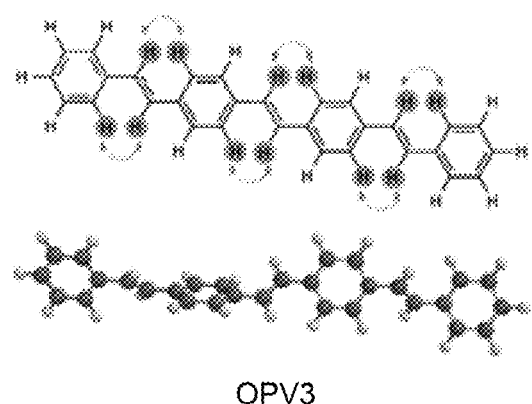
FIG. 3A shows the construction of oligophenylenevinylene and oligophenylenevinylene (OPV3) with three vinylene sites.
Figure 3B:
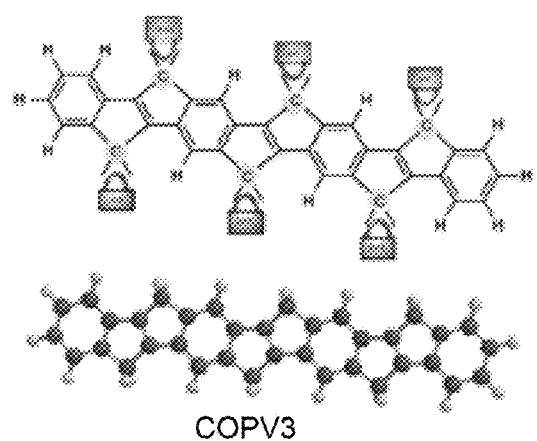
FIG. 3B shows a structure of oligophenylenevinylene in which the bond of the OPV unit is crosslinked with carbon atoms in an oligophenylenevinylene having 3 vinylene sites (COPV3)

As an example of the functional molecule 110, oligophenylenevinylene (OPV) will be described. FIG. 3A shows oligophenylenevinylene (OPV3) with three vinylene sites. OPV3 has a structure in which bonds connecting the units are affected by neighboring hydrogen atoms and it is difficult to adopt a planar structure. That is, OPV3 has a structure in which bonds are twisted by repulsion of hydrogen atoms, and a planar structure is difficult to be obtained. On the other hand, in the oligophenylene vinylene having 3 vinylene sites, FIG. 3B shows a structure in which the bonding portion of the OPV unit is crosslinked by carbon atoms (COPV3). By having such a structure, COPV3 has a planar structure and realizes a molecular structure which is hardly twisted.

A carbon cross-linked oligophenylene vinylene (COPV) is used as a unit, and 5 of this unit are bonded, and a structure of a carbon cross-linked oligophenylene vinylene (COPV5(SH)$_2$) in which a terminal is substituted with a thiol group is shown in equation (1).

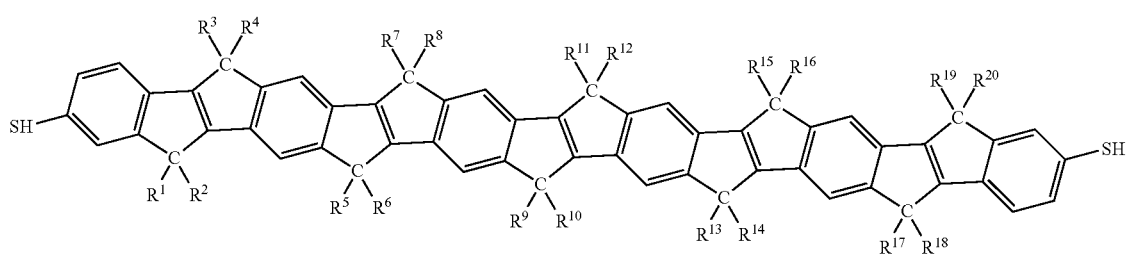

(1)

$R^1$ to $R^{20}$ may be the same or different. Each $R^1$ to $R^{20}$ may be the same or a different, optionally substituted aryl group. The aryl group is preferably a hydrocarbon-based aryl group such as a phenyl group or a naphthyl group. Among them, a phenyl group is preferred. The aryl group may have 1 or more substituents. Examples of substituents include alkyl groups of $C_{1-20}$ (preferably $C_{1-15}$ or $C_{1-10}$), alkoxy groups of $C_{1-20}$ (preferably $C_{1-15}$ or $C_{1-10}$), and aryl groups such as phenyl groups. The aryl group as a substituent may also have 1 or more substituents such as the above alkyl group or alkoxy group. In addition, in examples in which $R^1$ to $R^{20}$ is a phenyl group having a substituent, the bonding position of the substituent is not particularly limited, but it is preferable that the phenyl group is bonded to a para-carbon atom. For example, $R^1$ to $R^4$ and $R^{17}$ to $R^{20}$ in equation (1) may be $CH_3$, $R^5$ to $R^9$ and $R^{13}$ to $R^{16}$ may be $C_6H_5$, and $R^9$ to $R^{12}$ may be $4\text{-}C_8H_{17}C_6H_4$.

In equation (1), the end groups $Z^1$ and $Z^2$ are the same or different substituents and may be substituents other than thiol groups. Specifically, it represents one capable of coordinating to an electrode with a lone pair, such as an amino group, a pyridyl group, or a phosphonyl group, or forming a covalent bond with an electrode element via an element (oxygen (O), nitrogen (N), sulfur (S), selenium (Se), phosphorus (P), or the like).

In equation (1), the terminal group $Y^1$ and $Y^2$ are the same or different linker groups, respectively, and a stylene group ($-(CH_2)_n-$), a perfloroalkil group ($-(CF_2)_n-$), and the like can be used.

Figure 4:
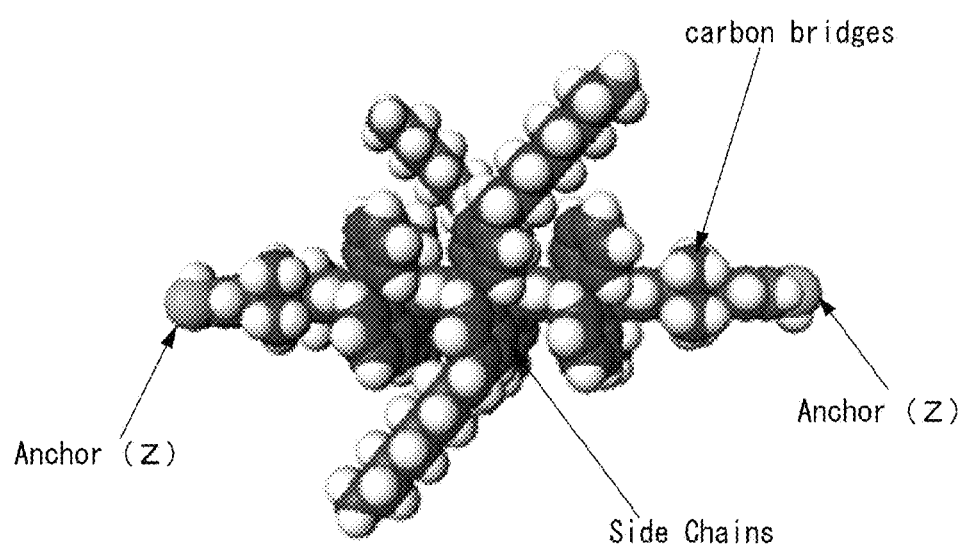
FIG. 4 shows a three-dimensional image of the molecular structure of a carbon cross-linked oligophenylene vinylene in which the terminus is substituted with a thiol group.

FIG. 4 shows a three-dimensional image of the molecular structures of COPV5(SH)$_2$. COPV5(SH). This shows that the carbon bridges, which are the main chains of COPV5(SH)$_2$, are located in the center, and the carbon of the side chains are arranged around the carbon bridges, and that a chain-like, flat bond is formed. Sulphur (S) is arranged as anchors ($Z^1$ and $Z^2$) at both ends of the skeleton. The molecular length of COPV5(SH)$_2$ shown in FIG. 4 is less than 5 nanometers. As described above, since the functional molecule 110 has a length of 5 nm or less, it can be disposed in the gap of the nanogap electrode 102, and a single electron effect can be exhibited. The absorption spectrum of these molecules is 512 nanometers and the energy gap between HOMO and LUMO levels is 2.42 eV.

The number of carbon cross-linked oligophenylene vinylene (COPVn(SH)$_2$) whose terminal is substituted with a thiol group is not limited to the number of COPV units, but it is preferable that the number of carbon-bridged oligophenylene vinylene vinylene (SH) is 1 to 10.

2-2 Molecular Orbital Computing of COPV5(SH)$_2$ by DFT-Computing

Figure 5:
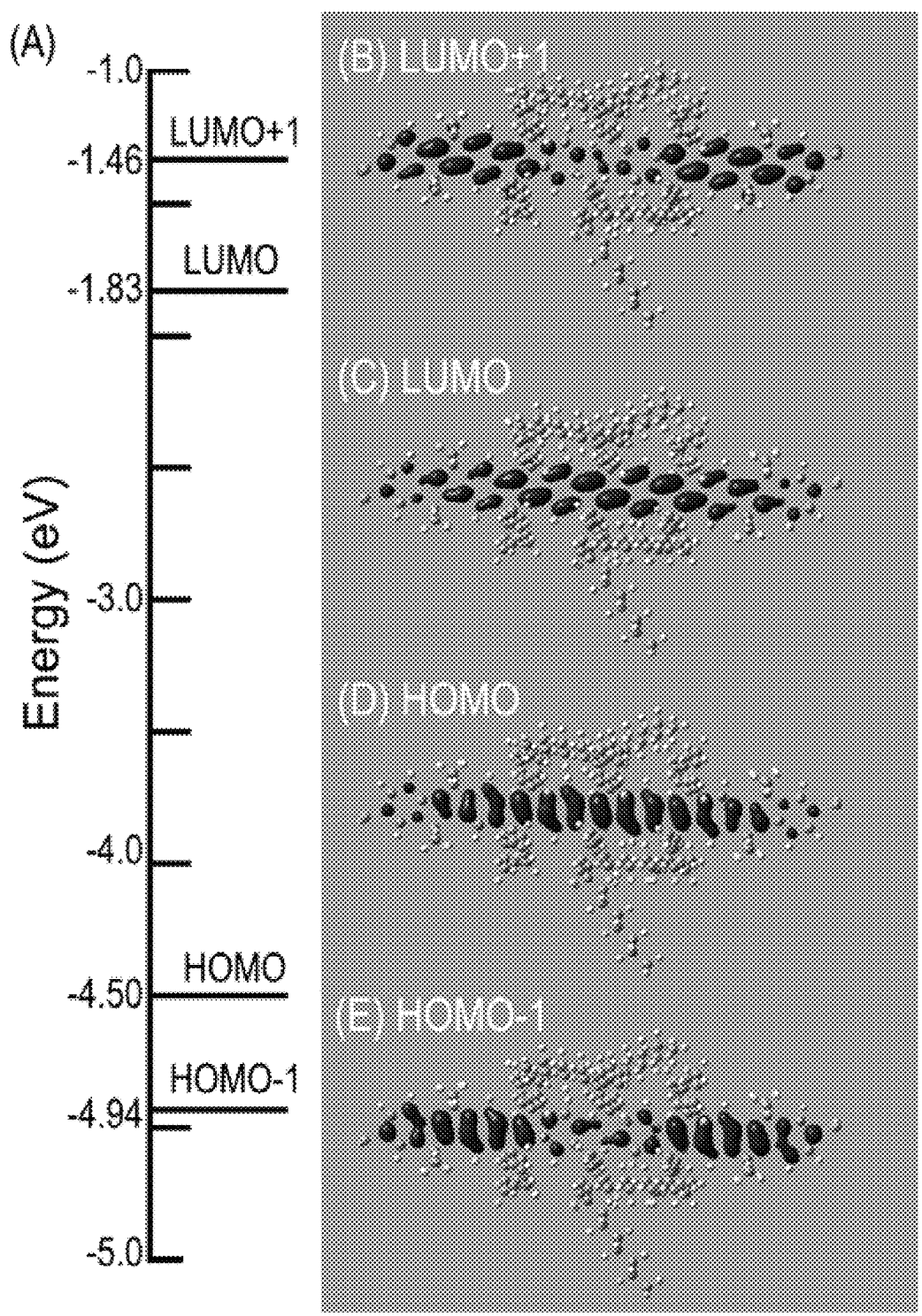
FIG. 5 shows the results of computing the molecular orbitals of carbon cross-linked oligophenylene vinylene with their termini replaced by thiol groups using the functional density functional method.

FIG. 5 shows the molecular orbitals of COPV5(SH)$_2$ calculated using the density functional method. "Gaussian09" is used for the calculations. For the exchange correlation functional, a B3LYP in which the exchange functional B3 by Becke hybrid method and Lee-Yanf-Parr correlation functional are combined is used (Becke D. Axel, Phys. Rev. A, 38, 3098, (1988); C. Lee, W. Yang, and R. G. Parr, Phys. Rev. B, 37, 785, 1988). In addition, 6-31G is used as the basis function (W. J. Hehre, R. Ditchfield and J. A. Pople, J. Chem. Phys., 56, 2257, (1972)).

FIG. 5 shows molecular orbitals at LUMO+1 (−1.46 eV), LUMO (−1.82 eV), HOMO (−4.50 eV) and HOMO−1 (−4.94 eV) levels of COPV5(SH)$_2$, respectively. As shown in FIG. 5, it is clearly confirmed that the electron orbitals are shared by the π-conjugated bond system of the main chain at any level. In addition, it can be seen that the carbon atom to which the SH group of COPV5(SH)$_2$ is bonded and the carbon atom connected to the carbon atom do not share an electron orbital with other carbon groups in HOMO level and LUMO level. From this computation, the energy gap between HOMO-LUMO of COPV5(SH)$_2$ is calculated to be 2.67 eV.

Figure 6A:
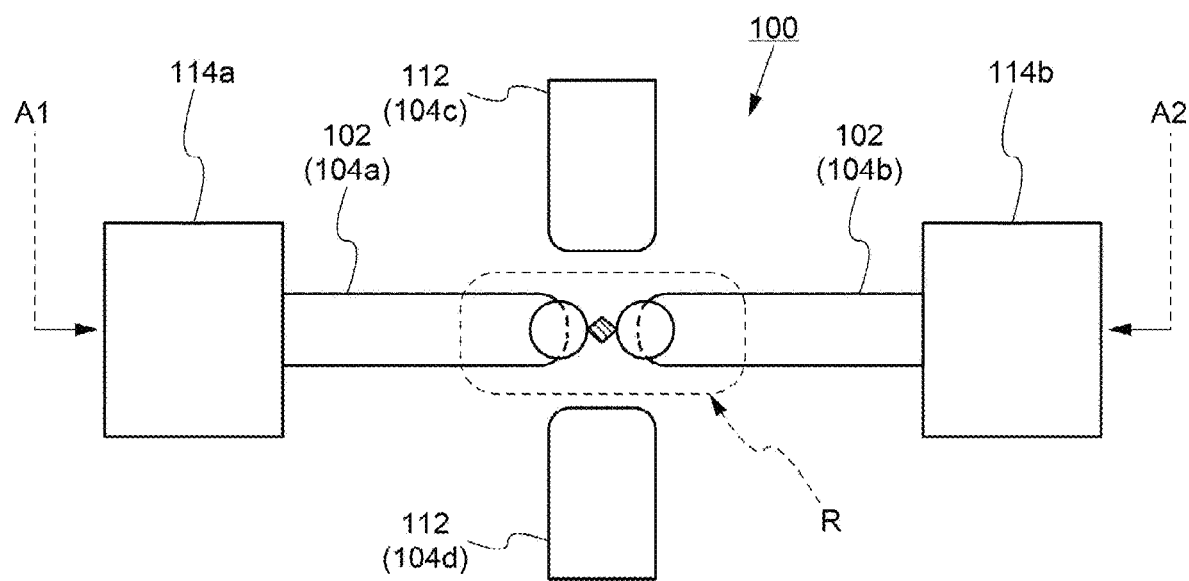
FIG. 6A shows a plan view of a monomolecular transistor according to an embodiment of the present invention.
Figure 6B:
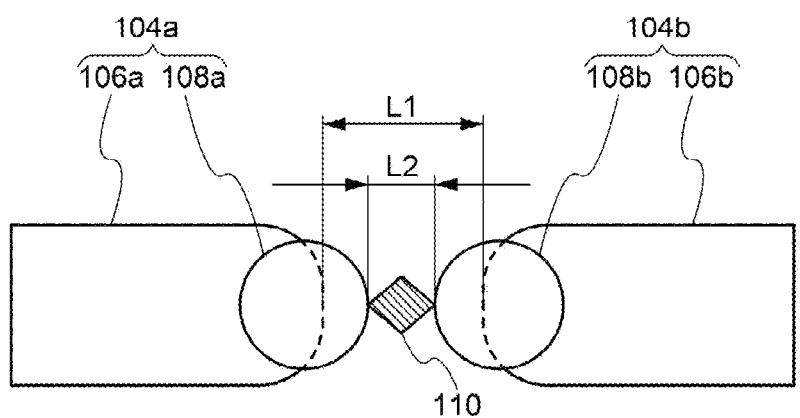
FIG. 6B shows an enlarged view of region R enclosed by a dotted line in FIG. 6A.
Figure 6C:
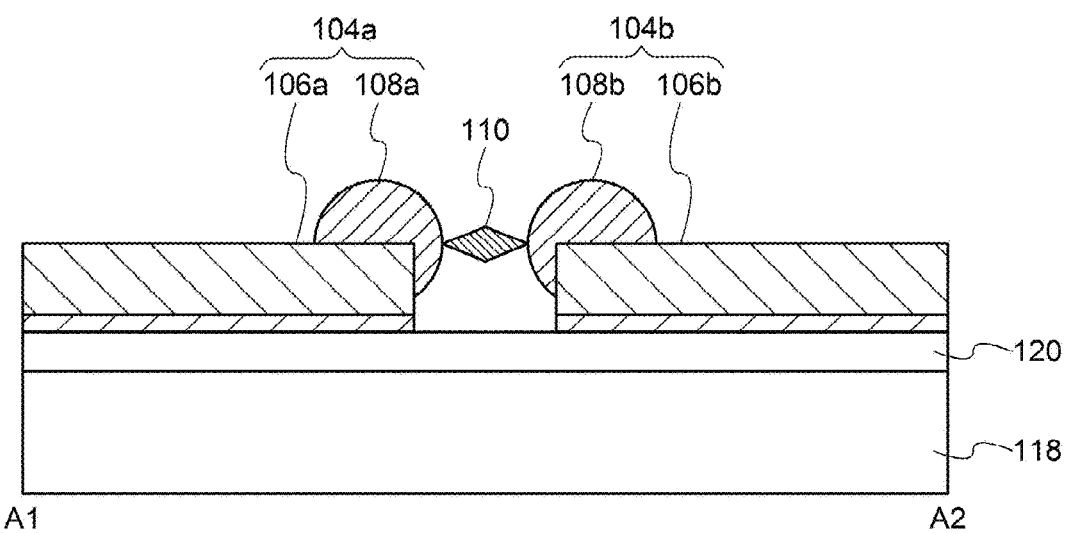
FIG. 6C shows the corresponding cross-sectional view between A1-A2 in FIG. 6A.

3 Monomolecular Transistor Configuration 3-1 Structure of a Monomolecular Transistor FIG. 6A shows a plan view of the monomolecular transistor 100 according to the present embodiment, FIG. 6B shows an enlarged view of region R surrounded by a dotted line, and FIG. 6C shows a cross-sectional configuration corresponding to A1-A2.

The single molecule transistor 100 includes a nanogap electrode 102 provided on a substrate 118, a functional molecule 110 disposed in a gap between the nanogap electrodes 102, and the gate electrode 112 adjoining the functional molecule 110. The nanogap electrode 102 is disposed so that one end portions of the first electrode 104a and the second electrode 104b face each other with a gap therebetween. The gate electrode 112 includes a third electrode 104c and a fourth electrode 104d. FIG. 6A shows the structure in which the first and second electrodes 104a and 104b are rectangular shaped, each one end of the longitudinal direction is opposed, arranged with a nanogap length, and the functional molecule 110 is positioned in the gap.

As substrate 118, a silicon wafer, silica substrate, alumina substrate, alkali-free glass substrate, or the like is used. When a silicon wafer is used as substrate 118, an insulating film 120 is preferably provided in order to ensure the insulating property of the surfaces forming the first electrode 104a, the second electrode 104b, the third electrode 104c, and the fourth electrode 104d. The insulating film 120 is formed of an inorganic insulating film such as a silicon oxide film, a silicon nitride film, a silicon oxynitride film, an aluminum oxide film, or a magnesium oxide film.

FIG. 6B shows a detail of the nanogap electrodes 102 constituting the monomolecular transistor 100. The first electrode 104a includes a first electrode layer 106a and a first metal particle 108a (at least one metal particle), and the second electrode 104b includes a second electrode layer 106b and a second metal particle 108b (at least one metal particle). The electrode layers are formed by patterning a conductive thin film such as a metal film to function as an electrode.

The first metal particle 108a and the second metal particle 108b have, for example, a hemispherical outer shape at least partially or entirely in an appearance shape observed by a scanning electron microscope or the like. The first metal particle 108a are disposed on tip portion of the first electrode layer 106a, and the second metal particle 108b are disposed on tip portion of the second electrode layer 106b. The first metal particle 108a and the second metal particle 108b are preferably formed by, for example, electroless plating.

In FIG. 6B, interval between the first electrode layer 106a and the second electrode layer 106b is denoted by L1, and interval between the first metal particle 108a and the second metal particle 108b is denoted by L2. In the nanogap electrode 102, interval L1 of end portion (tip portion) of each of the first electrode layer 106a and the second electrode layer 106b is preferably arranged in a length of 20 nm or less, preferably 15 nm or less. Further, the length (gap length) L2 of the gap formed by the first metal particle 108a and the second metal particle 108b is provided with a length capable of arranging the functional molecules 110. For example, the gap length L2 formed by the first metal particle 108a and the second metal particle 108b is 5 nm or less. Although the first metal particle 108a and the second metal particle 108b have a nanoscale size, they are prevented from coming into contact with each other by exhibiting a self-terminating function in electroless plating, as will be described later.

The first metal particle 108a and the second metal particle 108b are provided as a single mass (or island-shaped region) on the respective surfaces of the first electrode layer 106a and the second electrode layer 106b. The first metal particle 108a and the second metal particle 108b have a hemispherical external view like a water droplet dripped on a hydrophobic surface. Here, the hemispherical shape refers to a spherical surface in which curved surface continues, and is not limited to a true spherical surface. In the nanogap electrode 102, it is preferable that the first metal particle 108a and the second metal particle 108b do not increase in diameter. In addition, it is desired that the first metal particle 108a on the first electrode layer 106a and the second metal particle 108b on the second electrode layer 106b have widths from one end to the other end in planar view of 20 nm or less, preferably 15 nm or less, more preferably 10 nm or less. The widths of the first metal particle 108a and the second metal particle 108b mean the maximum widths of isolated metal particles observed on the surfaces of the first electrode layer 106a and the second electrode layer 106b, respectively.

The widths of the first electrode layer 106a and the second electrode layer 106b are preferably substantially the same as the widths of the first metal particle 108a and the second metal particle 108b. By setting the widths W of the first electrode layer 106a and the second electrode layer 106b to 20 nm or less, preferably 15 nm or less, more preferably 10 nm or less, the metal particle 108 can be grown preferentially at tip portion. In other words, by setting the widths of the first electrode layer 106a and the second electrode layer 106b to be the same as the widths of the first metal particle 108a and the second metal particle 108b, the number of metal particles formed at one end of each of the first electrode layer 106a and the second electrode layer 106b can be controlled to be one. If the widths of the first electrode layer 106a and the second electrode layer 106b are 20 nm or more, the probability that a plurality of metal particle 108 are juxtaposed at one end increases, so that the value of the width W is preferably 20 nm or less.

In the nanogap electrode 102, the first electrode layer 106a and the second electrode layer 106b are formed of a first metal, and the first metal particle 108a and the second metal particle 108b are formed of a second metal. The combination of the first metal and the second metal may be appropriately selected, but it is preferable that the first metal and the second metal form a metal bond and/or an alloy. With such a combination, the hemispherical metal particle 108a can be provided on the surface of the first electrode layer 106a, and the second metal particle 108b can be provided on the surface of the second electrode layer 106b in a state isolated from other metal particles.

The first metal particle 108a and the second metal particle 108b may be solid solutions formed of a first metal and a second metal. The first metal particle 108a and the second metal particle 108b form a solid solution, whereby the solid solution can be strengthened, and the mechanical stability of the nanogap electrode 102 can be enhanced.

As a metal material for forming the nanogap electrode, gold (Au) is considered to be suitable from the viewpoints of conductivity and chemical stability. However, it is known that gold (Au) has a lower melting point when it becomes nanoscale, and becomes unstable due to Rayleigh instability. For example, it is known that gold (Au) cannot maintain its shape as individual particles when it becomes a nanoparticle having a diameter of 10 nm or less. On the other hand, in order to realize the monomolecular transistor 100 using the nanogap electrode 102, thermal stability is required.

Here, the surface energy of a metal surface with a nanoscale radius of curvature is proportional to the inverse of the radius of curvature. In the presence of shapes with different radii of curvature, the metal atoms tend to be spherical with a large radius of curvature, which diffuses to the surface and has a stable energy, due to the Rayleigh instability. The migration rate of surface diffusion is proportional to surface self-diffusion coefficient and inversely proportional to the inverse of temperature. The surface tension is proportional to the inverse of the radius of curvature. The smaller the radius of curvature, the more likely the surface diffusion of metal atoms occurs.

For example, on the surface of the titanium (Ti) film formed on a substrate, to deposit gold (Au) by electron beam evaporation, when trying to form an electrode having a line width of 20 nm or less, the electrode shape is changed at room temperature by Rayleigh instability. This phenomenon is considered to be caused by the high surface self-diffusion coefficient of gold (Au) at room temperature of about $10^{-13}$ cm$^2$/sec (C. Alonso, C. Salvarezzo, J. M. Vara, and A. J. Arvia, J. Electrochem. Soc. Vol. 137, No. 7, 2161 (1990)).

Therefore, the nanogap electrode 102 employs a combination in which surface self-diffusion coefficient of the first metal forming the first electrode layer 106a and the second electrode layer 106b is smaller than surface self-diffusion coefficient of the second metal forming the first metal particle 108a and the second metal particle 108b. In other words, when the first electrode layer 106a and the second electrode layer 106b are formed of the first metal and the first metal particle 108a and the second metal particle 108b are formed of the second metal, a combination is applied in which surface self-diffusion coefficient of the second metal on the surfaces where the first metal and the second metal are bonded to each other is smaller than surface self-diffusion coefficient of the second metal. By such a combination, surface diffusion of the second metal is suppressed, and the first metal particle 108a and the second metal particle 108b can be formed as independent particles having a hemispherical shape.

An example of a combination of the first metal and the second metal is to use platinum (Pt) as the first metal and gold (Au) as the second metal. Specifically, the first electrode layer 106a and the second electrode layer 106b are preferably formed of platinum (Pt), and the first metal particle 108a and the second metal particle 108b are preferably formed of gold (Au), as one embodiment.

That is, by combining gold (Au) having a surface self-diffusion coefficient of $10^{-13}$ cm$^2$/sec at room temperature with platinum (Pt) having a surface self-diffusion coefficient of about $10^{-18}$ cm$^2$/sec, the influence of Rayleigh instability is eliminated, and a structurally stable nano-gap electrode 102 can be obtained. In other words, by combining platinum (Pt) having a low surface self-diffusion coefficient with gold (Au) while using gold (Au) suitable as the electrode material, the surface self-diffusion of gold (Au) in the growing process can be suppressed, and the shape-stability of the gold nanoparticles can be greatly improved. Platinum (Pt) has a high melting point of 1768° C., is excellent in heat resistance, is hard, is also chemically stable, and has a property of high durability. Further, since platinum (Pt) forms a metal bond with gold (Au), the surface diffusion of gold (Au) is suppressed in the process of growing particles of gold (Au) on the surface of platinum (Pt), and it becomes possible to stably exist gold (Au) particles having a hemispherical surface.

Since the surface self-diffusion coefficient of gold (Au) is $10^{-13}$ cm$^2$/sec and that of platinum (Pt) is about $10^{-18}$ cm$^2$/sec, the surface self-diffusion coefficient of gold (Au) is five orders of magnitude smaller than that of platinum, and due to the existence of an alloy of gold (Au) and platinum (Pt), the surface self-diffusion coefficient of gold (Au) atoms on a platinum (Pt) surface is smaller than that of gold (Au) atoms when platinum is replaced with gold. Therefore, it is expected that the diffusion of the first metal particle 108a and the second metal particle 108b formed of gold (Au) in the lateral direction (in-plane direction) is suppressed on the surfaces of the first electrode layer 106a and the second electrode layer 106b formed of platinum (Pt).

Since the first metal particle 108a and the second metal particle 108b formed of the second metal (gold (Au)) are prevented from diffusing transverse direction on the surfaces of the first electrode layer 106a and the second electrode layer 106b formed of the first metal (platinum (Pt)), the large particle diameter is suppressed and the particles become small hemispherical particles. For example, the first metal particle 108a and the second metal particle 108b formed of gold (Au) have widths of 20 nm or less, preferably 15 nm or less, more preferably 10 nm or less, from one end to the other end in planar view on the surfaces of the first electrode layer 106a and the second electrode layer 106b formed of platinum (Pt), and can stably retain their shapes. The hemispherical first metal particle 108a and the hemispherical second metal particle 108b preferably have a radius of curvature of 12 nm or less.

Since the first metal particle 108a and the second metal particle 108b have such radii of curvature, capacitance can be increased when one or both of the third electrode 104c and the fourth electrode 104d functioning as the gate electrode 112 are disposed adjacent to the nanogap electrode 102. Thus, an electric field is applied to the functional molecule 110 disposed in the gap between the nano-gap electrodes 102, thereby enabling gate modulation of the single-molecule transistor 100.

In the present embodiment, platinum (Pt) is used as the first metal for forming the first electrode layer 106a and the second electrode layer 106b, and gold (Au) is used as the second metal for forming the first metal particle 108a and the second metal particle 108b, but the present invention is not limited thereto. Other metal materials may be used as long as the first metal and the second metal form alloys and satisfy surface self-diffusion coefficient relation as described above.

A platinum layer forming the first electrode layer 106a and the second electrode layer 106b is provided on insulating surface. In the first electrode layer 106a and the second electrode layer 106b, another metal layer may be provided between the platinum layer and the base surface. As shown in FIG. 6C, in order to improve the adhesion of the platinum (Pt) layer, a titanium (Ti) layer may be provided between the platinum (Pt) layer and the underlying surface. The layer for improving the adhesion of the platinum (Pt) layer is not limited to titanium (Ti), and a layer formed of another transition metal such as chromium (Cr) or tantalum (Ta) may be used.

As shown in FIG. 6C, the cross sections of the first metal particle 108a and the second metal particle 108b are hemispherical and have curved surfaces. Therefore, since tip portions where the first metal particle 108a and the second metal particle 108b face each other float away from the surfaces of substrate 118, when voltages are applied to one or both of the third electrode 104c and the fourth electrode 105d, a strong electric field can be applied to the functional molecule 110.

Figure 7A:
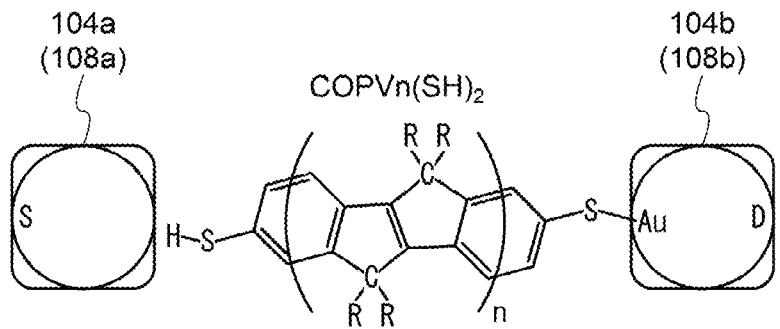
FIG. 7A is a diagram illustrating a configuration of a monomolecular transistor according to an embodiment of the present invention, and shows a mode in which an SH bond at one end of COPVn is broken and sulfur (S) and gold (Au) are chemically bonded to each other and disposed between electrodes.
Figure 7B:
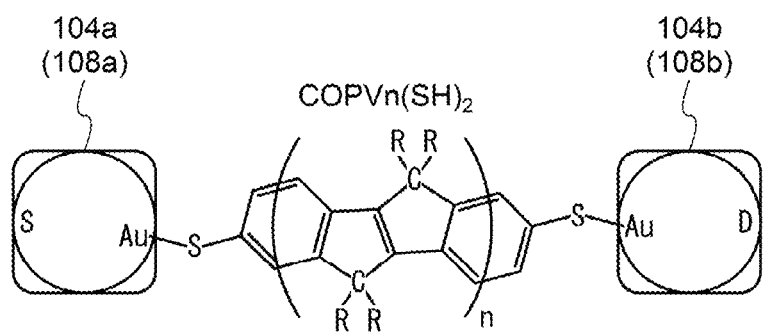
FIG. 7B is a diagram illustrating a configuration of a monomolecular transistor according to an embodiment of the present invention, in which sulfur (S) at both ends of COPVn is chemically bonded to gold (Au) and is disposed between electrodes.
Figure 7C:
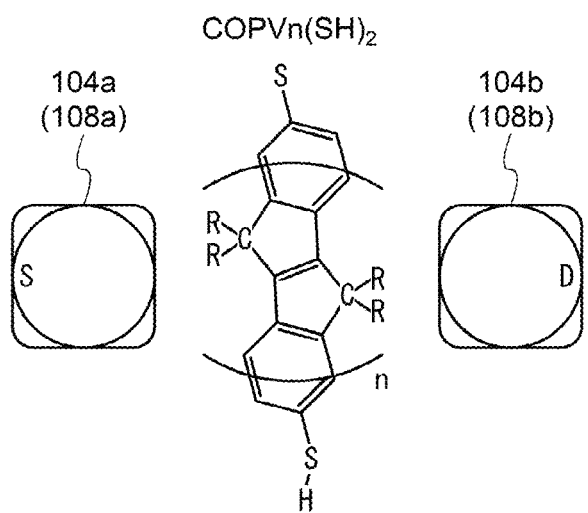
FIG. 7C is a diagram illustrating a configuration of a monomolecular transistor according to an embodiment of the present invention, in which COPVn is disposed in a free state between electrodes without forming a chemical bond.

As the functional molecule 110, for example, COPVn (n=4 to 6) is used. COPVn used as the functional molecule 110 is a wire-like molecule, and has SH bonds at both ends. FIG. 7A shows a mode in which the SH bond at one end of COPVn is broken, the sulfur (S) and gold (Au) forming the second metal particle 108b are chemically bonded to each other, and the SH bond is fixed to the gap between the first electrode 104a and the second electrode 104b. Since the bonding energies of sulfur (S) and gold (Au) are high, COPVn is fixed and stably held in the gap between the nanogap electrodes 102. As shown in FIG. 7B, sulfur (S) at both ends of COPVn may be chemically bonded to gold (Au) forming the first metal particle 108a and the second metal particle 108b, respectively. By fixing both ends of COPVn, the twisting of molecules can be further prevented, and structural stability can be enhanced. For another example, as shown in FIG. 7C, COPVn may be disposed in a free condition in the gap between the first electrode 104a and the second electrode 104b without forming a chemical bond with both the first metal particle 108a and the second metal particle 108b.

As shown in FIG. 6A, the third electrode 104c and the fourth electrode 104d functioning as the gate electrode 112 are insulated from the functional molecule 110. The third electrode 104c and the fourth electrode 104d change the relative relationship between the Fermi level of the first electrode 104a and the second electrode 104b and the energy level of the molecular orbit of the functional molecule 110 so that a resonance tunneling current flows between the first electrode 104a and the second electrode 104b when a gate voltage is applied.

One of the third electrode 104c and the fourth electrode 104d used as the gate electrode 112 may be omitted. Further, although FIG. 6A shows an embodiment in which the third electrode 104c and the fourth electrode 104d functioning as the gate electrode 112 are provided on the same plane as the nanogap electrode 102, the present invention is not limited thereto. For example, the third electrode 104c and the fourth electrode 104d may be disposed on the lower layer side or the upper layer side of the nanogap electrode 102 with insulating film interposed therebetween so as to overlap with the functional molecule 110.

As shown in FIG. 6A, the first electrode 104a may be connected to the first pad 114a, and the second electrode 104b may be connected to the second pad 114b. The first pad 114a and the second pad 114b are arbitrary and may be provided as appropriate.

The monomolecular transistor 100 according to the present embodiment is used as the thermally stable nanogap electrode 102 and the functional molecule 110 for arranging structurally stable π-conjugated molecules having a planar skeleton in a gap. The monomolecular transistor 100 can flow a resonant tunneling current between the first electrode 102a used as the source electrode and the second electrode 102b used as the drain electrode, and can be modulated by a gate voltage applied to the gate electrode. The single-molecule transistor 100 can realize such the operation even at room temperature.

3-2 Manufacturing Method of Monomolecular Transistor

An example of a method for manufacturing the monomolecular transistor 100 will be described with reference to the drawings. The manufacturing process of the single molecule transistor 100 includes a step of manufacturing the nanogap electrode 102 and a step of disposing the functional molecule 110 in the gap between the nanogap electrodes 102.

3-2-1 Fabrication of Nanogap Electrodes

Figure 8A:
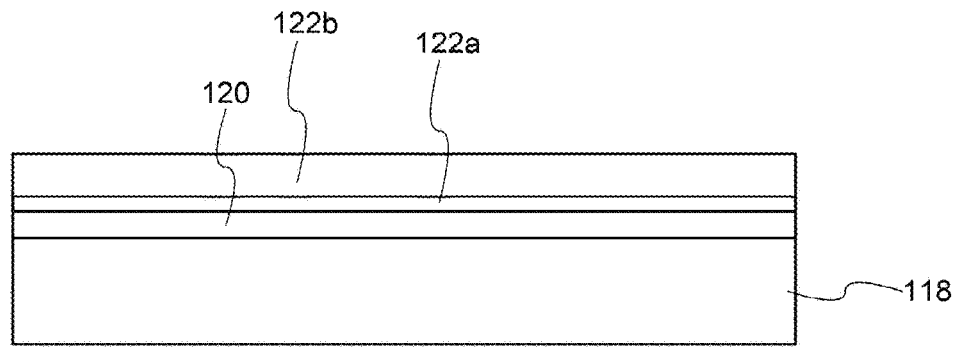
FIG. 8A is a diagram illustrating a manufacturing process of a monomolecular transistor according to an embodiment of the present invention, and shows a step of forming a metal film.

FIG. 8A shows a step of forming a metal film. The substrate 118 preferably has insulating surface, and is desired to have excellent flatness and low warpage in order to form fine patterns. For example, as the substrate 118, a silicon wafer on which the insulating film 120 such as a silicon oxide film is formed can be suitably used. The insulating film 120 formed by thermally oxidizing the surface of the silicon wafer is suitable because it is dense and has excellent film thickness uniformity. As the substrate 118, a ceramic substrate formed of an insulating oxide material such as quartz substrate, alkali-free glass substrate, alumina, zirconia, or the like can be used.

As shown in FIG. 8A, a first metal film 122a and a second metal film 122b are formed on the upper surface of the insulating film 120. For example, the first metal film 122a is formed of titanium (Ti), and the second metal film 122b is formed of platinum (Pt). A portion to which the metal particle(s) are adhered is formed by the second metal film 122a. The first metal film 122a is not an indispensable structure, and is provided as appropriate in order to improve the adhesion of the second metal film 122b to the underlying surface. The first metal film 122a and the second metal film 122b are formed using a thin film fabricating technique such as an electron-beam evaporation method, a sputtering method, or the like. As the first metal film 122a, a titanium (Ti) film is formed to a thickness of 2 nm to 10 nm, for example, 5 nm, and as the second metal film 122b, a platinum (Pt) film is formed to a thickness of 5 nm to 20 nm, for example, 10 nm.

Figure 8B:
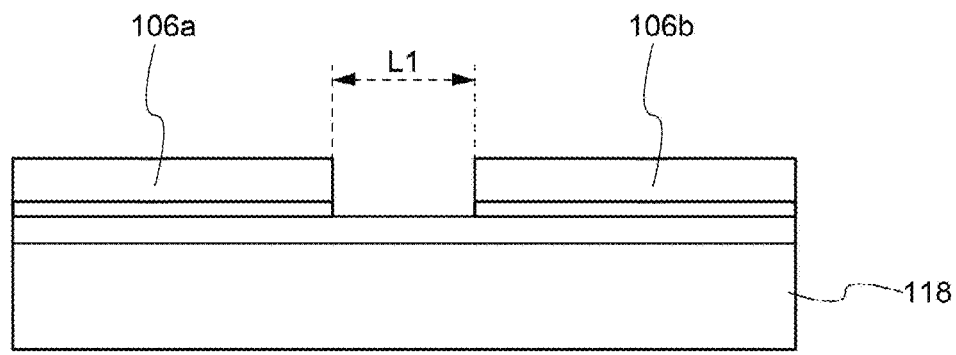
FIG. 8B is a diagram illustrating a manufacturing process of a monomolecular transistor according to an embodiment of the present invention, and shows a step of patterning a metal film to form electrodes having nano-scale gaps.

FIG. 8B shows a step of patterning the first metal film 122a and the second metal film 122b to form the first electrode 104a and the second electrode 104b having nanoscale gaps. The patterning of the first metal film 122a and the second metal film 122b is performed using photolithography or electron beam lithography. In this step, a resist mask is formed and the first metal film 122a and the second metal film 122b are etched, whereby the first electrode 104a and the second electrode 104b are manufactured. The resist mask is peeled off after etching. A length L1 between the first electrode 104a and the second electrode 104b is 20 nm or less, preferably 15 nm or less, for example, 7.5 nm. The first electrode layer 106a and the second electrode layer 106b are manufactured to have a width of 20 nm or less, preferably 15 nm or less, for example, 17 nm.

Note that, although not shown, a resist mask may be formed on the substrate 118 prior to forming the metal film, and then the first metal film 122a and the second metal film 122b may be formed, and the resist mask may be peeled off, whereby the first metal film 122a and the second metal film 122b may be lifted off to prepare the first electrode 104a and the second electrode 104b.

Figure 8C:
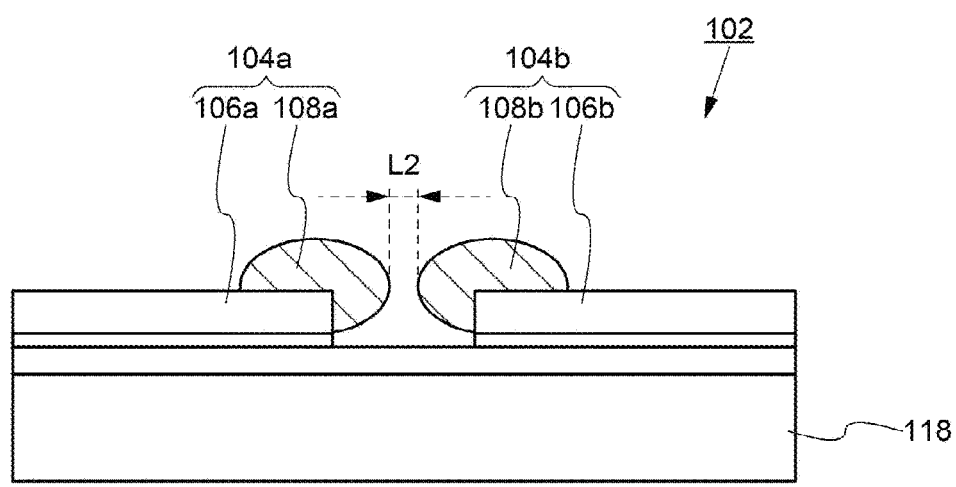
FIG. 8C is a diagram illustrating a manufacturing process of a monomolecular transistor according to an embodiment of the present invention, and shows a step of manufacturing metal particles.

FIG. 8C shows a step of forming the first metal particle 108a and the second metal particle 108b. As the first metal particle 108a and the second metal particle 108b, for example, gold (Au) particles are formed. The gold (Au) particles can be formed by an electroless plating method. As solutions and reducing agents used in electroless gold plating, cyanide compounds (cyanide), which are toxic materials, are well known. However, in the present embodiment, electroless gold plating is performed using iodine tincture. In the electroless gold plating, as the electroless plating solution, those obtained by dissolving iodine tincture and gold foil, the reducing agent uses L(+)-ascorbic acid ($C_6H_8O$).

The first metal particle 108a and the second metal particle 108b are grown on the respective surfaces of the first electrode layer 106a and the second electrode layer 106b by electroless plating. When subjected to electroless gold plating, gold (Au) particles grow. The first metal particle 108a and the second metal particle 108b grow at arbitrary positions on the surfaces of the first electrode layer 106a and the second electrode layer 106b, respectively. However, since one end portions of the first electrode layer 106a and the second electrode layer 106b are formed to have widths of 20 nm or less, nucleation is preferentially performed in end portion. As a result, the first metal particle 108a can be grown on end portion of the first electrode layer 106a, and the second metal particle 108b can be grown on end portion of the second electrode layer 106b.

In the process of electroless gold plating, ascorbic acid and monovalent positive ions of gold exist on the surfaces of the first electrode layer 106a and the second electrode layer 106b, and ascorbic acid acts as a reducing agent, so that a state of electrons is formed. At this time, on the surfaces of the first electrode layer 106a and the second electrode layer 106b, gold ions are reduced to gold by the surface autocatalytic reaction, and are plated. As a result, as shown in FIG. 8C, the first metal particle 108a and the second metal particle 108b grow on end portion of the first electrode 104a and the second electrode 104b, respectively. However, as the first metal particle 108a and the second metal particle 108b grow and become larger, interval of the two metal particles becomes narrower. Then, a Helmholtz layer (a layer of solvent, solute molecules, and solute ions adsorbed on the electrode surface) is formed between the first metal particle 108a and the second metal particle 108b, and a state in which gold ions cannot enter the gap is formed. Therefore, if distance between the first metal particle 108a and the second metal particle 108b becomes narrow, the plating does not proceed. That is, by using a diffusion-controlled reaction system, the self-terminating function can be operated to control the gap interval.

Each of the first metal particle 108a and the second metal particle 108b is formed in a hemispherical shape on the surface of each of the first electrode layer 106a and the second electrode layer 106b. The width from one end to the other end of the first metal particle 108a and the second metal particle 108b having a hemispherical surface is preferably 20 nm or less. The radius of curvature of the first metal particle 108a and the second metal particle 108b is preferably 12 nm or less. The width and the radius of curvature from the end to the other end of the first metal particle 108a and the second metal particle 108b can be controlled by the processing time of the electroless plating.

When the first electrode layer 106a and the second electrode layer 106b are formed of platinum (Pt), gold (Au) precipitated by reduction on the platinum (Pt) surface is metallurgically bonded to platinum (Pt). As a result, gold (Au) is grown on the platinum (Pt) surface such that transverse direction is suppressed from diffusing and a spherical surface is formed on the platinum (Pt) surface.

As described above, by performing electroless gold plating on platinum (Pt) surfaces, which are not frequently used in the related art, as shown in FIG. 8C, the nanogap electrodes 102 in which the first metal particle 108a and the second metal particle 108b are close to each other and arranged with a gap therebetween are manufactured. Since the first metal particle 108a and the first electrode layer 106a, and the second metal particle 108b and the second electrode layer 106b are substantially metal bonded to each other with gold (Au) and platinum (Pt), the first metal particle 108 are stably disposed on the surface of the first electrode layer 106b, and the second metal particle 108b are stably disposed on the surface of the second electrode layer 106b.

3-2-2 Principle of Electroless Plating

As the electroless plating solution used in the present embodiment, a solution obtained by dissolving a gold foil in an iodine tincture solution (a solution obtained by dissolving $I_2$ and $KI^{2-}$ in an ethanol solvent) is used. When such an electroless plating solution is used, it is possible to perform autocatalytic type electroless gold plating using a chemical reaction by the saturation state of gold.

The principle of this electroless plating is as follows. Gold dissolved in iodine tincture becomes saturated and the following equilibrium occurs.

$$2Au + I_3^- + I^- \leftrightarrow 2[AuI_2]^- \tag{2}$$

$$[AuI_2]^- + I_3^- \leftrightarrow [AuI_4]^- \tag{3}$$

The following equilibrium states exist in tincture of iodine solution.

$$2KI + I_2 \leftrightarrow 2K^+ + I_3^- + I^- \tag{4}$$

Equation (4) is an endothermic reaction, and the equilibrium tilts to the right by heating the solution. Then, iodine ions ($I^-$, $I_3^-$) are generated, and a tri-valued gold ion ($Au^{3+}$) is generated from the responses of equations (2) and (3). In this condition, by introducing L(+)-ascorbic acid ($C_6H_8O$) as a reducing agent, the ratio of $I^-$ ions is increased by the reduction reactions of the equation (4).

$$C_6H_8O_6 + I_3^- \rightarrow C_6H_6O_6 + 3I^- + 2H^+ \tag{5}$$

When the electrode is immersed in the solution in this reaction, the reaction of equation (2) and equation (3) of the chemical equilibrium is directed toward the reaction on the left side where gold is electroless plated.

Monovalent gold ions (Au+) are reduced to nuclei on the platinum-electrode surfaces. In addition, electroless gold plating of the autocatalytic type progresses on the gold surface as a nucleus. Since L(+)-ascorbic acid is supersaturated in this plate, $I_3^-$ continues to be reduced to $I^-$ and the process is suppressed.

As noted above, in plating baths, two reactions take place competitively: nucleated electroless gold plating by reduction of monovalent gold ions ($Au^+$) on platinum surfaces, and electroless gold plating on gold (Au) nuclei.

According to this embodiment, by using the electroless plating method, it is possible to precisely control the length of the gap of the nanogap electrode (gap length). More specifically, by performing electroless gold plating on the platinum (Pt) surface, a nanogap electrode having a gap length of 5 nm or less can be manufactured. In addition, by dissolving non-toxic iodine tincture and gold foil as the electroless plating solution and using L(+)-ascorbic acid ($C_6H_8O$) as the reducing agent, nanogap electrodes can be produced in large quantities at one time at room temperature.

3-2-3 Introduction of Functional Molecules into Nanogap Electrodes

There is no limitation on the method of arranging the functional molecule 110 in the gap of the nanogap electrode 102, but is performed by, for example, a dip method. In the dip method, the functional molecules 110 are dispersed in the solution, and the substrate 118 having the nanogap electrode 102 formed therein is immersed in the solution. It is preferable that the solution in which the functional molecule 110 is dispersed has more than one functional molecule 110 that can cover the entire substrate 118 present. As a result, the functional molecule 110 can be reliably disposed in the gaps between the nanogap electrodes 102.

Thereafter, the substrate 118 is removed from the solution in which the functional molecule 110 are dispersed and dried, thereby completing the single-molecule transistor 100 as shown in FIG. 6A, FIG. 6B, and FIG. 6C.

As described above, according to the present embodiment, it is possible to realize a nano-device in which a nano-gap electrode having a gap with a length of several nanometers is used and a single functional molecule is arranged in the gap. By using a π-conjugated molecule having rigidity as the functional molecule, a transistor capable of causing a quantum effect and allowing a resonance tunneling current to flow can be realized.

Example 1

4 Manufacturing Example of a Monomolecular Transistor

A manufacturing example of a single-molecule transistor is described below. The monomolecular transistor manufactured in this example has a structure similar to that of the monomolecular transistor described in FIG. 6A, FIG. 6B, and FIG. 6C.

4-1 Fabrication of Nanogap Electrodes

The step of fabricating the nanogap electrode includes a step of fabricating a platinum electrode as the first electrode layer 106a and the second electrode layer 106b, and a step of growing gold particles on the platinum electrode as the first metal particle 108a and the second metal particle 108b by electroless gold plating.

4-1-1 Fabrication of Platinum Electrodes

As a substrate for manufacturing platinum electrodes, a silicon wafer having a silicon oxide film formed on its surfaces was used. The substrate was cleaned by ultrasonic cleaning using acetone, ethanol, ultraviolet (UV) ozonation, or the like to form a clean surface.

An electron-beam resist solution (a resist solution obtained by mixing ZEP-520A (Nippon Zeon Corporation) and ZEP-A (Nippon Zeon Corporation)) was applied to the surface of substrate (the surface of the silicon oxide film) by a spinner to form a resist film, and then a prebake was performed. The substrate on which the resist film was formed was set in an electron-beam lithography device (ELS-7500EX manufactured by ELIONIX), and electron beam lithography was performed on the resist film to form a resist film on which patterns for forming electrodes were formed. After that, development treatment was performed to form a resist pattern in which the drawn portions (portions corresponding to the electrode patterns) were in opening with each other.

Next, a titanium (Ti) film was formed on the patterned resist film using an electron-beam evaporation device (E-400EBS manufactured by Shimadzu Corporation), and a platinum (Pt) film was further formed on the titanium (Ti) film. The titanium (Ti) film was formed to improve the adhesion of the platinum (Pt) film. The thickness of the titanium (Ti) film was 3 nm, and the thickness of the platinum (Pt) film was 10 nm.

The patterned resist film was peeled off by bubbling substrate on which the titanium (Ti) film and the platinum (Pt) film were laminated, immersed in a peeling solution (ZDMAC (manufactured by Zeon Corporation)) and allowed to stand. The metal layer in which the titanium (Ti) film and the platinum (Pt) film were laminated was lifted off together with peeling of the resist film. As a result, metal layers remained in portions of opening patterns of the resist film, and other portions were peeled off and removed together with the resist film. In this way, a platinum electrode (more precisely, an electrode with a stack of titanium/platinum) was fabricated on substrate.

4-1-2 Electroless Gold Plating

Gold (Au) particles were formed on the platinum electrode. The gold (Au) particles were formed on the platinum electrode by electroless gold plating. In performing the electroless gold plating, an electroless plating solution was prepared, and thereafter, a plating treatment was performed.

4-1-2-1 Preparation of Electroless Gold Plating Solution

A 99.99% pure gold (Au) foil was placed in a container, and iodine tincture was added and stirred, followed by standing. In addition, L(+)-ascorbic acid ($C_6H_8O$) was added, and the mixture was allowed to stand after being heated. The solution allowed to stand was separated in a centrifuge. The supernatant of the solution after centrifugation was collected, heated in addition to another container containing L(+)-ascorbic acid ($C_6H_8O$), and agitated. Thereafter, an iodine tincture solution containing gold (Au) used for electroless plating was prepared by standing.

4-1-2-2 Electroless Gold Plating

Before the electroless gold plating was performed, the platinum electrode was cleaned. The cleaning was carried out by acetone and ethanol. After cleaning, the surface was dried with nitrogen blow, and the organic matter on the surface was removed by UV-ozone treatment.

The pretreatment of the electroless gold plating was carried out. As a pretreatment of platinum (Pt) electrodes, the surface was treated with acid.

An iodine tincture solution containing ultrapure water and gold (Au) was placed in the plating bath to adjust the density of the electroless plating solution. To the plating bath, 8 mL of ultrapure water was added to 8 µL of an iodine tincture solution containing gold (Au). The platinum-electrode-formed substrate was immersed for 10 seconds. The substrate removed from the plating bath was rinsed with ultrapure water followed by sequential boiling with ethanol and acetone. The substrate was then dried by blowing.

4-1-3 Introduction of Functional Molecules into Nanogap Electrodes

The substrate 118 on which the nanogap electrodes 102 were formed was cleaned. The cleaning was carried out by boiling with acetone and ethanol and oxygen plasma treatment.

As the functional molecules, carbon cross-linked oligophenylene vinylene (COPV5(SH)$_2$) whose terminal was substituted with a thiol group was used. Since COPV5(SH)$_2$ is soluble in toluene, toluene was used as a solvent in this example. A toluene solution was prepared by melting 50 µM of COPV5(SH)$_2$, and substrate was immersed in the solution where a nanogap $_2$ was formed. Specifically, substrate on which the nanogap electrodes were formed was impregnated in a toluene solution containing COPV5(SH)$_2$ at room temperature for 4 hours. Thereafter, substrate removed from the solution was dried by nitrogen-blowing.

Figure 9A:
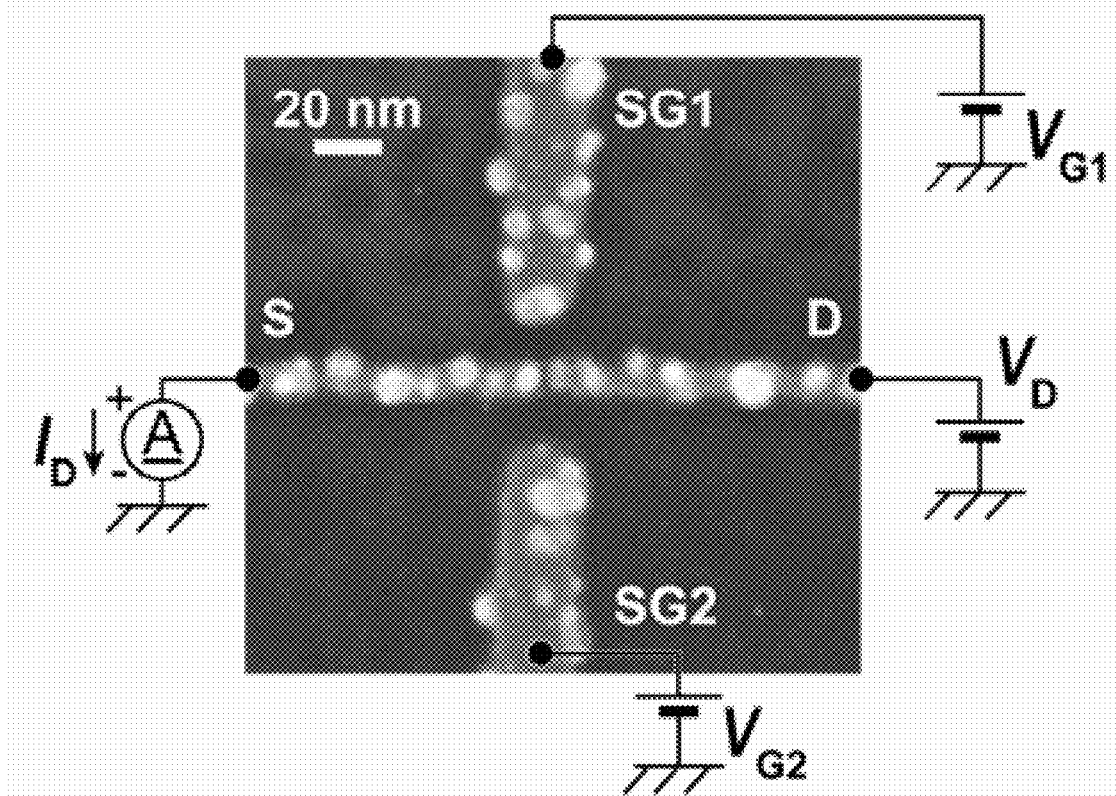
FIG. 9A shows a SEM-image of a monomolecular transistor fabricated in the examples.

Through the above steps, a single-molecule transistor was fabricated. FIG. 9A shows an SEM image of a monomolecular transistor manufactured according to this example. FIG. 9A shows a structure in which a gap is formed by the first electrode (S) and the second electrode (D), and the third electrode (SG1) and the fourth electrode (SG2) are provided as gate electrode.

Figure 9B:
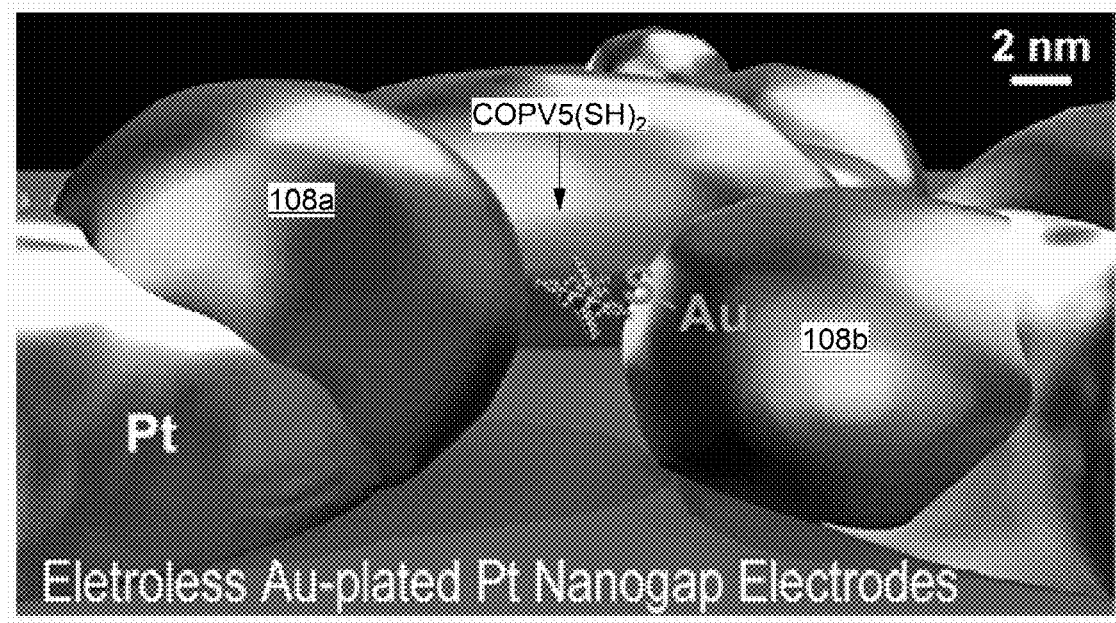
FIG. 9B shows a schematic diagram showing the arrangement of a single molecule in the gap between nanogap electrodes in a single molecule transistor.

FIG. 9B is a conceptual diagram showing a condition in which COPV5(SH)$_2$ is disposed in a gap between the nanogap electrodes 102. COPV5(SH)$_2$ is disposed in a gap between the first metal particle 108a and the second metal particle 108b having hemispherical surfaces. The sulfur (S) at one end of COPV5(SH)$_2$ forms a chemical bond with the gold (Au) of the metal particle 108. The other end shows a state in which SH bonds remain and are free from the metal particle 108. Since the sulfur (S) and the gold (Au) are bonded stably, COPV5(SH)$_2$ is disposed so that one end and the other end cross-link the first metal particle 108a and the second metal particle 108b.

5 Characteristics of Single-Molecular Transistors (COPV5(SH)$_2$)

Next, electric characteristics of the single-molecule transistor manufactured in this example are described. Incidentally, the monomolecular transistor, as shown in FIG. 9A, one of the nanogap electrodes was used as the source electrode and the other as drain electrode. COPV5(SH)$_2$ was disposed between the nanogap electrodes, and a gate voltage was applied by the gate electrode arranged so as to sandwich the gap between the nanogap electrodes.

5-1 Drain Current Versus Drain Voltage Characteristics (Id-Vd Characteristics)

Figure 10:
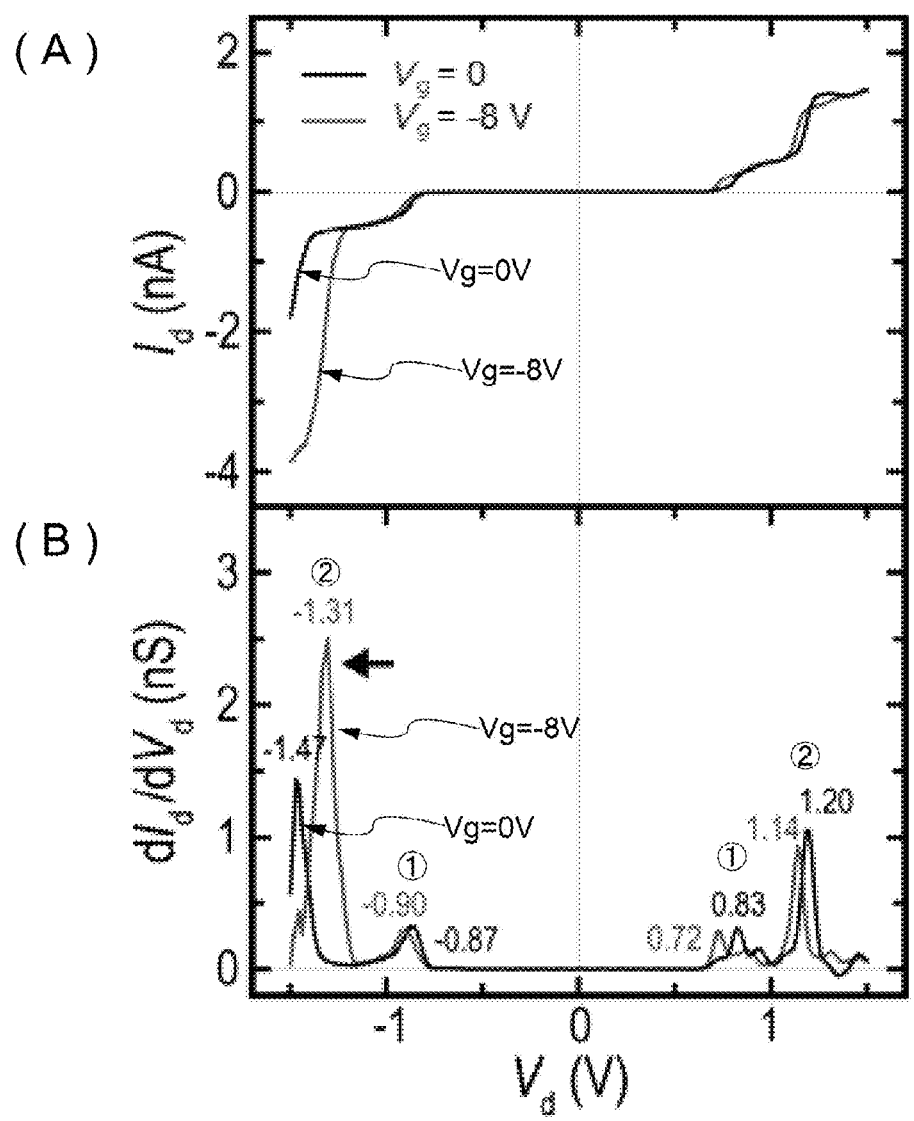
FIG. 10 shows the electrical characteristics of the monomolecular transistor fabricated in example, (A) shows the drain current (Id) versus drain voltage (Vd) characteristics, and (B) shows a graph showing the differential conductance characteristics.

FIG. 10 shows the electrical characteristics of the monomolecular transistor, graph (A) shows the drain current (Id) versus drain voltage (Vd) characteristics, graph (B) shows the differential conductance characteristics.

Drain current (Id) versus drain voltage (Vd) characteristics were measured when the measured temperature was taken as a 9 K and the gate voltage (Vg) was taken as 0 V and 8 V. In FIG. 10, as is clear from the characteristics shown in the graph (A), asymmetric characteristics were observed in which the drain voltage (Vd) differed between the positive side and the negative side of the manufactured single-molecule transistor. Especially, when the drain voltage (Vd) is the negative side, the characteristic that the current value increases remarkably is observed. This asymmetric current-voltage property was observed as a further large change when the gate-voltage (Vg) was taken as 8 V. In the case of current-voltage characteristics due to the single-electron effect, since the current changes at the positive and negative sides become symmetrical characteristics, this operation was considered to generate electric conductivity through effects other than the single-electron effect.

The graph (B) of shown in FIG. 10 shows a differential conductance characteristic, and four conductance peaks, two on the plus side and two on the minus side of the drain voltage (Vd), were confirmed. Although the peak position differs depending on the gate voltage, the peak appearing in region drain voltage (Vd) is less than 1 V as the first peak of the positive side, the peak appearing in region of 1.1 V or more as the second peak of the positive side, indicated by rounded numerals, respectively. Also in region where the drain voltage (Vd) is the negative side, similarly, the first peak of the negative side a peak appearing in region of less than −1 V, the peak appearing in region of −1 V or more as a second peak of the negative side It is indicated by rounded numbers.

It was observed that the positions of the first peak on the positive side, the second peak, and the first peak and the second peak on the negative side were changed by applying the gate voltage Vg, and the respective peaks were shifted. When a −8 V was applied as the gate voltage (Vg), a change was observed in which the peak positions of the three peaks (the first peak on the positive side, the second peak, and the first peak on the negative side) shifted to the negative side, and the peak position of only the second peak on the negative side shifted from −1.47 V to −1.31 V to the positive side. It was observed that the absolute value of the shift amount of the peak position toward the positive side was larger than the absolute value of the shift amounts of the other three peaks, and significantly changed.

Figure 11:
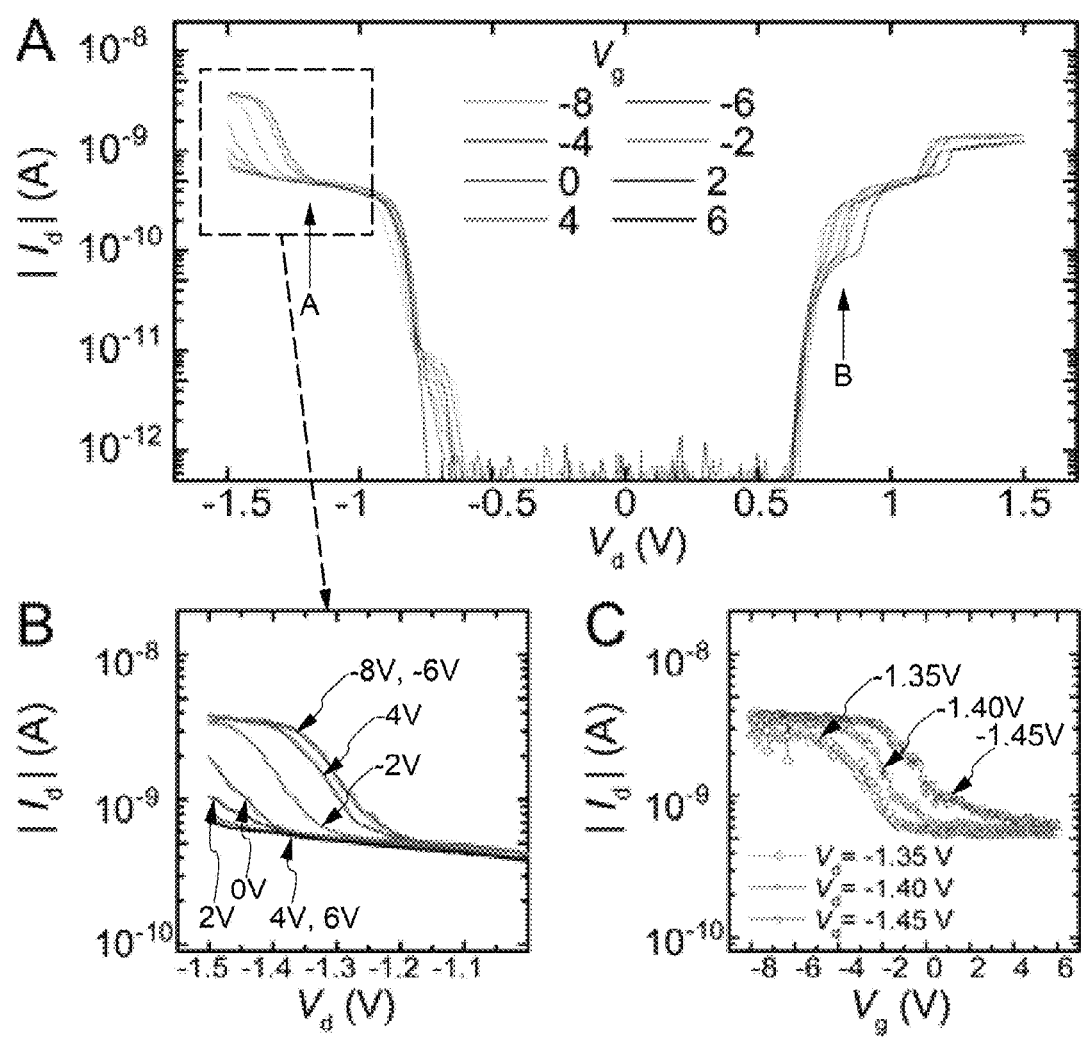
FIG. 11 shows the properties when the gate voltage (Vg) of the monomolecular transistor fabricated in the embodiment is varied with 0 V, 2 V, 4 V, 6 V, −2 V, −4 V, −6 V, −8 V.

FIG. 11 shows the properties of a monomolecular transistor when the gate-voltage (Vg) is applied with 0 V, 2 V, 4 V, 6 V, −2 V, −4 V, −6 V, −8 V. In FIG. 11, graph A shows the drain current (Id) versus drain voltage (Vd) characteristics, graph B shows a partially enlarged view thereof, graph C shows the transfer curve.

As shown in the graph A of FIG. 11, as the gate voltage (Vg) increases to the negative side, the drain voltage (Vd) from the vicinity of −1.3 V drain current (Id) is rapidly increased is observed (see arrow A). In addition, when the drain voltage (Vd) is around +0.8 V, a tendency has been observed that the kink state is changing at the rise of the drain current (Id) (reference arrow B). The value of the drain voltage (Vd) at which the value of the drain current (Id) changes are changed by the gate voltage (Vg). The first peak on the negative side shifts to the negative side as the gate voltage (Vg) increases, and the other peaks shift to the positive side as the gate voltage (Vg) increases.

As shown in the graph B of FIG. 11, shows an enlarged view of the drain current (Id) versus drain voltage (Vd) characteristics. It has been observed that the drain current (Id) which varies with the gate voltage (Vg), tends to rise from around −1.2 V in the drain voltage (Vd). Due to the change of the drain voltage (Vd), the drain current (Id) increases from $4 \times 10^{-10}$ A to $3 \times 10^{-9}$ A, and a tendency of saturation is observed. The graph B of FIG. 11 shows that the monomolecular transistor can perform a switching operation by sweeping a gate voltage (Vg) in this range.

In FIG. 11, the characteristics shown in the graph C show the drain current (|Id|) versus the gate voltage (Vg) characteristics at drain voltages (Vd) of −1.35 V, −1.40 V, and −1.45 V. This characteristic is used as a transfer curve in transistors. In the characteristic shown in the graph C, the drain current (|Id|) changes with the change of the gate voltage (Vg) at three voltage levels of −1.35 V, −1.40 V, and −1.45 V of the drain voltage (Vd). In the case of single electron transistors, since coulomb oscillation occurs, the behavior of the drain current (Id) is saturated is difficult to think. Further, since the field effect transistor is a mechanism for controlling the depth of the channel region by the gate voltage, it is impossible to explain the characteristic that the drain current (|Id|) is saturated in a region where the gate voltage (Vg) is negative and the drain current becomes a constant value in a positive region.

For coherent resonant tunneling, the drain current (Id) is proportional to the integration of the overlap of the wave functions from the Fermi level to the vacuum level of the source-electrode and drain electrode. Molecular orbitals formed by molecules have discrete energy levels, unlike energy band structures in semiconductors. When a drain voltage is applied to a monomolecular transistor and the Fermi level of the source electrode and drain electrode approaches a certain energy level of the molecule, the slope of the current-voltage characteristic becomes equal to the conductance of the electrode-molecule junction, and the current value starts to increase.

Furthermore, the drain voltage (Vd) is increased, and the conductance increases further when the Fermi level approaches the next energy level. The drain current (Id) can be modulated by changing the energy level by the gate voltage. Such drain current (Id) is determined to be due to the resonant tunneling current.

Here, if the Fermi level of the source electrode and the drain electrode is kept constant, it is possible to modulate the energy level of the molecule in the energy direction between the two region drain current (Id) is saturated by changing the gate voltage. The transfer properties shown in the graph C in FIG. 11 are considered to be electric conductivity using this coherent resonant tunneling operation. The on/off ratio (ON/OFF ratio) in the drawing is about 5.5.

The above results reveal that the device manufactured using $COPV5(SH)_2$ in this example is a transistor that modulates the resonant tunneling current with the gate voltage. That is, it has been clarified that the element manufactured in this example is a single molecule resonance tunneling transistor.

5-2 Drain Voltage Versus Gate Voltage (Vd-Vg Characteristic)

Figure 12:
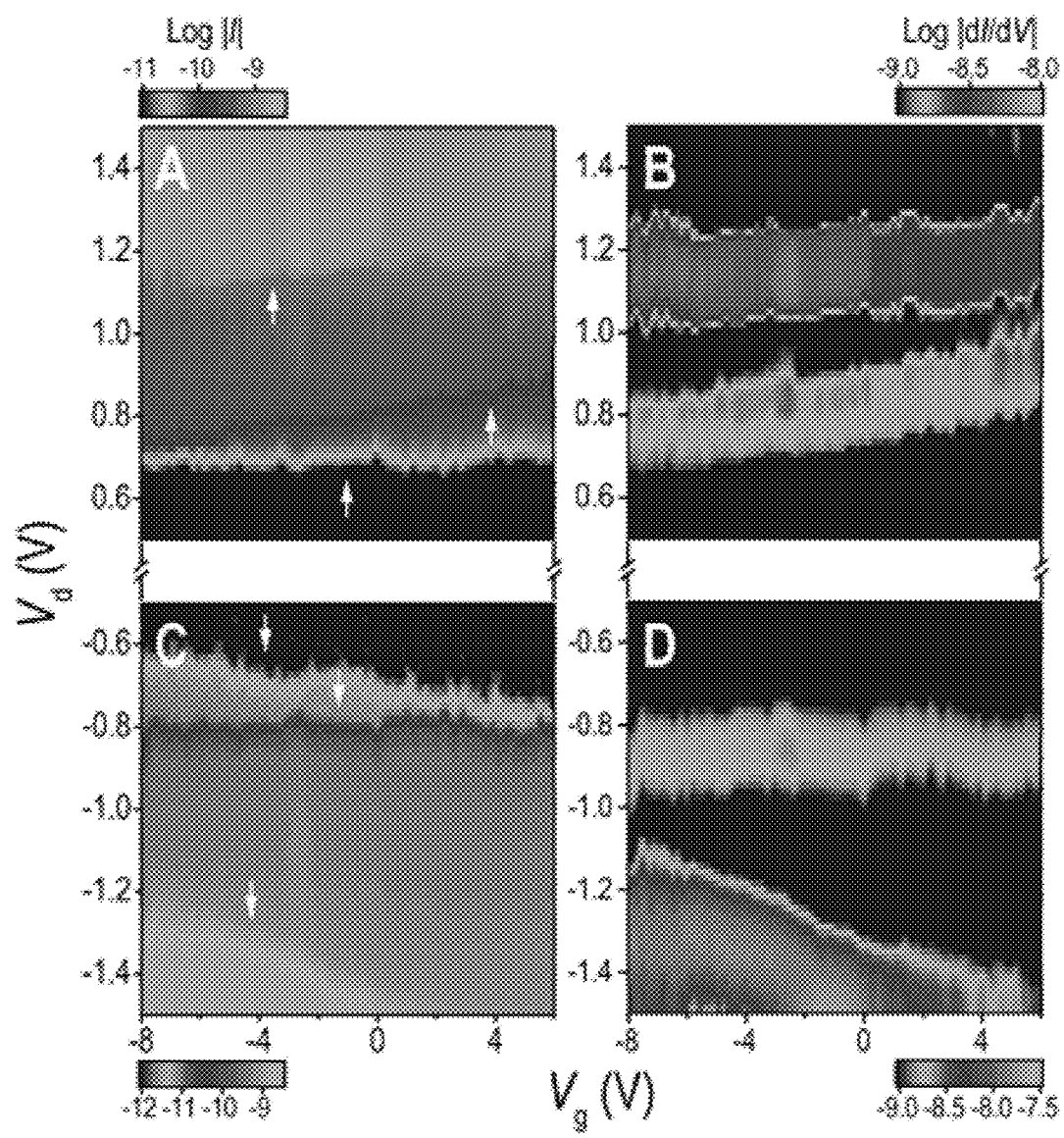
FIG. 12 shows a two-dimensional plot of the drain voltage (Vd) versus gate voltage (Vg) characteristics of the monomolecular transistor fabricated in the example.

FIG. 12 shows a two-dimensional plot of the drain voltage (Vd) versus gate voltage (Vg) characteristics of the drain current flowing in a monomolecular transistor, graph A shows the Log |Id| characteristics (Vd=0.5 to −1.5 V), graph B shows the logarithmic differential conductance characteristics of the graph A, graph C shows the Log |Id| characteristics (Vd=−0.5 to −1.5 V), and graph D shows the logarithmic differential conductance characteristics of the graph C.

In FIG. 12, from the characteristics shown in the graphs A and the graph C, a change in the drain current (Id) was observed both when the drain voltage (Vd) was positive and when it was negative, and the change was observed in a characteristic that the drain current (Id) was saturated with an increase in the drain voltage (Vd). From the characteristics shown in the graphs B and the graph D, the respective first conductance peaks observed on the positive side and the negative side of the drain voltage (Vd) showed the same value for the change of the gate voltage (Vg), and the second conductance peak observed on the negative side was clearly confirmed. From this result, it was shown that it was possible to modulate the drain current by applying the gate voltage to the monomolecular transistor.

5-3 Study of Coulomb Blocked Phenomena in Single-Molecular Wire Transistors

Figure 13:
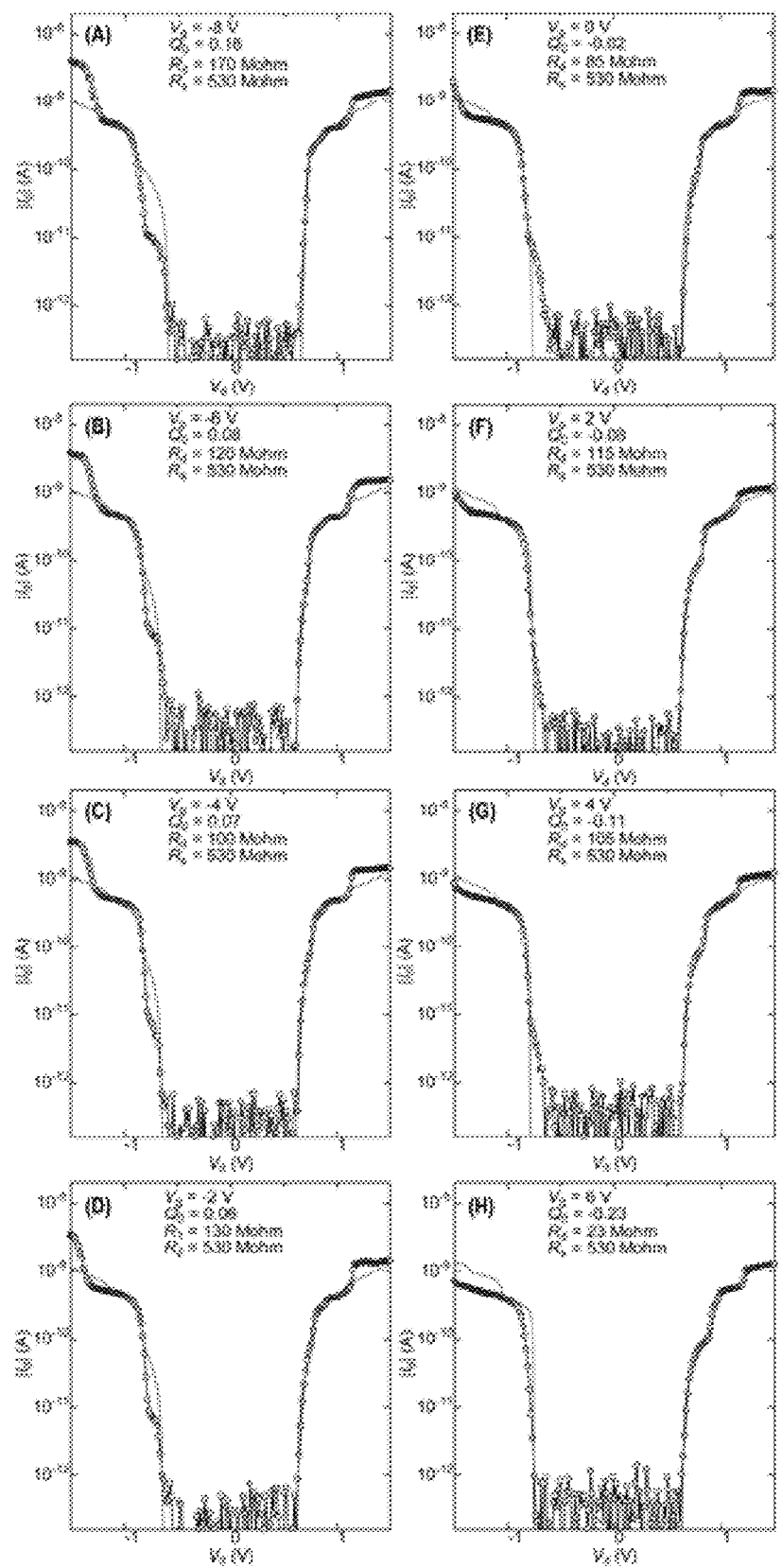
FIG. 13 shows the comparison results between theoretical analysis results and experimental results using an orthodox model in a single-electron transistor.

FIG. 13 shows the comparison result between the theoretical analysis result and the experimental result using the orthodox model (A. E Hanna and M. Tinkham, Phys. Rev. B, 44, 5919, 1991) in the single-electron transistor. Specifically, it shows a comparison between the theoretical value and the experimental value of the drain current (Id) versus the drain voltage (Vd) characteristics by the orthodox model, showing the fitting results in the case of changing the respective gate voltage (Vg). FIG. 13 shows theoretical values as solid lines, and experimental values as data plotted with circles and solid lines.

In FIG. 13, (A) shows Vg=−8 V; (B) shows Vg=−6 V; (C) shows Vg=−4 V; (D) shows Vg=−2V; (E) shows Vg=−0 V; (F) shows Vg=+2 V; (G) shows Vg=+4 V; (H) shows Vg=+6V.

When the gate voltage (Vg) is −6 V, the rise of the current that occurs at a drain voltage (Vd) of around −1.3 V cannot be fitted by the orthodox model and is considered to occur with another conduction mechanism, i.e., coherent resonant tunneling effect. Looking at the ratios of the tunnel resistance Rd and Rs used for the theoretical value calculation, it can be seen that Rd, which is the tunnel resistance on the drain side, is less than half the value compared to the tunnel resistance Rs on the source side.

If the SH group of $COPV5(SH)_2$ is chemically absorbed into the two-sided modules, it is unlikely that there will be a large gap in the ratio of the tunnel resistance to the left and right. Therefore, the monomolecular transistor prepared in the example, $COPV5(SH)_2$ is chemisorbed on the drain side, one side is electrically conducted from the SH group through the vacuum level, the observed tunneling resistance differences in the ratio is considered to have been produced.

5-4 Temperature Dependence of Monomolecular Transistors

The results of evaluation of temperature characteristics of a monomolecular transistor manufactured under the same conditions as in this example are shown.

5-4-1 Temperature Dependence of Drain Current (Id) Versus Drain Voltage (Vd)

Figure 14:
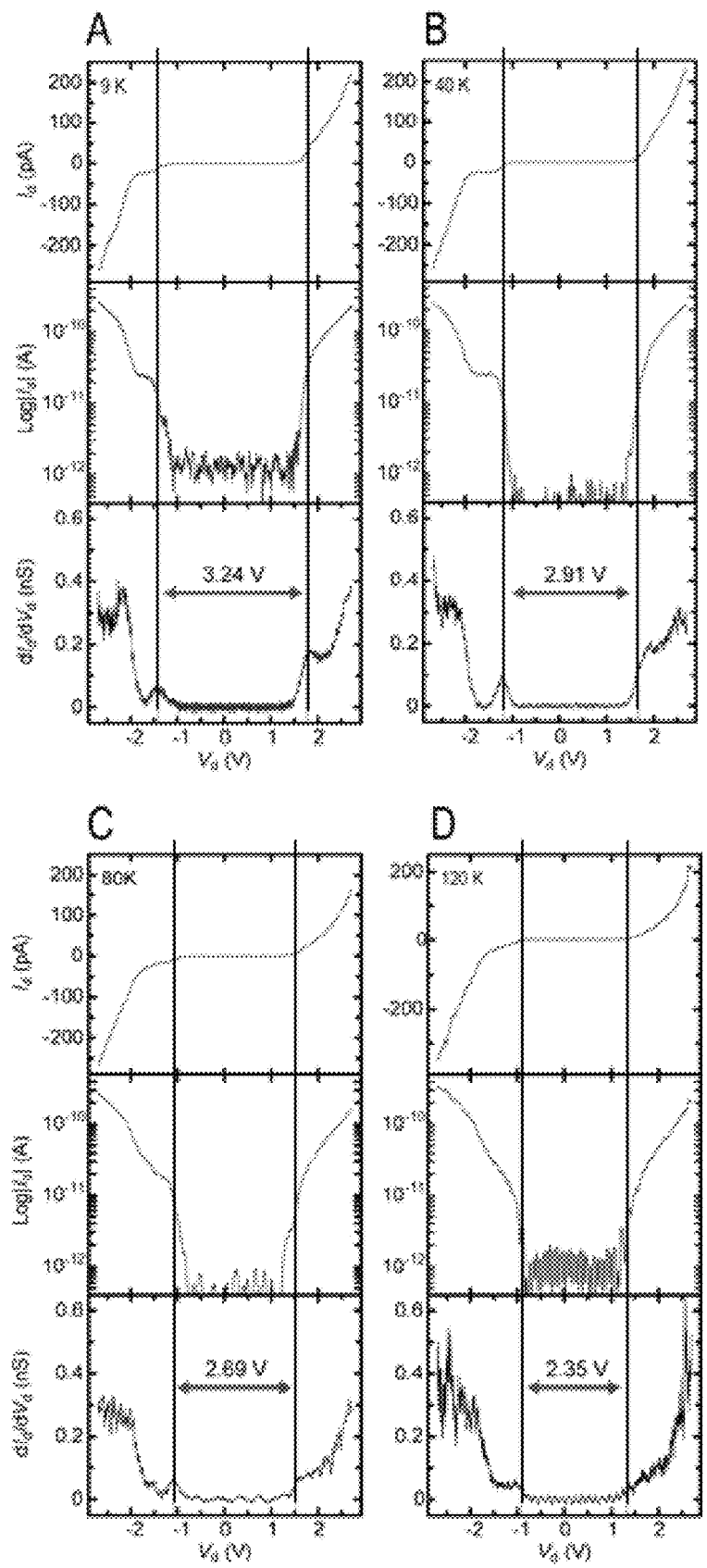
FIG. 14 shows the drain current (Id) versus drain voltage (Vd) characteristics of a monomolecular transistor fabricated in the example.

FIG. 14 is a graph showing the drain current (Id) versus drain voltage (Vd) characteristics of the monomolecular transistor, a graph plotting the drain current (Id) on a logarithmic axis, and a graph of the temperature characteristics of the conductance characteristics. The graph A shows the results of measurements at 9 K, graph B at 40 K, graph C at 80 K, and graph D at 120 K.

The two vertically drawn lines shown in each graph show the positions of the negative and positive drain voltages (Vg) of the first weak conductance peak that begins to flow with increasing drain voltage (Vd). The voltage widths of the conductance peaks are 3.24 V in the temperature 9 K, 2.91 V in the temperature 40 K, 2.69 V in the temperature 80 K, and 2.35 V in the temperature 120 K, and the voltage widths of the conductance peaks change to become narrower as the temperature increases. Further, at a temperature of 120 K, it is difficult to clearly confirm the conductance peak.

These two small conductance peaks are thought to be caused by the single electron effect. However, this conductance peak voltage width is very broad as the width of the current limiting band obtained as the charging energy in a monomolecular transistor. Furthermore, since the voltage width shows a value close to the gap energy of HOMO level and the gap energy of LUMO level of $COPV5(SH)_2$ molecule, it is considered that the single electron effect caused by the molecular orbital occurs.

On the other hand, when the drain voltage (Vd) is positive, the conductance peak weakens, whereas when the drain voltage (Vd) is negative, the conductance peak does not weaken. Therefore, this electric conductivity is considered to be due to coherent resonant tunneling effect.

5-4-2 Temperature Dependence of Drain Voltage (Vd) Versus Gate Voltage (Vg)

FIG. 15 shows a graph of a two-dimensional plot of the drain current (Vd) versus the gate voltage (Vg) to analyze the behavior of a monomolecular transistor upon application of the gate voltage (Vg). In FIG. 15, graph A shows the Log |Id| characteristics (Vd=0.8 to 2.7 V) at 9 K, graph B shows its logarithmic differential conductance characteristics, graph C shows the Log |Id| characteristics (Vd=−0.8 to −2.7 V) at 9K, and graph D shows its logarithmic differential conductance characteristics. Also, graph E shows the Log |Id| characteristics (Vd=0.8 to −2.7 V) at 80 K, graph F shows its logarithmic differential conductance characteristics, graph G shows the Log |Id| characteristics (Vd=−0.8 to −2.7 V) at 80K, and graph H shows its logarithmic differential conductance characteristics.

The graphs A to D shown in FIG. 15 show two-dimensional plots of the drain voltage (Vd) versus gate voltage (Vg) characteristics in 9 K, but the gate modulation effect near the second conductance peak at region where the drain voltage is negative is strongly expressed, while only a gradual change is observed at region of the positive side. However, a large modulation of the drain current (Id) due to the gate voltage (Vg) has been observed at both the positive and negative region in the measurement at 80K shown in the graphs E to H in FIG. 15. In addition, in the graph D, the weaker first peaks that are clearly identified are not identified below Vg=−2 V at 80 K.

Figure 16A:
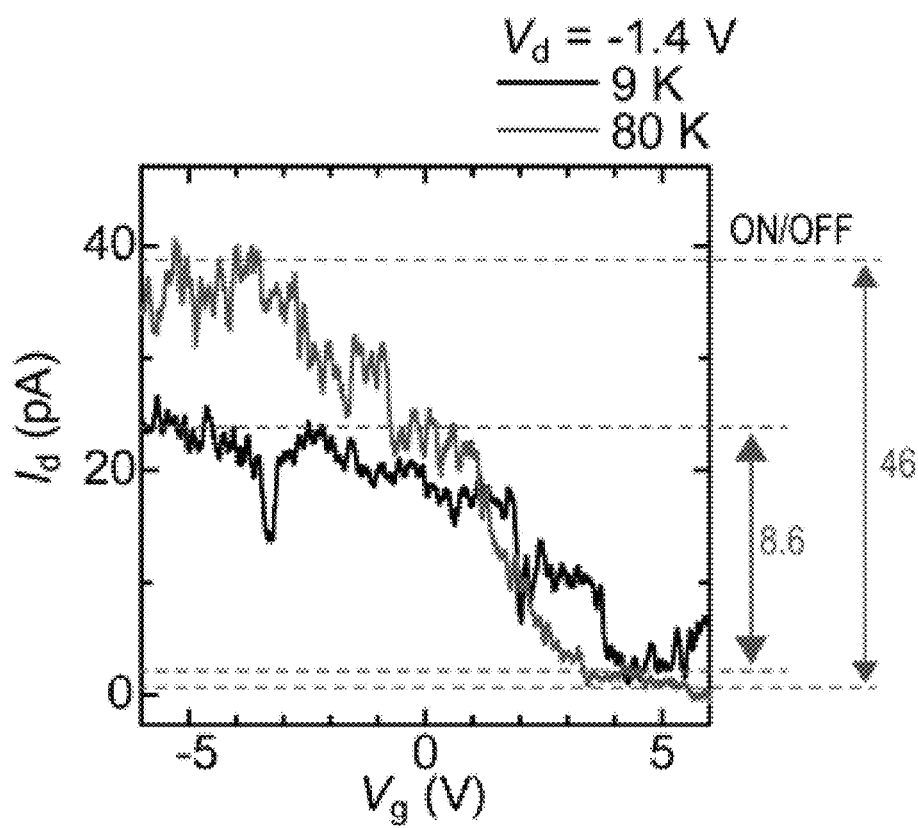
FIG. 16A is a graph showing the transfer characteristics of the monomolecular transistor fabricated in the examples, and shows the temperature dependency (9 K, 80 K) when the drain voltage (Vd) is −1.4 V.
Figure 16B:
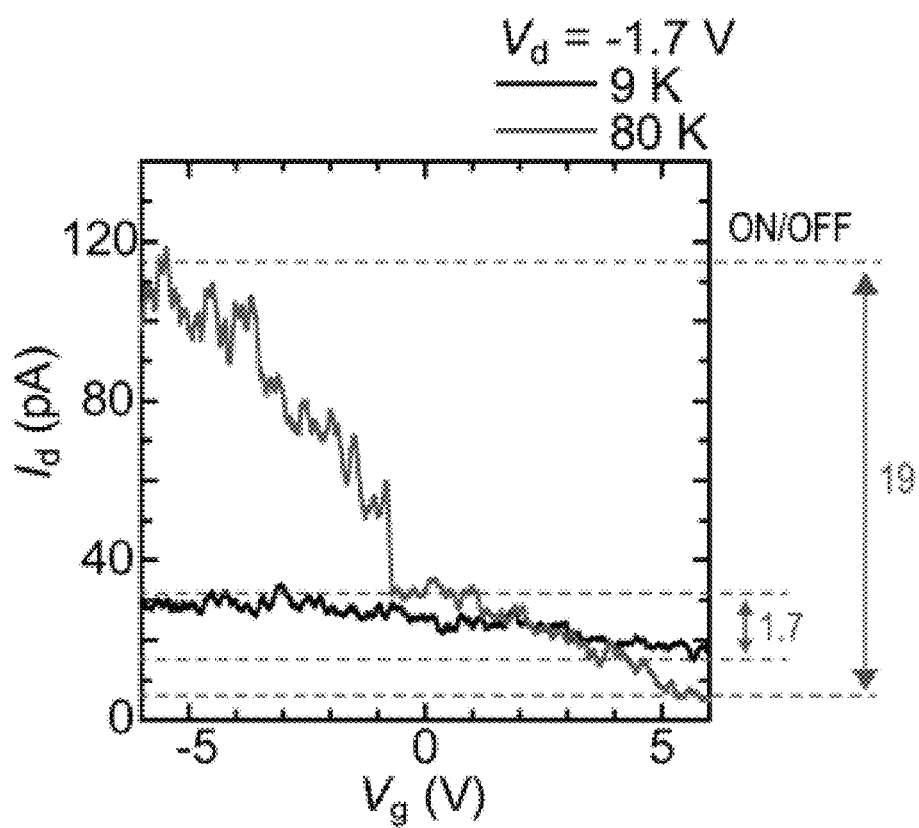
FIG. 16B is a graph showing the transfer characteristics of the monomolecular transistor fabricated in the examples, and shows the temperature dependency (9 K, 80 K) when the drain voltage (Vd) is −1.7 V.

5-4-3 Temperature Dependence of Transfer Characteristics of Monomolecular Transistors FIG. 16A and FIG. 16B show the transfer characteristics of a monomolecular transistor. FIG. 16A shows the temperature dependence (9 K, 80 K) when the drain voltage (Vd) is −1.4 V, and FIG. 16B shows the temperature dependence (9 K, 80 K) when the drain voltage (Vd) is −1.7 V. From FIGS. 16A and 16B, it is observed that the on/off ratio is larger at 80 K than at 9 K condition.

In both cases of 9 K and 80 K of measured temperature, it is observed that the drain current (Id) is changed by the gate voltage (Vg). As shown in FIG. 16 A, at 80 K, the amount of change in the drain current (Id) decreases when Vg=+4 V or more, the on current increases in the region where Vg is lower than 4 V, and the transfer characteristic that the on current and the off current can be clearly distinguished by the change in the gate voltage Vg is obtained. As shown in FIG. 16A, when compared with the on/off ratio, 8.6 was obtained at 9 K, 46 was obtained at 80 K, and the on/off ratio improved with increasing temperatures.

FIG. 16B shows the transfer properties when the drain-voltage (Vd) is −1.7 V. In this characteristic, the change of the drain current (Id) by the gate and the voltage (Vg) is large at 80 K. As inserted in FIG. 16B, the on/off ratio was 1.7 at 9 K, but 19 at 80 K, which is more than 10 times larger. Although the on/off ratio of a transistor manufactured using a semiconductor material tends to decrease as the temperature rises, a peculiar tendency has been observed that the on/off ratio of the monomolecular transistor in this example increases as the temperature rises.

Figure 17:
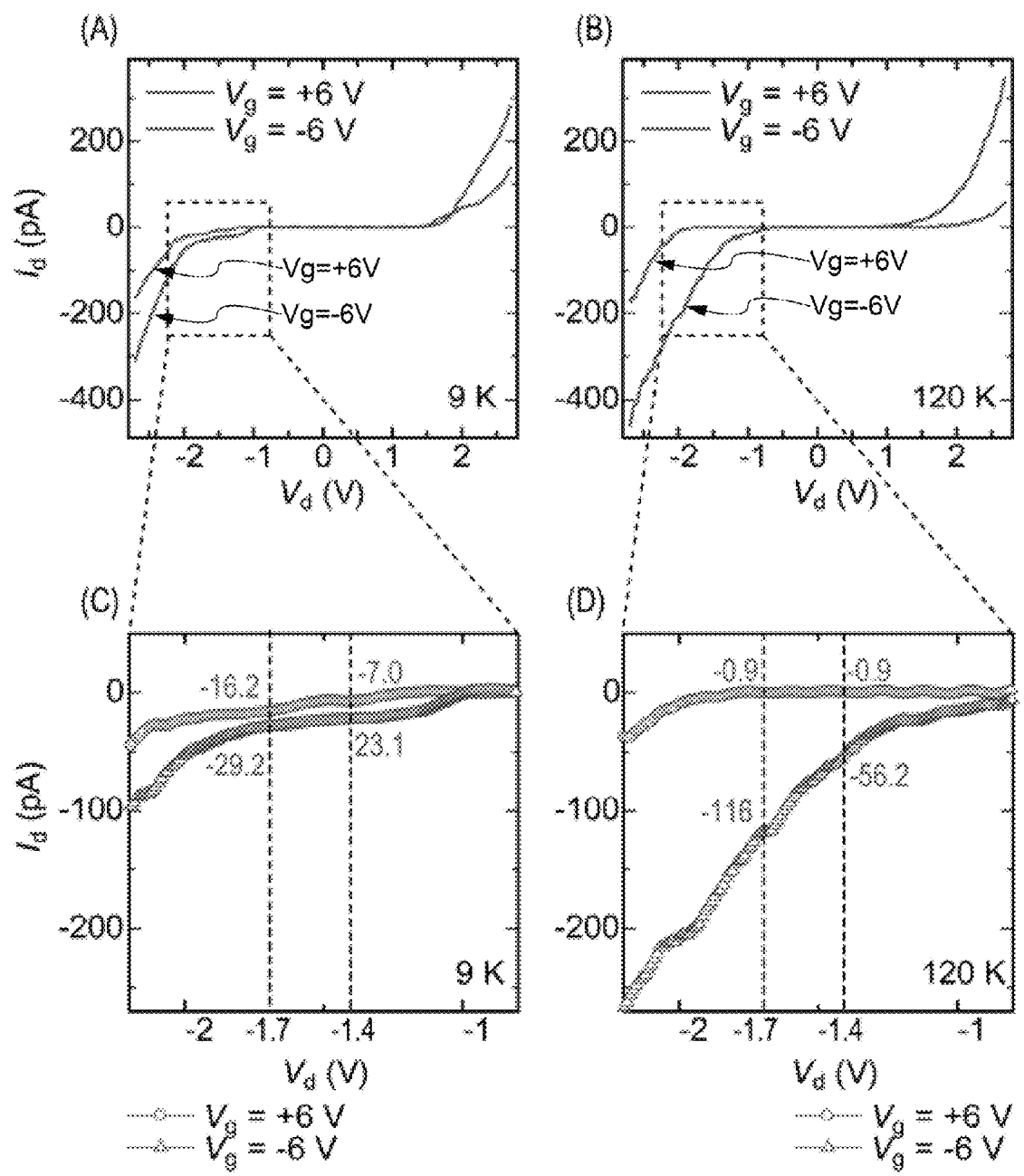
FIG. 17 shows the drain current (Id) versus drain voltage (Vd) properties when +6 V, −6 V is applied to the gate voltage (Vg) of the monomolecular transistor prepared in the embodiment.

FIG. 17 shows the drain current (Id) versus drain voltage (Vd) property when a gate voltage (Vg) is applied in +6 V, −6 V. Graph (A) shows the measurement result of 9 K, and graph (B) shows the measurement result of 120K. Graph (C) shows a partial enlarged view of the graph (A), and graph D shows a partial enlarged view of the graph (B).

As shown in the graph (B), at 120 K, the drain voltage (Vd) is both positive and negative region, the modulation effect due to the gate voltage (Vg) is observed, the drain current (Id) is changed depending on the gate voltage (Vg). Compared to this, in 9 K, the modulating effect by the gate voltage (Vg) is reduced.

In the enlarged views of the graphs (C) and (D), when the on/off ratios are compared assuming that the gate voltage (Vg) is −6 V to be on and +6 V to be off, when the drain voltage (Vd) is 1.4 V, 3.3 is obtained at 9 K, and 63.1 is obtained at 120 K, large on/off ratios are observed. Similarly, when the drain voltage (Vd) is compared at −1.7 V, the on/off ratio is 1.8 at 9 K, while is 124 at 120 K, and the difference due to the temperature is further increased.

The phenomenon that the on/off ratio is increased by the temperature increase cannot be explained by the single electron effect or the field effect, which confirms that the resonance tunneling current flows through the single molecule transistor. One possible mechanism behind the change in transistorized properties due to such temperature rises is that the density of the state of the energy level of COPV5 $(SH)_2$ numerator increases with temperature rises.

Figure 18:
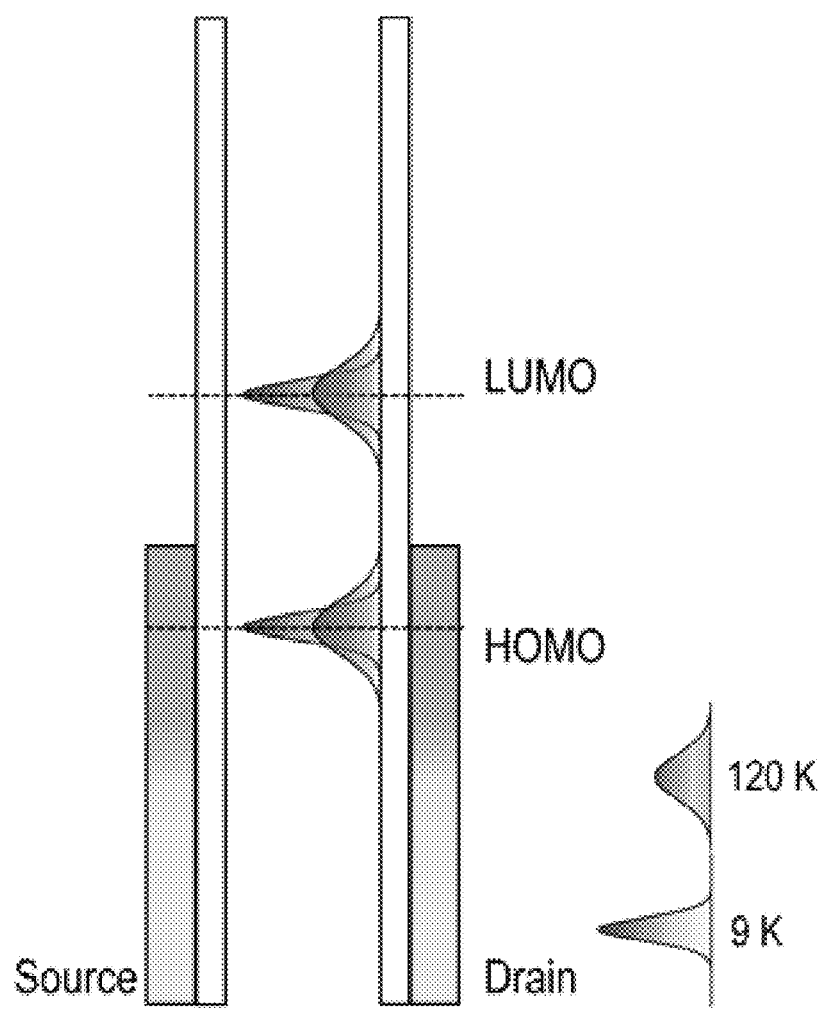
FIG. 18 shows a conceptual diagram of an energy diagram at 9 K and 120 K for a single molecule transistor.

FIG. 18 is a conceptual diagram of 9 K of the single-molecule transistor and an energy diagram of 120 K according to the present example. At 120 K compared to 9 K, by the energy width of the density of states (DOS) function is widened, the degree of freedom of the molecular orbital level is increased, by the width of the level moving in the density of states function is increased, the gate voltage (Vg) the amount of change in the molecular orbital level by is considered to be a cause of this phenomena.

As described above, according to this example, a transistor was manufactured using carbon cross-linked oligophenylene vinylene (COPV5$(SH)_2$) whose terminal was substituted with a thiol group as functional molecules. The coherent resonant tunneling effect was observed in the electric properties of monomolecular transistors with COPV5$(SH)_2$ placed in the gap between the nanogap electrodes. In addition, it was confirmed that the level of the molecular orbital formed by COPV5$(SH)_2$ can be changed by applying the gate voltage. From this result, it was confirmed that a single-molecule resonance tunneling transistor (SMRT2) could be manufactured.

Example 2

This example illustrates the characteristics of a single-molecule transistor using a functional molecule different from that of the example 1. In this example, the structure of the monomolecular transistor is the same as that of the example 1. Preparation of the nanogap electrode was carried out in the same procedure as in the example 1. In this example, carbon cross-linked oligophenylene vinylene (COPV6$(SH)_2$) in which a terminal is substituted with a thiol group was used as the functional molecules. The introduction of the functional molecule into the nanogap electrode was carried out by the same procedure as in the first example.

6-1 Structures of Carbon Cross-Linked Oligophenylene Vinylene (COPV6$(SH)_2$)

The structures of carbon cross-linked oligophenylene vinylene (COPV6$(SH)_2$) substituted with thiol groups at the ends are shown in equation (6).

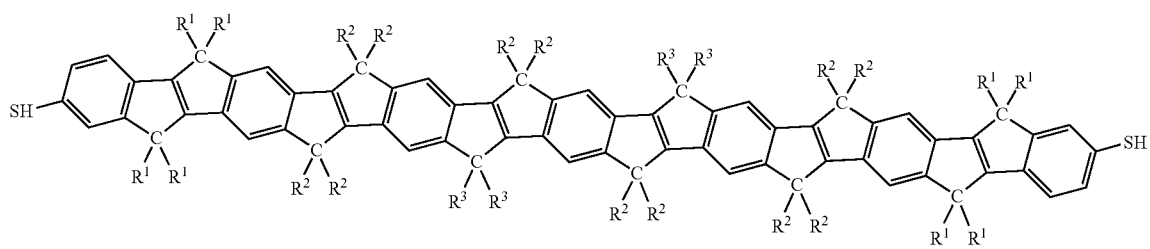

(6)

$R^1$ to $R^3$ may be the same or different. Each $R^1$ to $R^3$ may be the same or a different, optionally substituted aryl group. The aryl group is preferably a hydrocarbon-based aryl group such as a phenyl group or a naphthyl group. Among them, a phenyl group is preferred. The aryl group may have 1 or more substituents. Examples of substituents include alkyl groups of $C_{1-20}$ (preferably $C_{1-15}$ or $C_{1-10}$), alkoxy groups of $C_{1-20}$ (preferably $C_{1-15}$ or $C_{1-10}$), and aryl groups such as phenyl groups. The aryl group as a substituent may also have 1 or more substituents such as the above alkyl group or alkoxy group. In addition, in examples in which $R^1$ to $R^3$ is a phenyl group having a substituent, the bonding position of the substituent is not particularly limited, but it is preferable that the phenyl group is bonded to a para-carbon atom. For example, in equation (6), $R^1$ may be $CH_3$, $R^2$ may be $C_6H_5$, and $R^3$ may be 4-$C_8H_{17}C_6H_4$.

As shown in equation (6), COPV6$(SH)_2$ has a structure in which a carbon cross-linked oligophenylene vinylene (COPV) is used as a unit, six of the units are bonded to each other, and a terminal of the unit is substituted with a thiol group.

6-2 Structure of the Sample

Figure 19:
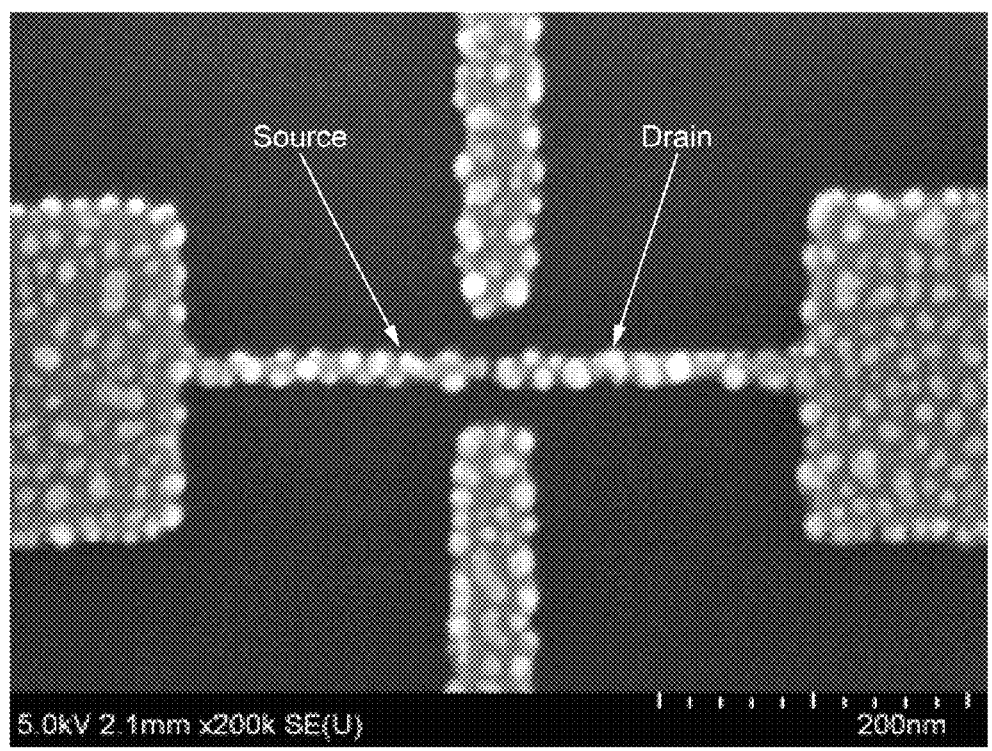
FIG. 19 shows an SEM image of a monomolecular transistor fabricated in the example.

FIG. 19 shows a SEM image in planar view of the sample produced in this example. The gap length (source-drain interval) of the nanogap electrode is 3.8 nm. COPV6 $(SH)_2$ disposed between the electrodes of the nanogap electrode is considered to be chemisorbed with drain electrode at one end (SAu) and free from the source electrode with the SH bond remaining at the other end. This can be discussed from the observation of four conductance peaks attributed to molecular orbitals (HOMO−1, HOMO, LUMO, LUMO−1), as will be detailed hereinafter.

6-3 Drain Current Versus Drain Voltage Characteristics (Id-Vd Characteristics)

Figure 20:
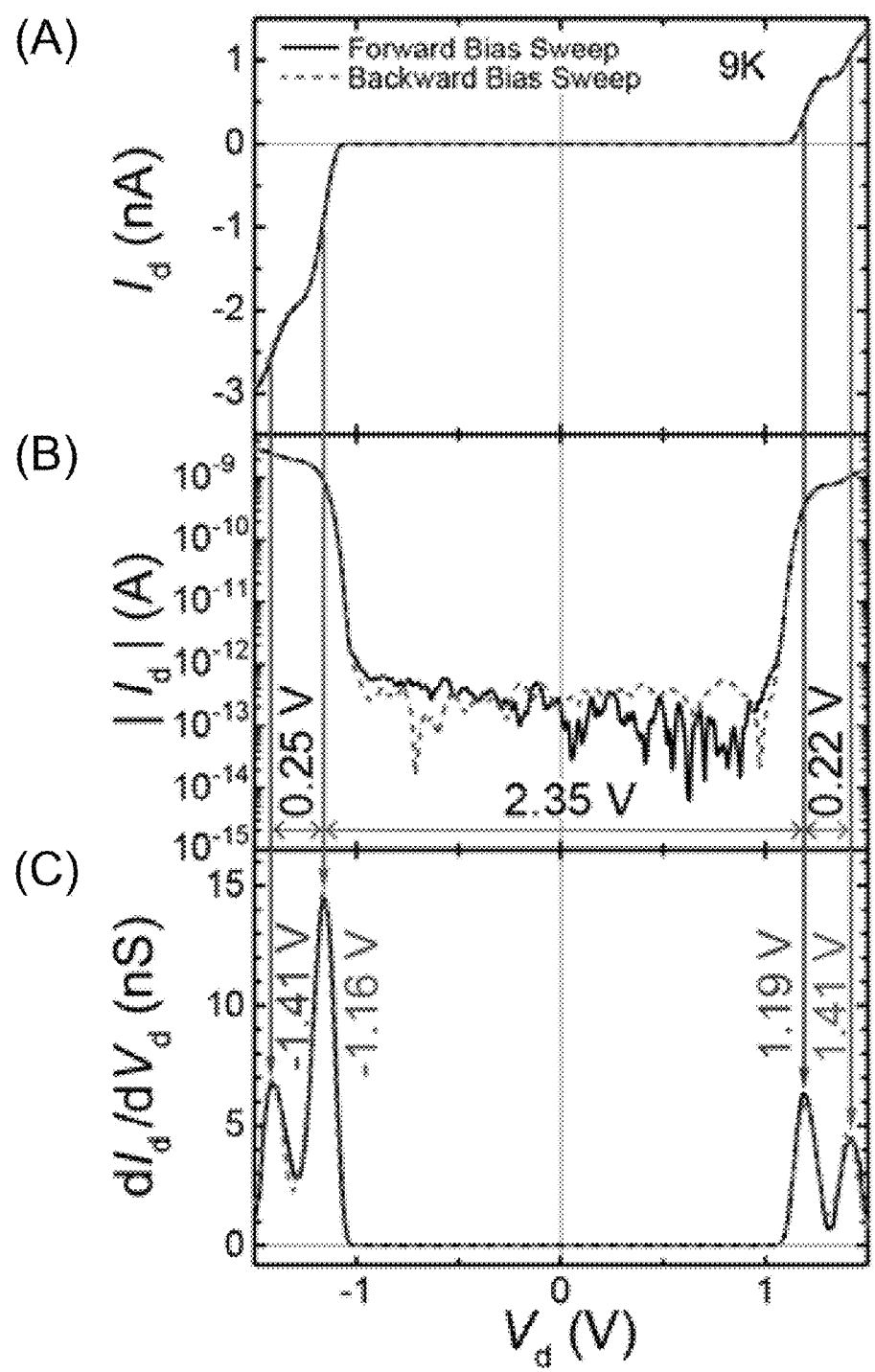
FIG. 20 shows the electrical characteristics of the monomolecular transistor fabricated in example, (A) shows the drain current (Id) versus drain voltage (Vd) characteristics, (B) shows the logarithmic characteristics of the drain current (Id) versus drain voltage (Vd), and (C) shows a graph showing the differential conductance characteristics.

FIG. 20 shows the drain current (Id) versus drain voltage (Vd) characteristics of the monomolecular transistor prepared in this example. In FIG. 20, graph (A) shows the Id characteristic, graph (B) shows the Log |Id| characteristic, and graph (C) shows the logarithmic differential conductance characteristic of the graph (B). Measurements are made in 9 K.

As is apparent from the graphs shown in FIG. 20, the monomolecular transistor produced in this example, when swept drain voltage to −1.5 V to 1.5 V (solid line) and when swept to 1.5 to −1.5V (dotted line), the characteristics of the drain current is consistent, hysteresis-free stable characteristics for both sweeps of the drain bias It has been obtained. As shown in the graph (A) and the graph (B), the bias voltage at which the drain current (Id) hardly flows is in the range of −1.08 to 1.11V. On the other hand, peaks of −1.7 V, −1.55 V, 1.35 V, and 1.7V are observed from the differential conductance as shown in the graph (C). The peaks of these four differential conductance are both values above 4 nS.

Since the drain current (Id) versus drain voltage (Vd) characteristics are about twice as large on the negative voltage side, the two peak voltages on the low voltage side of the differential conductance are −1.55 V and 1.35 V, and they are not symmetrical with respect to Vd=0, it is considered that COPV6 (SH) 2 is chemically adsorbed on the drain side of the monomolecular transistor manufactured in this example, and the one side conducts electricity from the SH group via the vacuum level.

In the differential conductance characteristic shown in the graph (C) of FIG. 20, the difference between the first peak on the negative side (−1.16 V) and the first peak on the positive side (1.19 V) of the drain voltage is 2.35 V, and this value is close to the value of the photoluminescence energy reported as 2.3 eV (Zhu, X.; Tsuji, H.; Navarrete, J. T. L., Casado, J.; Nakamura, E. Carbon-bridged oligo(phenylenevinylene)s: stable π-systems with high responsiveness to doping and excitation. J. Am. Chem. Soc. 2012, 134, 19254).

FIG. 21 shows the molecular orbitals of COPV6(SH)$_2$ calculated using the density functional method. It can be seen that the potential differences between the peaks of −1.7 V, −1.55 V, 1.35 V, and 1.7 V, 0.15 V, 2.9 V, and 0.35 V shown in the differential conductance characteristics (the graph (C) of FIG. 20 correspond to the energy gaps 0.35 eV, 2.74 eV, and 0.29 eV of $E_{HOMO-1}-E_{HOMO}$, $E_{HOMO}-E_{LUMO}$ and $E_{LUMO}-E_{LUMO+1}$, respectively, calculated by the density functional method, as shown in FIG. 21.

6-4 Drain Current Versus Gate Voltage Characteristics (Id-Vg Characteristics)

Figure 22A:
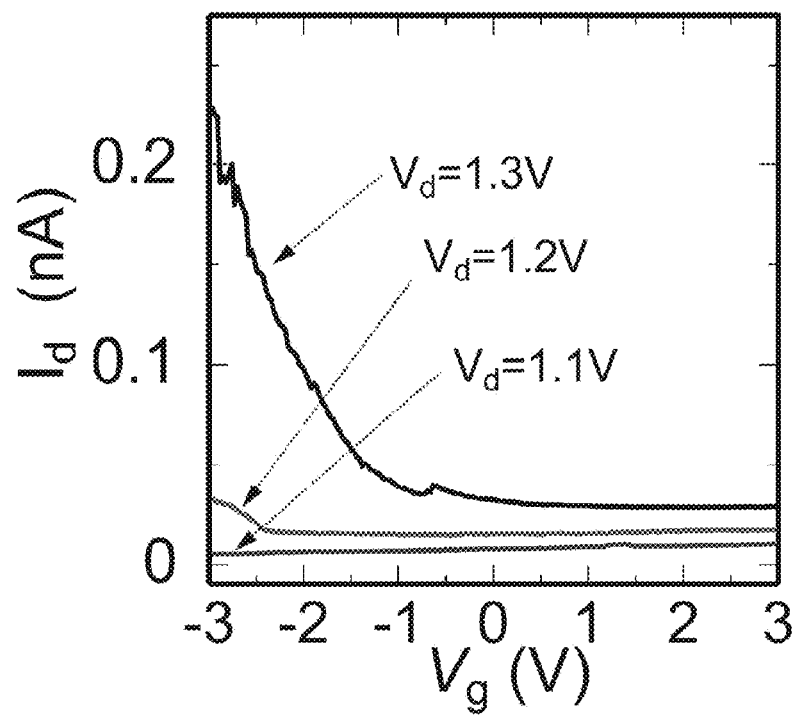
FIG. 22A shows the drain current (Id) versus gate voltage (Vg) characteristics of the monomolecular transistor fabricated in the example.
Figure 22B:
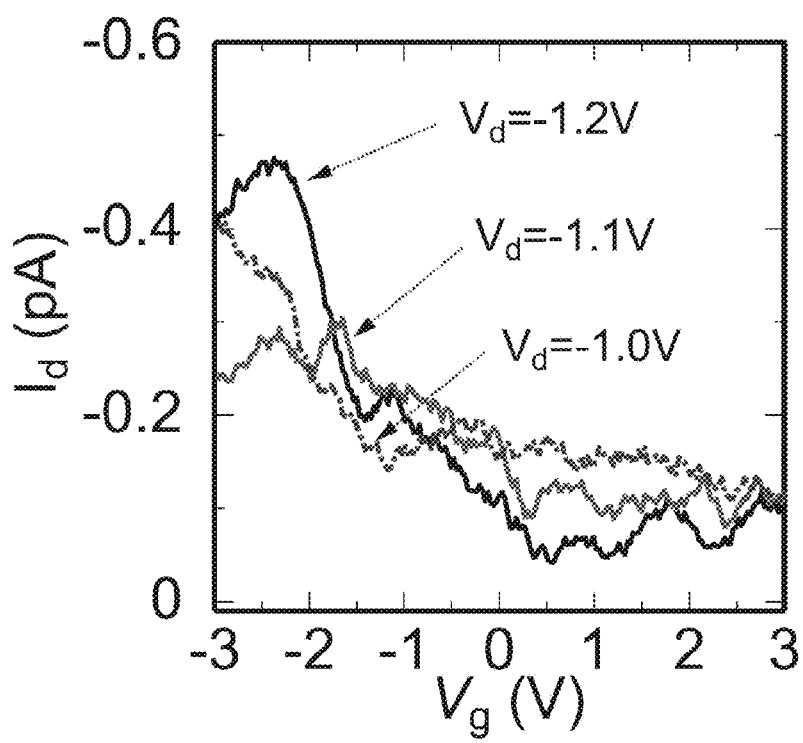
FIG. 22B shows the drain current (Id) versus gate voltage (Vg) characteristics of the monomolecular transistor fabricated in the example.

FIG. 22A and FIG. 22B show drain current (Id) versus gate voltage (Vg) characteristics of the monomolecular transistor manufactured in this example. FIG. 22A shows the characteristics when a positive drain voltage is applied, FIG. 22B shows the characteristics when a negative drain voltage is applied. Incidentally, the structure of the sample, in the structure shown in FIG. 6C, using a silicon wafer as substrate 118, and using this substrate 118 as gate electrode.

From the characteristics shown in FIG. 22A, the value of the drain current is reduced by about one order of magnitude with respect to the graph (A) shown in FIG. 20, and about 200 pA. Such a change in the drain current is considered to be a slight orientation change in COPV6(SH)$_2$ molecules chemisorbed on drain electrode side and liberated on the source electrode side between the gaps of the nanogap electrodes.

In this embodiment, two molecules of COPV6 (SH) have no linker group (FIG. 1, $Y^1$, $Y^2$), and sulfur (S) of the anchor group (FIG. 1, $Z^1$, $Z^2$) is directly chemically bonded (COPV6-S—Au) to gold (Au) of the drain electrode only on one side of COPV6. Therefore, the gold (Au) orbital of drain electrode and the molecular orbital of COPV6 are strongly coupled, and when a drain voltage is applied, the energy level of the molecular orbital is strongly constrained to the Fermi level of the drain voltage, and the potential difference caused by the drain voltage will be mainly applied between the source electrode and COPV6 molecule. When an electrode chemisorbed on one side is a source electrode, a potential difference caused by the drain voltage is mainly applied between drain electrode and COPV6 molecules.

In FIG. 22 (A), positive drain voltage (Vd=1.2 V, 1.3 V) gate modulation of the drain current (Id) is observed, it is observed that operation as a transistor. The fact that the gate modulation is observed at a drain voltage (Vd) of 1.2 V and 1.3 V is considered to be because the Fermi level of drain electrode is shallow relative to the vacuum level by the drain voltage relative to the Fermi level of the source electrode, and further, as the positive drain voltage increases, the overlap of the Fermi level of the source electrode and the density-of-states function of HOMO level increases. Since the drain current (Id) increases when the gate voltage (Vg) is negative, it is considered that the current increases when the density of states of the molecular orbitals contributing to the molecular resonance tunneling phenomena rises upward (closer to the vacuum level) with respect to the Fermi level of drain electrode. When the drain voltage (Vd) is negative, the current value is 1 pA or less, the drain voltage (Vd) is more than 100 times smaller when compared to the case of positive. A tendency is observed that the drain current (Id) increases when the gate voltage (Vg) is negative. In this case, since the current is small, only a slight overlapping tail of the density-of-states function of HOMO level, the molecular resonance tunneling phenomena is not remarkable, relative to the Fermi level of the molecular orbital, the gate voltage (Vg) is negative when going up (close to the vacuum level), it is considered that the drain current (Id) is increased.

Comparing the characteristics of FIG. 22A and FIG. 22B, it can be seen that a monomolecular transistor having a structure in which functional molecules are adsorbed on one side of a nanogap electrode as in the present example has a structure asymmetry and a molecular resonance tunneling current flows asymmetrically with respect to the polarity of the drain voltage (Vd) from the position of the energy level of the molecular orbital with respect to the Fermi level of the adsorbed electrode.

6-5 Gate Voltage Dependence of Differential Conductance Characteristics

Figure 23:
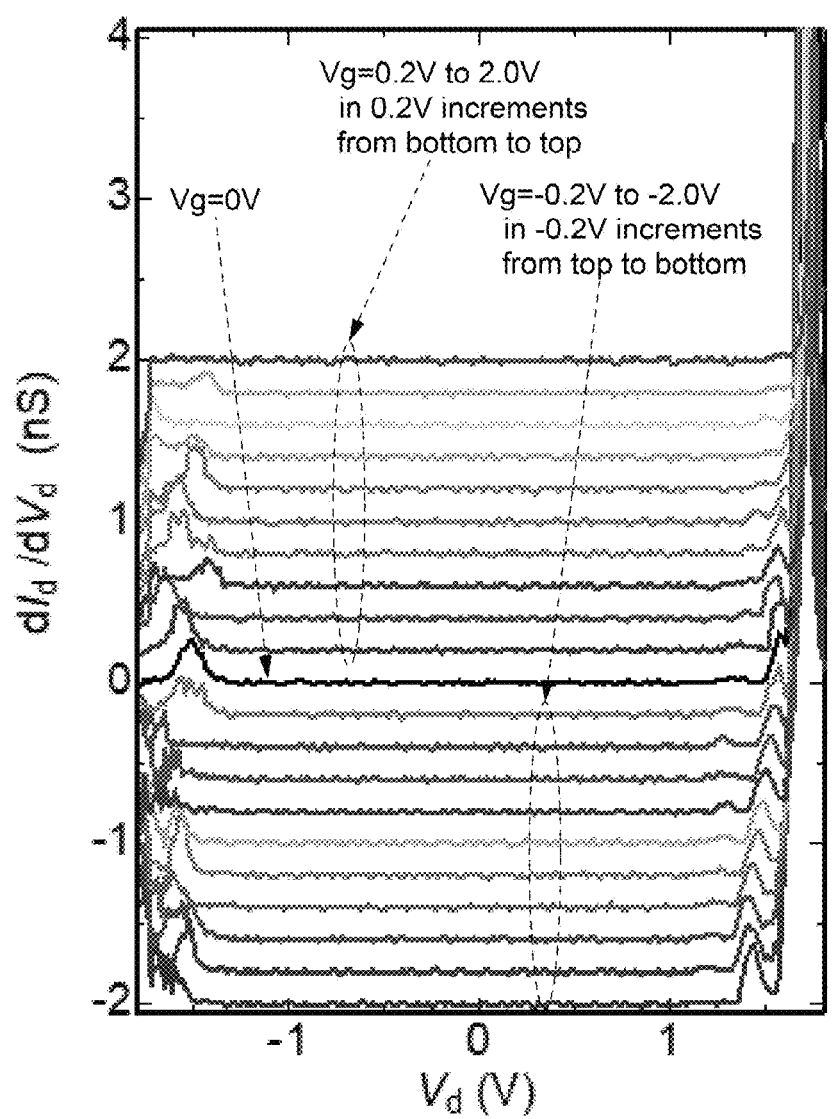
FIG. 23 shows the gate voltage dependence of the differential conductance characteristics of the monomolecular transistor fabricated in the example.

FIG. 23 shows the gate voltage dependence of the differential conductance characteristics. The graphs shown in FIG. 23 show the differential conductance characteristics when the gate voltage (Vg) is 0V, the differential conductance characteristics when the gate voltage (Vg) is increased from 0.2 V to 2.0 V by 0.2 V (Group I), and the differential conductance characteristics when the gate voltage (Vg) is increased from −0.2 V to −2.0 V by −0.2 V (Group II).

As is apparent from the graph shown in FIG. 23, it can be seen that the peak of the differential conductance varies depending on the gate voltage. In particular, the peak voltage Vd of the differential conductance drain voltage (Vd) is positive, when the gate voltage (Vg) is changed from 2 V to −2 V, it can be seen that continuously changed from 1.7 V to 1.4 V. This conductance peak is expressed by the resonance tunneling mechanism through the level of the molecular orbital. This shows that the molecular orbital level of COPV6(SH)$_2$ is modulated by the gate voltage, and the single-molecule transistor is turned operation as a resonant tunneling transistor, and the gate voltage can be modulated.

6-6 Room Temperature Characteristics

Figure 24:
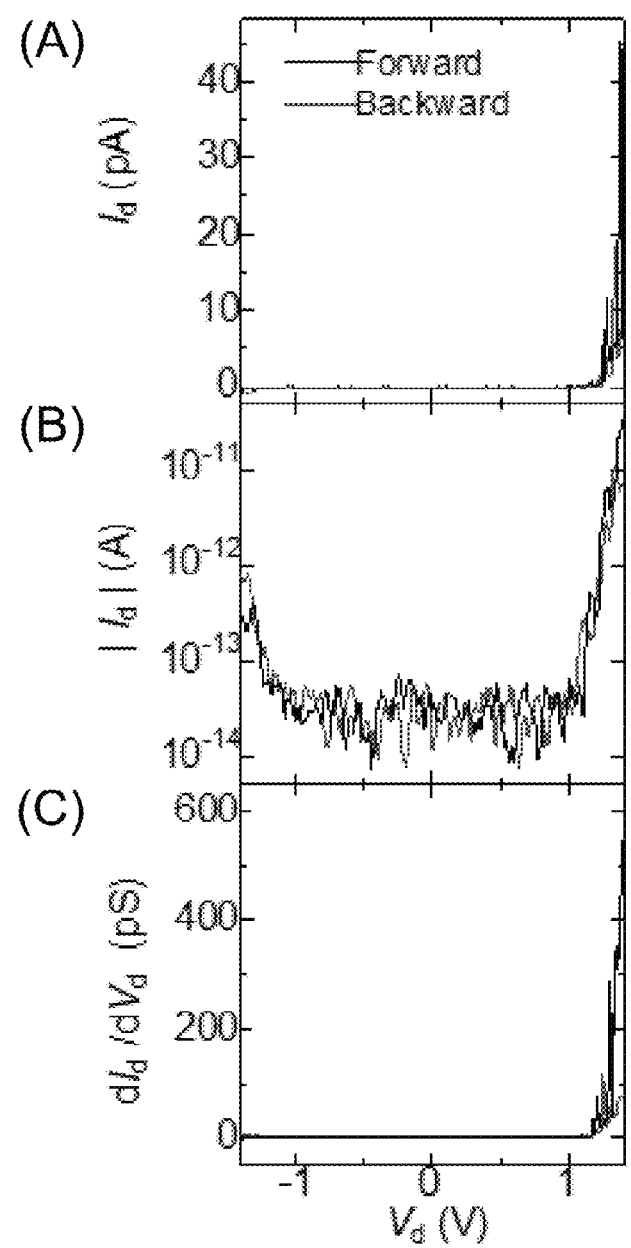
FIG. 24 shows the results of measuring the drain current (Id) versus drain voltage (Vd) characteristics of the monomolecular transistor fabricated in the example at room temperature.

FIG. 24 shows a result of measurement of drain current (Id) versus drain voltage (Vd) characteristics of the monomolecular transistor manufactured in this example at room temperature. In FIG. 24, graph (A) shows the Id characteristic, graph (B) shows the Log |Id| characteristic, and graph (C) shows the logarithmic differential conductance characteristic of the graph (B). As apparent from each graph of FIG. 24, the drain current (Id) versus drain voltage (Vd) characteristics of the monomolecular transistor, the behavior of coherent tunneling even at room temperature has been observed. On the other hand, the range of the bias voltage in which the drain current (Id) hardly flows has been halved with respect to the measurement of 9 K (see FIG. 20), the energy level of the molecular orbital is energy-broadened in the energy direction by thermal fluctuation It reflects the molecular resonant tunneling phenomena.

Figure 25:
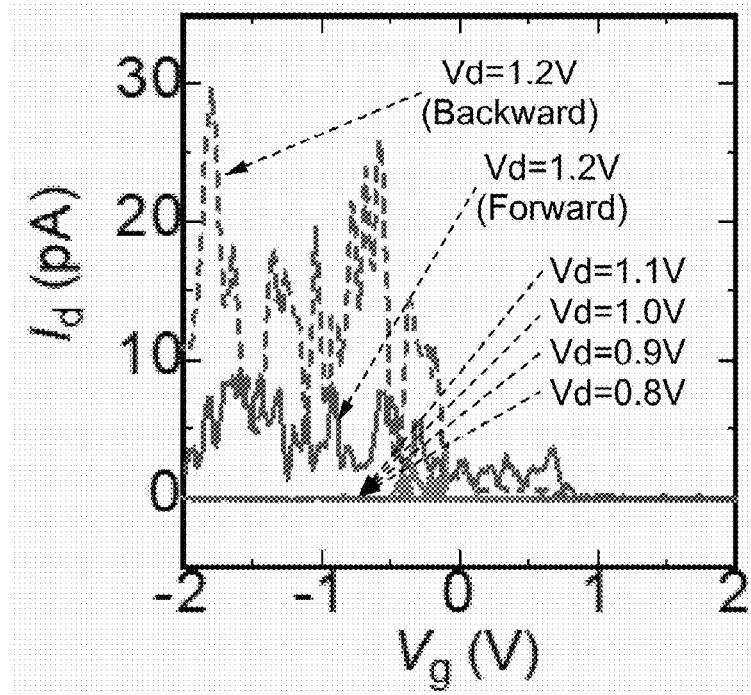
FIG. 25 shows the drain current (Id) versus gate voltage (Vg) characteristics measured at room temperature for a monomolecular transistor fabricated in the example.

FIG. 25 shows drain current (Id) versus gate voltage (Vg) characteristics measured at room temperature of the monomolecular transistor manufactured in this example. FIG. 25 shows the characteristics when a positive drain voltage is applied, and shows the results of measuring the drain voltage (Vd) in 0.1 V steps from 0.8 V to 1.2 V. Further, the characteristic of the drain voltage (Vd) is 1.2 V shows the mean value of the results measured by sweeping the gate voltage three times in the positive direction and the negative direction. As apparent from FIG. 25, even in the measurement at room temperature, the gate modulation drain current is increased by sweeping in the negative voltage direction of the gate voltage (Vg) when the drain voltage (Vd) is 1.2 V is observed, COPV6(SH)$_2$ molecules, a monomolecular transistor using the nanogap electrode is shown to operation at room temperature with molecular resonance tunneling phenomena.

According to the present example, it has been shown that even when a relatively long (as a single molecule) functional molecule such as a COPV6(SH)$_2$ molecule is used, a monomolecular transistor can be obtained in which a drain current (Id) due to molecular resonance tunneling can be caused to flow not only at 9 K but also at room temperature by combining with a nanogap electrode formed by growing gold particles on a platinum electrode by electroless gold plating, and the drain current (Id) can be gate-modulated.

Example 3

This example 3 shows a monomolecular transistor using a Si-bridged quinoid-type condensation oligosilol derivative (Si-2×2) as a rigid π-conjugated molecule containing silicon as a functional molecule and a single molecule containing —O—(CH$_2$)$_n$SH at both terminals.

7-1 Manufacturing Method of Monomolecular Transistor

To prepare a nanogap electrode in the same manner as in the example 1. The produced nanogap electrodes were immersed in hexanethiol (C$_6$SH) solutions to produce self-assembled monolayers (SAMs). This SAM increases the introduction rate of functional molecules with linker groups and anchor groups when the soaking time is shortened, and the surface coverage is lowered.

Furthermore, this SAM is useful for fabricating a single-molecule transistor with a cross-linked structure, in which a functional molecule having a linker group and an anchor group at both ends is realized by chemical bonding through an anchor group at both the source electrode surface and drain electrode surface. When the linker group has a flexible structure such as an alkane or an oxoalkane, the two anchor groups at both ends of the functional molecule may chemisorb on the same electrode surface. When the surface of the nanogap electrode is covered with SAM, the linker group chemisorbed to one electrode via the anchor group and the functional molecule rise in the normal direction of the electrode surface by the SAM molecule existing in the periphery, and the anchor group at the other end becomes difficult to chemisorb to the same electrode surface due to steric hindrance by the SAM molecule existing in the periphery.

On the other hand, the gap portion of the nanogap electrode is opposed. When one of the anchor groups is chemically bonded by substituting an anchor group or a linker group with a molecule forming the SAM at the gap, or when a functional molecule in which an anchor group is chemically bonded from a gap of the SAM is orientation in the normal direction of the electrode surfaces, it is highly likely that the other anchor group is chemically adsorbed by the opposing electrode, and the anchor groups at both ends are chemically adsorbed by the opposing electrode to form a bridging structure. In this way, in order to form a cross-linked structure between gaps of functional molecules, it is preferable that SAM is formed on the surface of the nanogap electrode.

7-2 Structures of Si-2×2 Pentathiol Molecules.

The architecture of Si-2×2 pentathiol molecule is shown in equation (7).

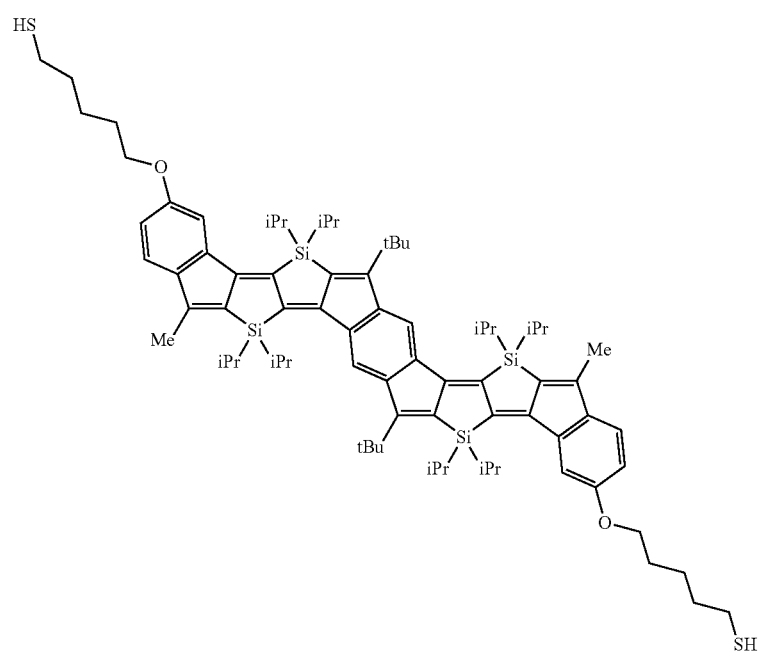

(7)

Figure 26:
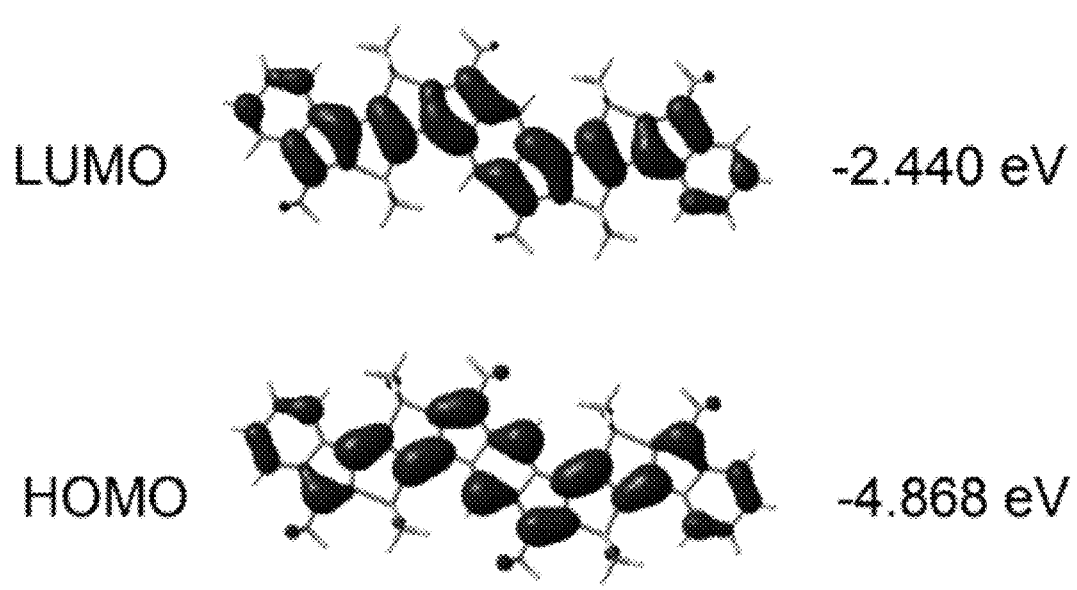
FIG. 26 shows the molecular orbitals of Si-2×2 pentathiol molecules calculated using the density functional method.

FIG. 26 shows the results of calculating the molecular orbitals of Si-2×2 pentathiol molecules using the density functional method. As a result of the calculations, LUMO level and HOMO level of Si-2×2 pentathiol molecules were −2.44 eV and −4.87 eV, respectively. As a result, the difference between the energies of HOMO level and LUMO level was found to be 2.43 eV.

7-3 Drain Current Versus Drain Voltage Characteristics (Id-Vd Characteristics)

Figure 27:
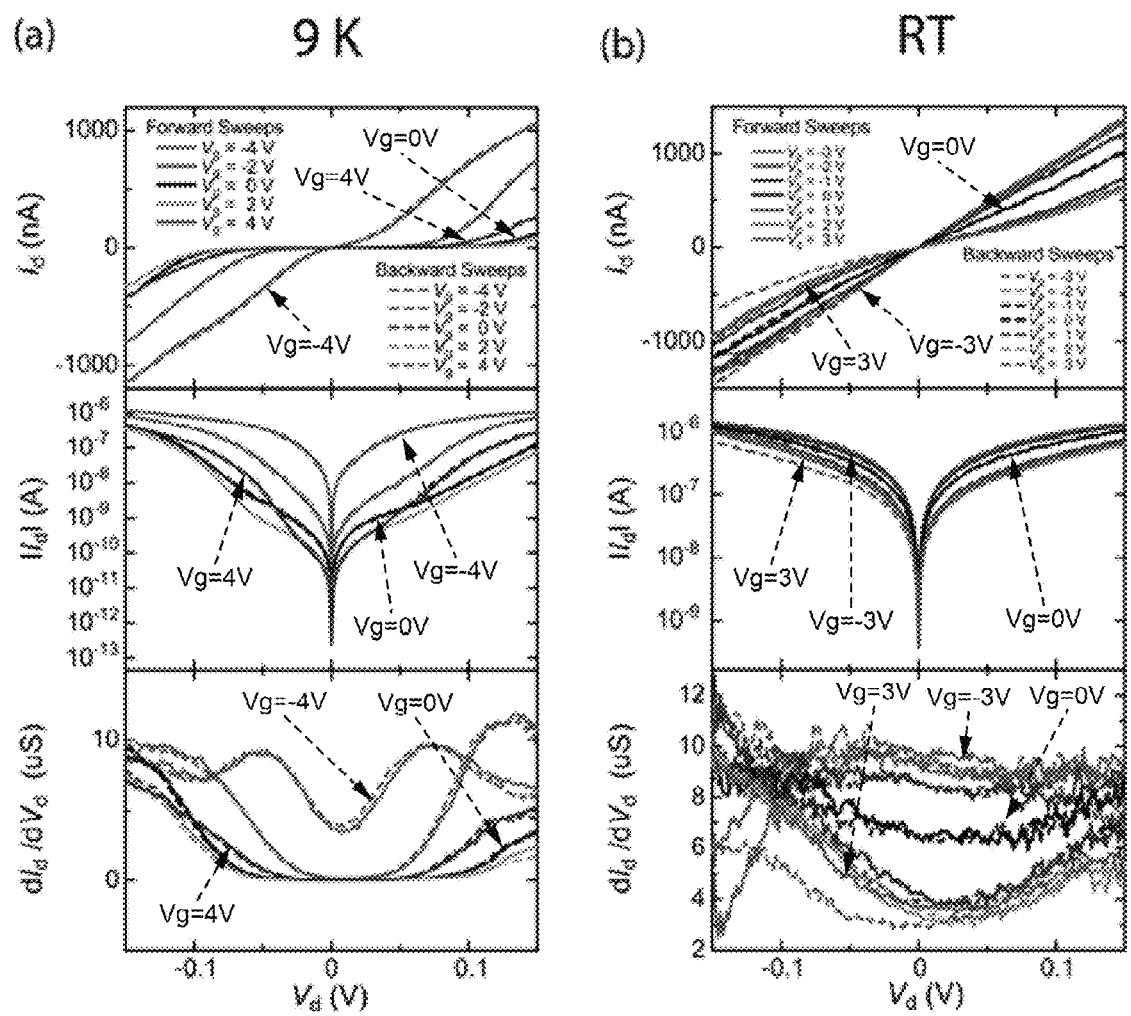
FIG. 27 shows the drain current (Id) versus drain voltage (Vd) characteristics of the monomolecular transistor fabricated in the example.

FIG. 27 shows drain current (Id) versus drain voltage (Vd) characteristics of the monomolecular transistor manufactured in this example. In FIG. 27, graph (a) shows the measurement result at 9 K, and graph (b) shows the measurement result at room temperature. In the graphs (a) and (b), the upper part shows the Id characteristic, the middle part shows the Log |Id| characteristic, and the lower part shows the logarithmic differential conductance characteristic.

In FIG. 27, as apparent from the graph (a) and (b), around the drain voltage Vd=0, the drain current (Id) shows a symmetrical characteristic. It is considered that this characteristic suggests a symmetrical structure in the structure between the source and the drain. In addition, since the drain current (Id) is almost the same at room temperature as 9 K, it is presumed that the current is flowing through the tunneling process. This is because the current varies by orders of magnitude between 9 K and room temperature when the current flows through thermally active conduction mechanisms such as Schottky.

It is observed that the drain current (Id) versus drain voltage (Vd) characteristics depend on the gate voltage (Vg). In addition, almost no hysteresis occurs between the forward sweep of the drain voltage (Vd) and the reverse sweep, and a stable operation is observed. Graphs (a) and (b) of FIG. 27 show the drain current (Id) at 9 K at a gate voltage (Vg) of −4 V, and the drain current (Id) at room temperature at a gate voltage (Vg) of −3 V. From the measurement results, it is observed that the drain current values of both of them are almost identical, and it is understood that the current is caused by a tunneling mechanism independent of thermal fluctuation kT. It is also suggested that the drain current (Id) versus drain voltage (Vd) characteristics at the gate voltage (Vg) above 0V and the drain current (Id) versus gate voltage (Vg) characteristics at the gate voltage (Vg) above 1 V at room temperature are almost coincident, respectively, independent of the gate voltage.

In the monomolecular transistor manufactured in this example, a drain current (Id) of about 1 µA flows at a drain voltage (Vd) of ±0.15 V while the gate voltage (Vg) is negative (Vg=−4 V at 9 K and Vg=−3 V at room temperature). This conductance is about 7 µS. The conductance value in the on state is two orders of magnitude larger than the characteristics of the single-molecule transistor manufactured in the example 1 and the example 2. From the results of the graphs (a) and (b) shown in FIG. 27, it can be inferred that the single molecule transistor fabricated in this embodiment operates by a molecular resonant tunneling phenomenon based on a (SAu)₂ structure in which functional molecules are bridged at both the source and drain electrodes.

7-4 Drain Current Versus Gate Voltage Characteristics (Id-Vg Characteristics)

Figure 28:
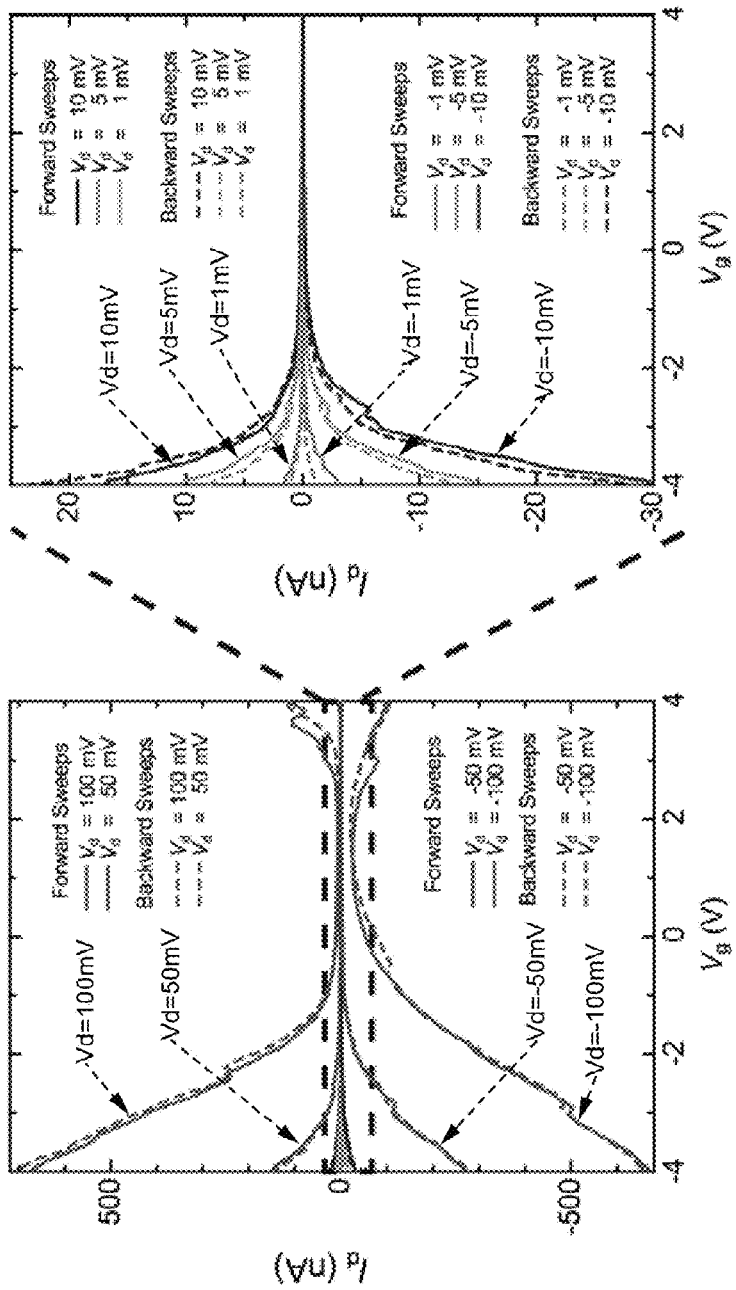
FIG. 28 shows the drain voltage (Vd) dependency of the drain current (Id) versus gate voltage (Vg) property in 9 K of the monomolecular transistor fabricated in the embodiment.

FIG. 28 shows the drain voltage (Vd) dependency of the drain current (Id) versus gate voltage (Vg) property at 9 K. FIG. 28 shows the case where the drain voltage (Vd) is ±50 mV and 100 mV, and further shows the case where the drain voltage (Vd) is ±1 mV, ±5 mV and ±10 mV in the enlarged view. From FIG. 28, when sweeping the gate voltage (Vg) in the negative direction, the characteristic that the absolute value of the drain current (Id) is increased is observed. Although the polarity dependency of the drain voltage (Vd) is slightly observed, the drain current (Id) of 1 nA flows when the gate voltage (Vg) is 4 V even when the drain voltage (Vd) is 1 mV. When the gate voltage (Vg) is −4 V which on state, and the drain voltage (Vd) is 100 mV, 50 mV, 10 mV, 5 mV, 1 mV, −1 mV, −5 mV, −10 mV, −50 mV, and −100 mV, the conductance are 7 µS, 3 µS, 2 µS, 2 µS, 2 µS, 2 µS, 3 µS, 3 µS, 6 µS, and 6 µS, respectively. As a result, the conductance is in the range of 2 to 7 µS. This suggests that the monomolecular transistor manufactured in this example has a cross-linked configuration at both ends, and is a molecular resonance tunneling transistor operation.

Figure 29:
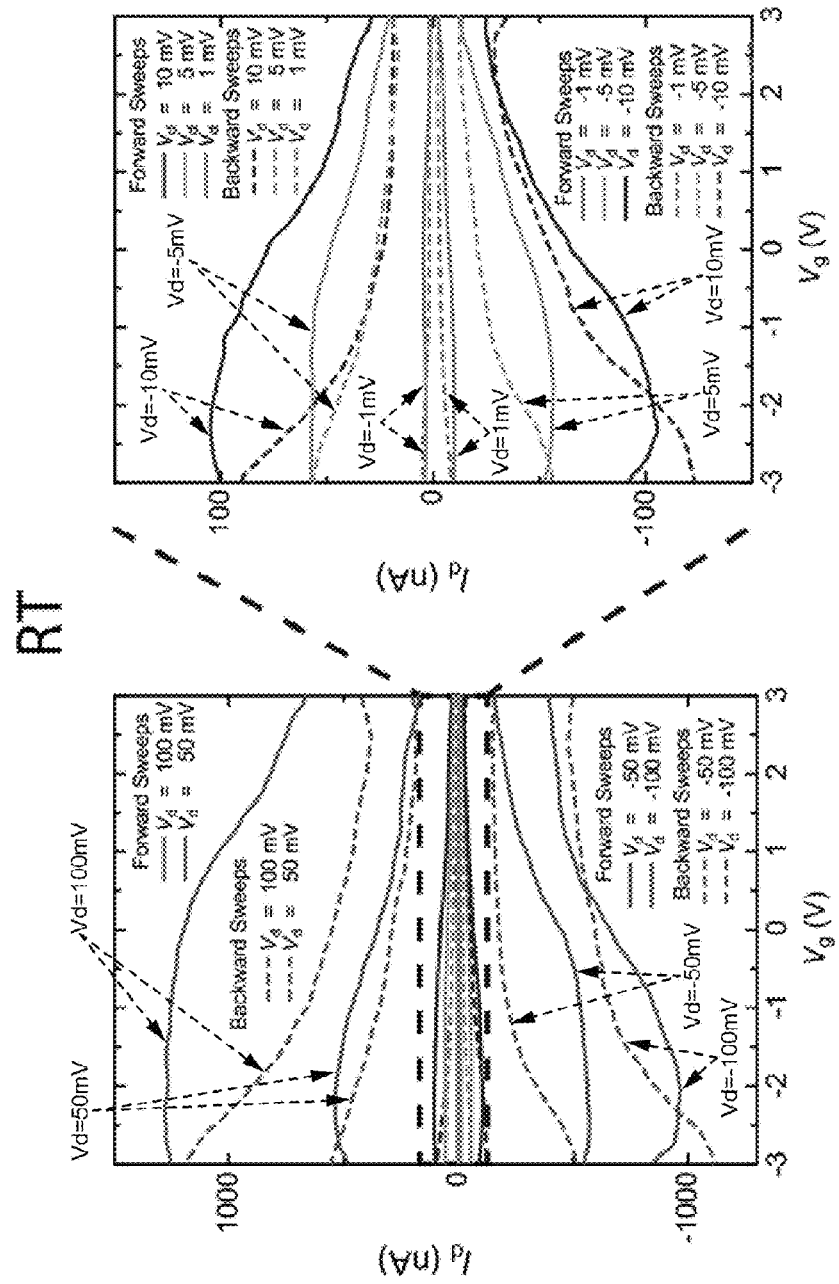
FIG. 29 shows the drain voltage (Vd) dependence of the drain current (Id) versus gate voltage (Vg) characteristics at room temperature of the monomolecular transistor fabricated in the example.

FIG. 29 shows the drain voltage (Vd) dependence of the drain current (Id) versus gate voltage (Vg) characteristics at room temperature. As with 9 K, sweeping the gate-voltage (Vg) in the negative direction increases the absolute value of the drain-current (Id). Hysteresis is slightly observed for the sweep of the gate voltage (Vg), although the drain voltage (Vd) dependence of the drain current (Id) is also slightly observed, the variation is within a small range. From this, it can be inferred that the single-molecule transistor manufactured in this example is in the molecular resonance tunneling transistor operation even at room temperature.

7-5. Mechanism Considerations

Figure 30:
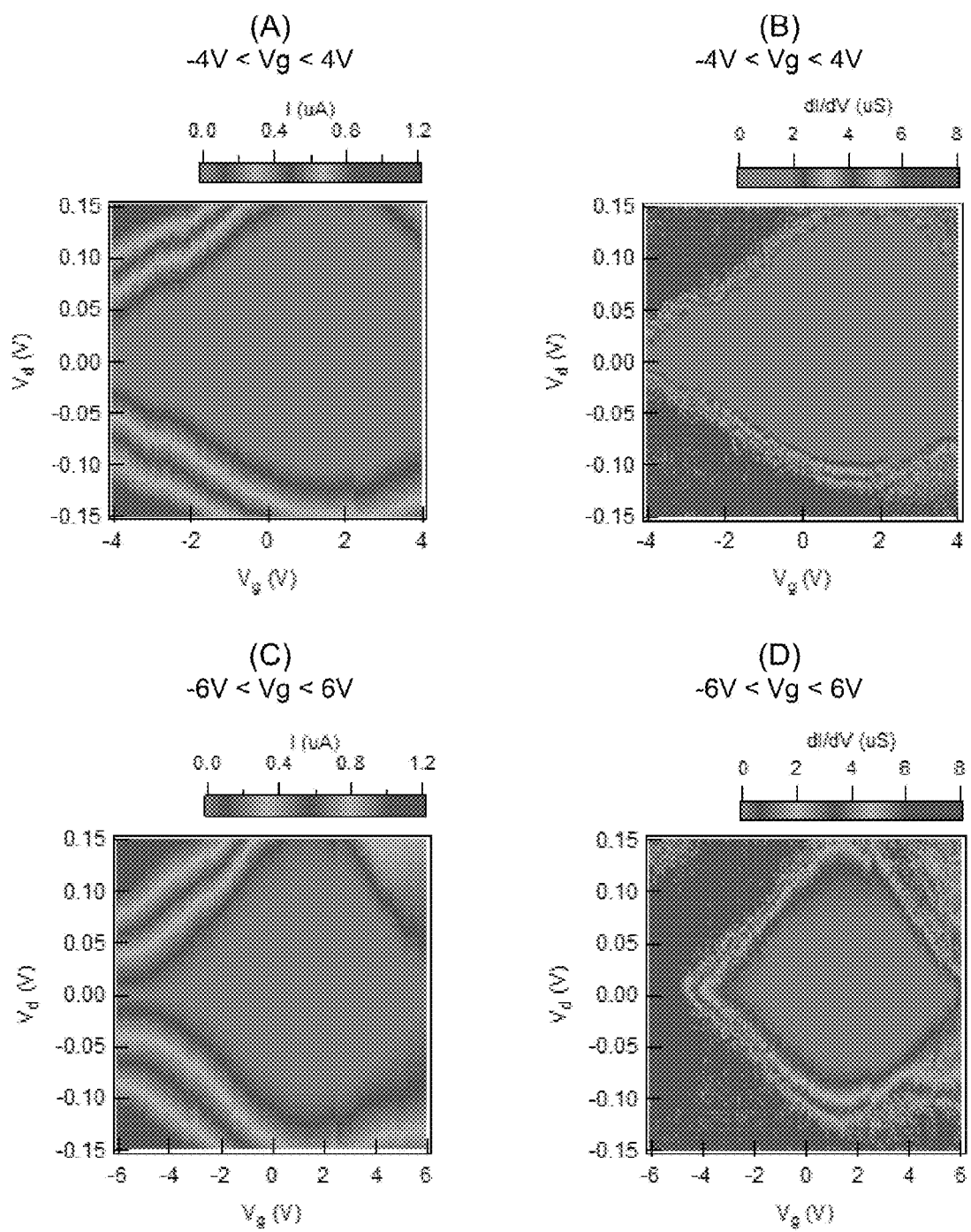
FIG. 30 shows two-dimensional plots for drain current (Id) and differential conductance drain voltage (Vd) and gate voltage (Vg) in 9 K of a monomolecular transistor fabricated in the example.

FIG. 30 shows two-dimensional plots for drain current (Id) and differential conductance drain voltage (Vd) and gate voltage (Vg) at 9 K. In FIG. 30, graphs (A) and (C) show two-dimensional plots of drain current (Id), and graphs (B) and (D) show two-dimensional plots of differential conductance. Further, the graph (A) and (B) the range of the gate voltage (Vg) (horizontal axis) shows the range of +4 V from −4 V, the graph (C) and (D) the range of the gate voltage (Vg) (horizontal axis) shows the range of +6 V from −6 V.

From each graph shown in FIG. 30, characteristic of a single-electron transistor, it is possible to observe a Coulomb diamond including a boundary line at which a current consisting of two pairs of parallel lines begins to flow. Here, what differs from the properties of ordinary single-electron transistors is region whose gate-voltage (Vg) is less than or equal to −3 V. In conventional single-electron transistors, the diamond structure is observed repeatedly in the Vg direction (coulomb oscillation). In contrast, in the present example, after one diamond, a sweep of the gate voltage in a further negative direction (Vg), or a state in which the current flows when applying a drain voltage (Vd) beyond the Coulomb blockade boundary. This implies that the gate voltage (Vg) is negative and the functional molecule is positively charged, i.e., Si-2×2 molecule becomes cations, and SOMO (Singly Occupied Molecular Orbital) level overlaps the Fermi level of drain electrode and the molecular resonant tunneling current flows by gate modulation.

Since the drain current (Id) vs. drain voltage (Vd) characteristic is symmetrical at region of the gate voltage (Vg) below 0 V, R1 and R2 when operation as a single-electron transistor is substantially the same value. When R1=R2, the functional molecule functioning as the Coulomb island of the single-electron transistor can be charged both positively and negatively regardless of the polarity of the drain voltage. The monomolecular transistor fabricated in this example, the gate voltage (Vg) is negative region below about −4 V and the gate voltage (Vg) is below 0 V drain voltage (Vd) across the boundary of the Coulomb diamond above −4 V (Vd) region is both positive and negative polarity, functional molecules are considered to be positively charged, when positively charged, it is considered that switching to the molecular resonance tunneling operation.

Figure 31:
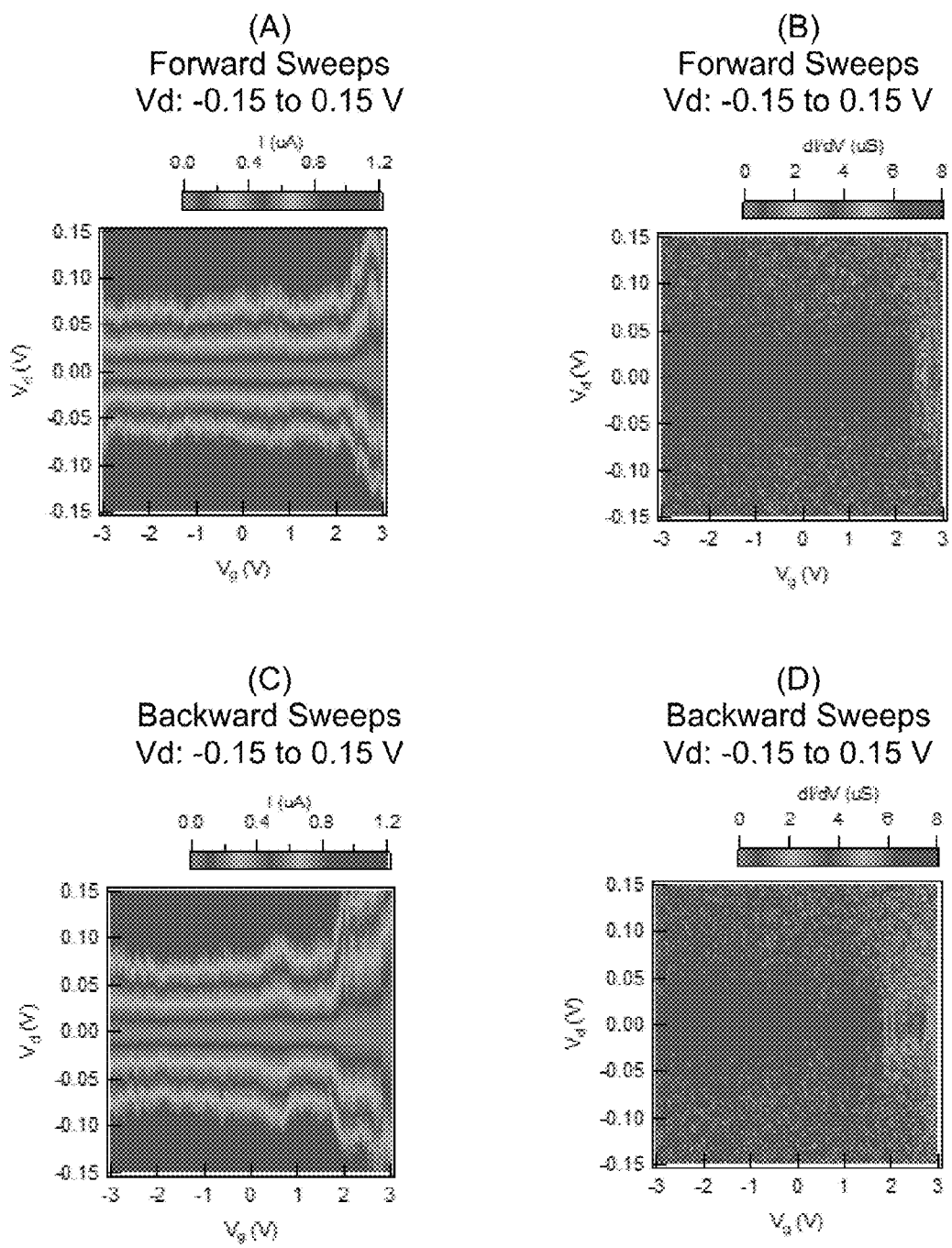
FIG. 31 shows a two-dimensional plot for drain current (Id) and differential conductance drain voltage (Vd) and gate voltage (Vg) at room temperature of a monomolecular transistor fabricated in the example.

FIG. 31 shows a two-dimensional plot for drain current (Id) and differential conductance drain voltage (Vd) and gate voltage (Vg) at room temperature. In FIG. 31, graphs (A) and (C) show two-dimensional plots of drain current (Id), and graphs (B) and (D) show two-dimensional plots of differential conductance. The graphs (A) and (B) show the characteristic in which the drain voltage (Vd) is swept from −0.15 V to +0.15 V, and the graphs (C) and (D) show the characteristic in which the drain voltage (Vd) is swept from +0.15 V to −0.15 V.

Figure 32:
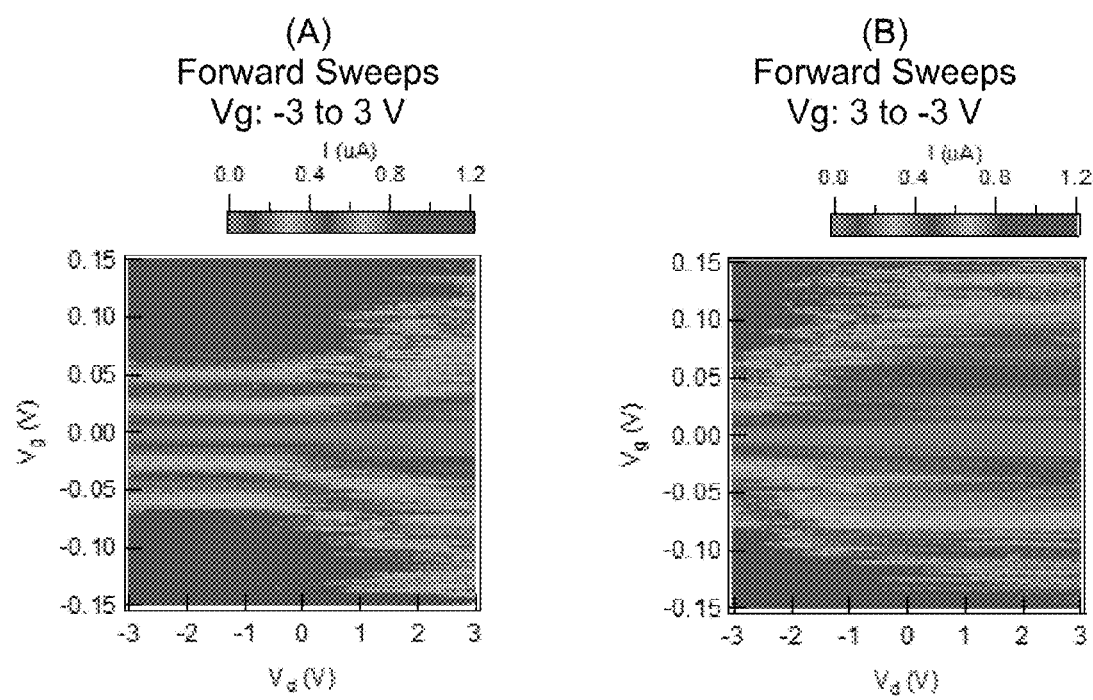
FIG. 32 shows a two-dimensional plot for drain current (Id) and differential conductance drain voltage (Vd) and gate voltage (Vg) at room temperature of a monomolecular transistor fabricated in the example.

FIG. 32 shows a two-dimensional plot for drain current (Id) and differential conductance drain voltage (Vd) and gate voltage (Vg) at room temperature. In FIG. 32, graph (A) shows a two-dimensional plot of the drain current (Id), graph (B) shows a two-dimensional plot of differential conductance, also the graph (A) shows the characteristics that the gate voltage (Vg) is swept from −3 V to +3 V, the graph (B) shows the characteristics that the gate voltage (Vg) is swept from +3 V to −3 V.

When the characteristics measured at room temperature shown in FIG. 31 and FIG. 32 are compared with the characteristics measured at 9 K shown in FIG. 30, the drain current (Id) increases in the entire region of the gate voltage (Vg) in the characteristics measured at room temperature. This result is reasonable in view of the fact that the coulomb blockade characteristic becomes ambiguous by energy (kT=26 meV) at room temperature in the monomolecular transistor characteristic. Rather, it is important that the drain current (Id) increases in the region where the gate voltage (Vg) is negative, indicating transistor characteristics. The characteristic that the drain current (Id) increases in the region where the gate voltage (Vg) is negative, it is consistent with the result of 9K. At room temperature, the Coulomb blockade effect is weakened, causing functional molecules to move back and forth between neutral, cationic, and anionic states, obscuring their transistor behavior. However, when the gate voltage (Vg) is negative, the functional molecule becomes a cation forcibly, and the drain current (Id) to drain voltage (Vd) characteristic at room temperature at that time agrees with the characteristic at 9K. From these results, the monomolecular transistor in this example exhibits transistor characteristics in which characteristics as a single electron transistor and characteristics as a molecular resonant tunneling transistor are mixed, and at room temperature, drain current (Id) flows due to the molecular resonant tunneling phenomenon, and operates as a molecular resonant tunneling transistor. In this example, although the (—O—$(CH_2)_5$—) used as a linker group for the Si-bridged quinoid-type condensed oligosilol derivative (Si-2×2) as a rigid π-conjugated molecule containing silicon is a relatively long molecule, it has been clarified that the molecular resonance tunneling phenomenon can be sufficiently developed even by using this molecule. In addition, it has been clarified that the conductance in the on state of the single molecule resonance tunnel transistor is as large as 2 μS or more.

The example 1, example 2, and example 3 each have a functional molecular skeleton composed of a different π conjugate group, and the molecular resonance tunneling transistor operation is observed by the resonance tunneling mechanisms in the case of chemically bonding only on one side and in the case of cross-linking. All of the π-conjugated groups of the example 1, the example 2, and the example 3 have a rigid structure of the π-conjugated group. When the π conjugate group is rigid, the state density function of the molecular orbital prevents the molecular orbital from being twisted or deformed by thermal fluctuation. Thus, although the DOS width of the state density function contributing to the resonant tunneling mechanism is slightly expanded at room temperature, as described in above, there is much less fluctuation in the DOS width as compared with a π conjugate group which is not rigid and is composed of a skeleton which can rotate freely. Therefore, it is preferable that the π-conjugated skeleton of the functional molecule is rigid to obtain room temperature operation The π-conjugated skeleton may have any structure as long as it is a rigid π-conjugated skeleton, and the relationship between the state density function of molecular orbitals and the Fermi level of the electrode is such that a resonant tunneling mechanism can be obtained.

The linker groups help tune the coupling of the density-of-states function of functional molecules with the orbitals of electrode metals. The longer the linker group, the weaker the coupling. If the coupling is strong, even if the gate capacitance is sufficient to modulate the level of the molecular orbital, the pinning effect by the electrode makes it difficult to modulate the level of the molecular orbital in the energy direction. Conversely, if the linker group is long, the linker group becomes an insulating property, and therefore becomes a tunnel barrier, and therefore, resonance tunneling mechanism between the electrodes becomes difficult to occur. Therefore, the length of the linker group needs to be optimally adjusted for the adjustment of the coupling strength and the expression of the resonant tunneling mechanism. The length of —O—$(CH_2)_5$— is the length of the resonating tunneling mechanism that can be obtained, because operation of the resonating tunneling transistors in the cross-linked structure is obtained in a Si-2×2 structure. As the length, a methylene chain (equivalent to a methylene chain $CH_2)_n$, n is preferably 1 or more and 10 or less, and more preferably n is 3 or more and 7 or less).

In the cross-linked resonant tunneling transistor, the linker group preferably extends linearly. Since the linker group can freely rotate the skeleton, structural fluctuations are caused, and thus, it is particularly disadvantageous for the transistor operation at room temperature or higher. In forming the crosslinked structure, the anchor at one end is chemically bonded to the electrode first, and the anchor at the other end is chemically bonded to the other electrode facing each other. When chemically bonded to the other electrode, when the linker group is stretched on a straight line, the movement of the linker group which is originally freely rotated is inhibited, and it is possible to alleviate the occurrence of structural fluctuations due to thermal fluctuations.

The relative position of the energy level of the molecular orbital of the functional molecule with respect to the Fermi level of the electrode is important for determining the drain voltage and the gate voltage for obtaining the resonant tunneling mechanism. When the linker group is replaced with an alkane group (—$(CH_2)_n$—) by an oxomethylene group (—O—$(CH_2)_n$—) or an azaalkyl group (—NH—$(CH_2)_n$—), these two groups can move (doping) the energy level of the functional Molecular Orbital closer to the vacuum level because they are electron-donating.

Also, the combination of SAM and anchor groups and linker groups is valid for stable operation of resonance tunneling transistors, since the linker groups can be supported and rigidified by the surrounding SAM molecules when SAM is formed first.

In the monomolecular resonance tunneling transistor of the cross-linked structure of the example 3, conductance of 1 μS or more is obtained. The stable operation of such large current values through molecules is attributed to the use of resonant tunneling mechanisms. In the resonance tunneling mechanism, when a current flows, the functional molecule is passed through by a quantum mechanical resonance tunneling process using the level of the molecular orbital of the functional molecule, and therefore, the functional molecule is not disturbed. That is, in the resonance tunneling process, the molecules are not heated. Therefore, even when a current of the order of 1 pA is flowed, the functional molecule does not break. Also, in transistors, conductance is a very important parameter. It is a new finding that conductance of 1 µS or more can be obtained by using a resonant tunneling mechanism. In addition, the monomolecular resonant tunneling transistor which modulates the resonant tunneling mechanism by the gate voltage is a transistor which can obtain the conductance over 1 µS and can expect the durability.

What is claimed is:

1. A monomolecular transistor comprising:
a first electrode including a first electrode layer and a first metal particle arranged at a tip portion of the first electrode layer;
a second electrode including a second electrode layer and a second metal particle arranged at a tip portion of the second electrode layer;
a third electrode insulated from the first electrode and the second electrode;
a π-conjugated molecule having a π-conjugated skeleton;
the first electrode and the second electrode are arranged so that the first metal particle and the second metal particle face each other and are separated from each other;
the first electrode layer has a uniform width of 20 nm or less including the tip portion of the first electrode layer and a film thickness of 20 nm or less;
the second electrode layer has a uniform width of 20 nm or less including the tip portion of the second electrode layer and a film thickness of 20 nm or less;
a width of the first metal particle and the second metal particle from a first end to a second end is less than 20 nm;
the third electrode is arranged adjacent to a gap in which the first metal particle and the second metal particle face each other, and is spaced from the first metal particle and the second metal particle; and
the π-conjugated molecule is arranged in a gap between the first metal particle and the second metal particle.

2. The monomolecular transistor according to claim 1, wherein
the first electrode layer and the second electrode layer have an upper surface and a side surface and comprise a first metal,
the first metal particle and the second metal particle comprise a second metal different from the first metal,
the first metal particle and the second metal particle are in contact with the upper surface and the side surface, respectively.

3. The monomolecular transistor according to claim 2, wherein the first metal particle and the second metal particle are hemispherical.

4. The monomolecular transistor according to claim 3, wherein a radius of curvature of the first metal particle and the second metal particle are 12 nm or less.

5. The monomolecular transistor according to claim 4, wherein the first metal particle is arranged to project from the tip portion of the first electrode layer, and the second metal particle is arranged to project from the tip portion of the second electrode layer.

6. The monomolecular transistor according to claim 2, wherein the first electrode layer and the first metal particle, and the second electrode layer and the second metal particle form a metal bond at an interface in contact with each other.

7. The monomolecular transistor according to claim 2, wherein the first metal is platinum and the second metal is gold.

8. The monomolecular transistor according to claim 1, wherein a gap length between the first metal particle and the second metal particle is 5 nm or less.

9. The monomolecular transistor according to claim 1, wherein a length of the π-conjugated molecule is less than 5 nm.

10. The monomolecular transistor according to claim 1, wherein the π-conjugated molecule is composed of a rigid skeleton.

11. The monomolecular transistor according to claim 10, wherein the π-conjugated molecule has a π-conjugated skeleton having a carbon (C) bridge.

12. The monomolecular transistor according to claim 1, wherein the π-conjugated molecule includes an element chemically bonded to the first metal particle or the second metal particle at a first end or a second end of the π-conjugated skeleton.

13. The monomolecular transistor according to claim 12, wherein the π-conjugated molecule includes an alkylene group, a perfluoroalkylene group ($-(CF_2)_n-$), an oxyalkylene group ($-O-(CH_2)_n-$), or an azaalkylene group ($-NH-(CH_2)_n-$) between the π-conjugated skeleton and the element.

14. The monomolecular transistor according to claim 1, wherein the π-conjugated molecule is a carbon-crosslinked oligophenylene vinylene n(COPVn(SH)$_2$) having a terminal substituted with a thiol group.

15. The monomolecular transistor according to claim 14, wherein number of units of the carbon-crosslinked oligophenylene vinylene is 1 to 10.

16. The monomolecular transistor according to claim 1, wherein one of the first metal particle and the second metal particle and one end of the π-conjugated molecule are chemically adsorbed.

17. The monomolecular transistor according to claim 14, wherein the first metal particle and the second metal particle comprise gold (Au), and sulfur (S) and gold (Au) are chemically adsorbed at a first end of the π-conjugated molecule.

18. The monomolecular transistor according to claim 17, wherein at a second end of the π-conjugated molecule, sulfur (S) and hydrogen (H) are bonded.

19. The monomolecular transistor according to claim 14, wherein the first metal particle and the second metal particle comprise gold (Au), and sulfur (S) and gold (Au) are chemically adsorbed at both ends of the π-conjugated molecule.

20. The monomolecular transistor according to claim 1, wherein a resonant tunneling current flows between the first electrode and the second electrode.

* * * * *